United States Patent
Yada et al.

(10) Patent No.: US 9,876,027 B2
(45) Date of Patent: Jan. 23, 2018

(54) THREE DIMENSIONAL NAND DEVICE WITH CHANNEL LOCATED ON THREE SIDES OF LOWER SELECT GATE AND METHOD OF MAKING THEREOF

(71) Applicant: SANDISK TECHNOLOGIES LLC, Plano, TX (US)

(72) Inventors: Shinsuke Yada, Yokkaichi (JP); Hiroyuki Ogawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/194,510

(22) Filed: Jun. 27, 2016

(65) Prior Publication Data
US 2016/0307917 A1    Oct. 20, 2016

Related U.S. Application Data

(63) Continuation of application No. 14/133,979, filed on Dec. 19, 2013, now Pat. No. 9,449,983.

(51) Int. Cl.
| | |
|---|---|
| *H01L 29/788* | (2006.01) |
| *H01L 27/11582* | (2017.01) |
| *H01L 21/02* | (2006.01) |
| *H01L 21/28* | (2006.01) |
| *H01L 21/321* | (2006.01) |

(Continued)

(52) U.S. Cl.
CPC .... *H01L 27/11582* (2013.01); *H01L 21/0217* (2013.01); *H01L 21/02164* (2013.01); *H01L 21/02238* (2013.01); *H01L 21/02532* (2013.01); *H01L 21/28273* (2013.01); *H01L 21/28282* (2013.01); *H01L 21/3212* (2013.01); *H01L 27/1157* (2013.01); *H01L 27/11524* (2013.01); *H01L 27/11556* (2013.01); *H01L 29/16* (2013.01); *H01L 29/42328* (2013.01); *H01L 29/42344* (2013.01); *H01L 29/495* (2013.01);

(Continued)

(58) Field of Classification Search
None
See application file for complete search history.

(56) References Cited

U.S. PATENT DOCUMENTS

| | | |
|---|---|---|
| 7,005,350 B2 | 2/2006 | Walker et al. |
| 7,023,739 B2 | 4/2006 | Chen et al. |

(Continued)

FOREIGN PATENT DOCUMENTS

WO    WO2002/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Sitaramarao S Yechuri
(74) *Attorney, Agent, or Firm* — The Marbury Law Group PLLC

(57) ABSTRACT

A select gate transistor for a NAND device includes a select gate electrode having a first side, a second side, and top and a bottom, a semiconductor channel located adjacent to the first side, the second side and the bottom of the select gate electrode, and a gate insulating layer located between the channel and the first side, the second side and the bottom of the select gate electrode.

22 Claims, 63 Drawing Sheets

(51) Int. Cl.

| | | |
|---|---|---|
| *H01L 27/11524* | (2017.01) | |
| *H01L 27/11556* | (2017.01) | |
| *H01L 27/1157* | (2017.01) | |
| *H01L 29/16* | (2006.01) | |
| *H01L 29/423* | (2006.01) | |
| *H01L 29/49* | (2006.01) | |
| *H01L 29/51* | (2006.01) | |

(52) U.S. Cl.
CPC ........ *H01L 29/4966* (2013.01); *H01L 29/517* (2013.01); *H01L 29/518* (2013.01)

(56) References Cited

U.S. PATENT DOCUMENTS

| | | | |
|---|---|---|---|
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0230454 A1* | 9/2009 | Pekny | H01L 27/11568 257/319 |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2011/0303970 A1 | 12/2011 | Kim et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0032245 A1* | 2/2012 | Hwang | H01L 27/11551 257/314 |
| 2012/0208347 A1* | 8/2012 | Hwang | H01L 27/1157 438/430 |
| 2013/0089974 A1* | 4/2013 | Lee | H01L 27/11556 438/510 |
| 2013/0264631 A1 | 10/2013 | Alsmeier et al. | |
| 2015/0179660 A1 | 6/2015 | Yada et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report, PCT/US2013/035567, dated Sep. 30, 2013, 6pgs.

Invitation to Pay Additional Fees and Partial International Search Report, PCT/US2014/068076, dated Feb. 25, 2015, 8 pgs.

International Search Report and Written Opinion, International Application No. PCT/US2014/068076, dated Apr. 14, 2015.

Transmittal of International Preliminary Report on Patentability and Written Opinion of the Searching Authority for International Application No. PCT/US2014/068076, dated Jun. 30, 2016, 14 pages.

\* cited by examiner

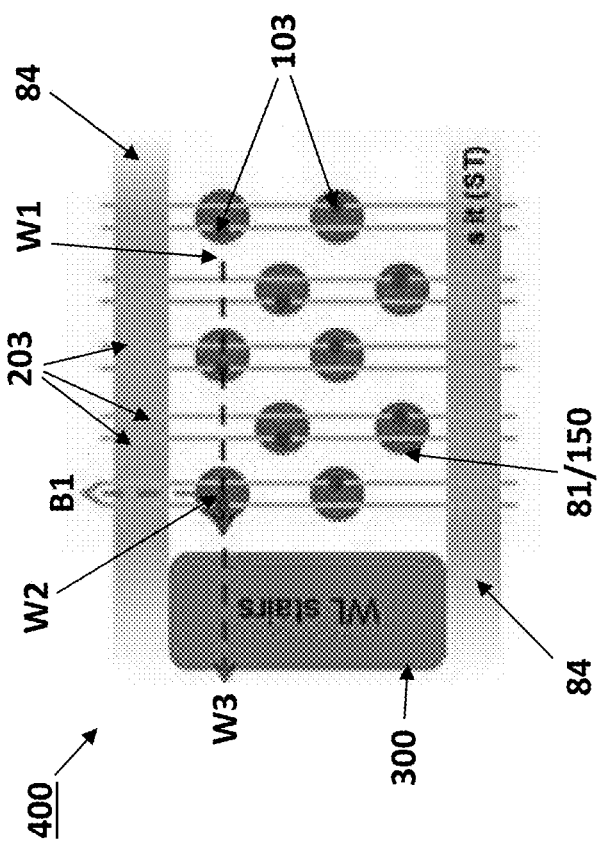

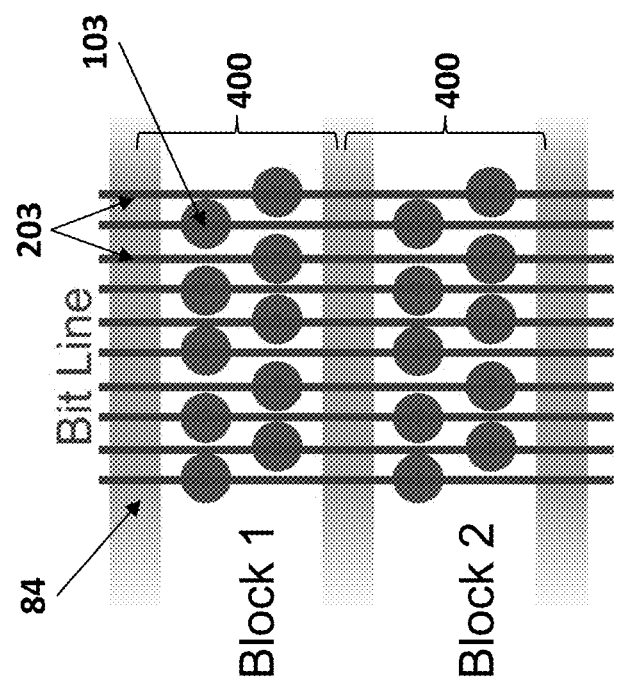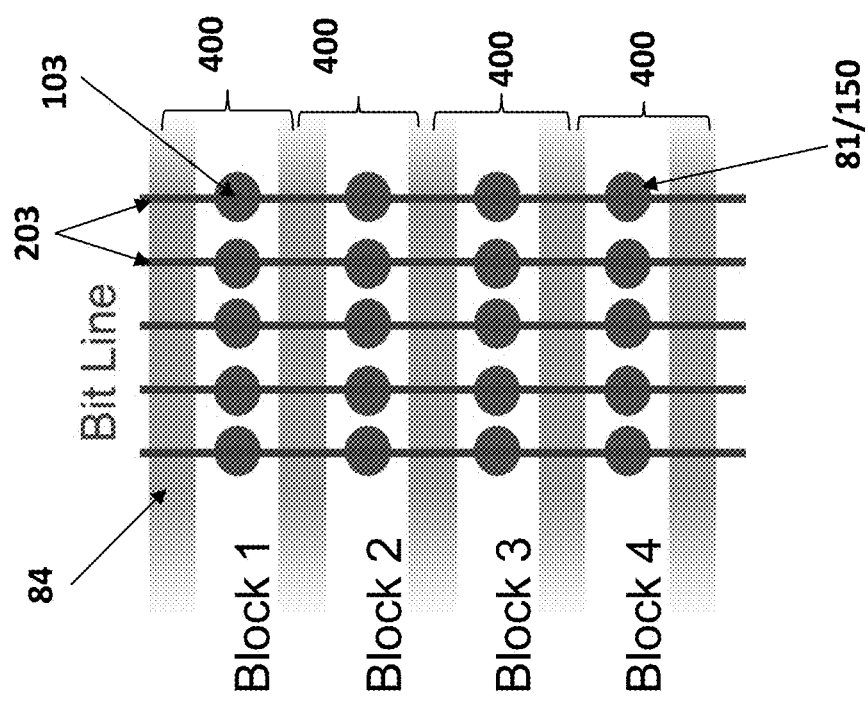

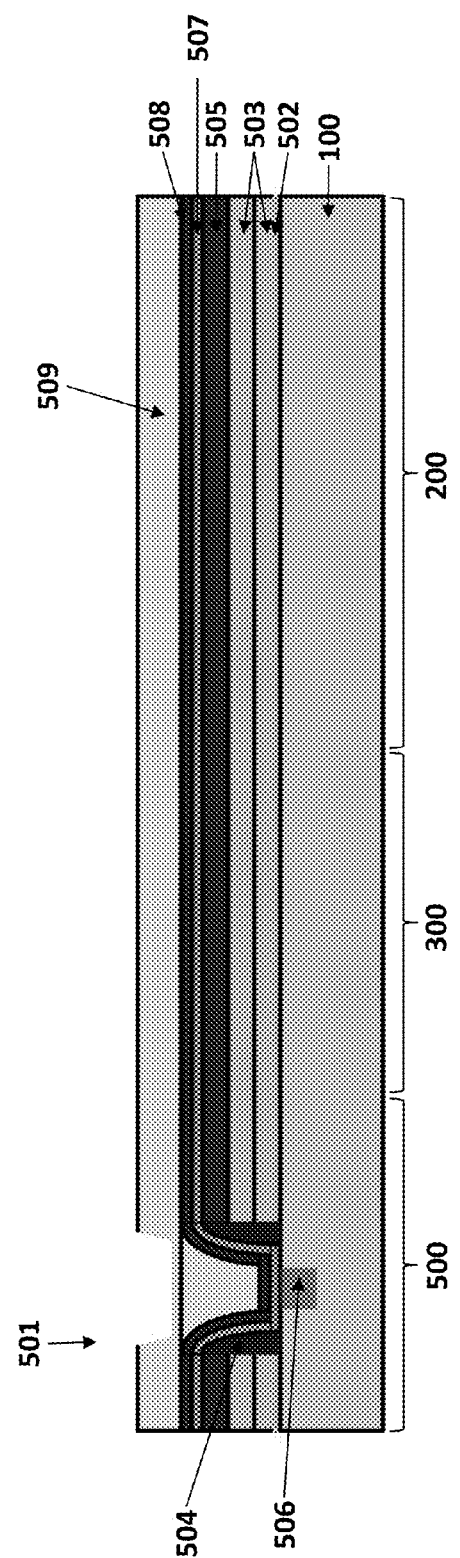

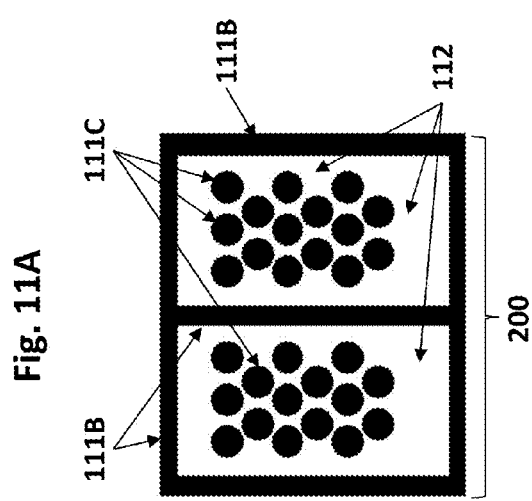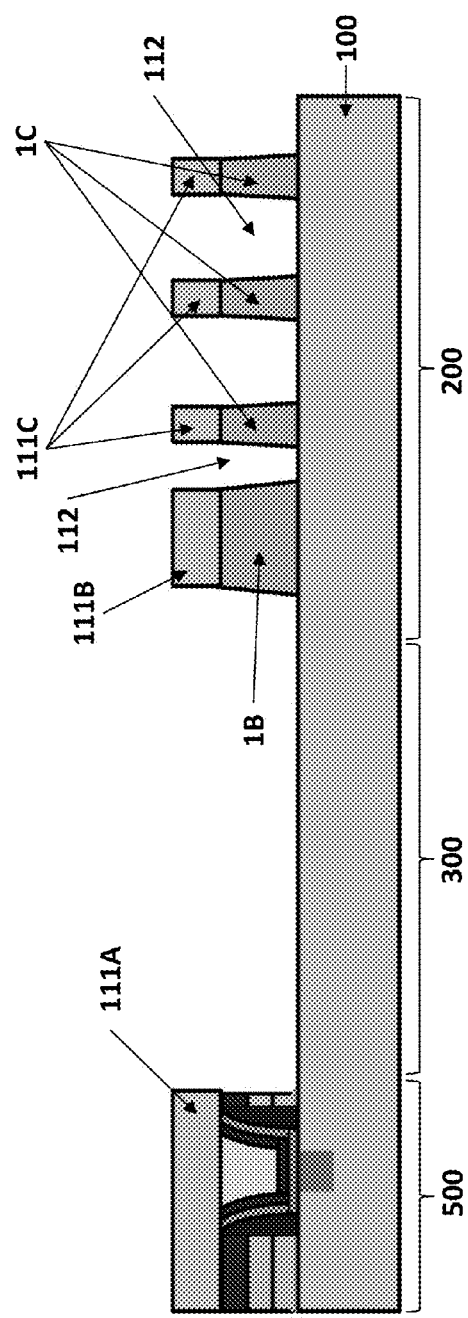

US 9,876,027 B2

THREE DIMENSIONAL NAND DEVICE WITH CHANNEL LOCATED ON THREE SIDES OF LOWER SELECT GATE AND METHOD OF MAKING THEREOF

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a select gate transistor for a NAND device which includes a select gate electrode having a first side, a second side, and top and a bottom, a semiconductor channel located adjacent to the first side, the second side and the bottom of the select gate electrode, and a gate insulating layer located between the channel and the first side, the second side and the bottom of the select gate electrode.

Another embodiment relates to a memory block comprising a substrate, an array comprising at least one row of monolithic three dimensional NAND strings, a first dielectric filled trench located on a first side of the array, and a second dielectric filled trench located on a second side of the array opposite to the first side of the array. A first source line located is in the first dielectric filled trench, a second source line is located in the second dielectric filled trench, and a plurality of drain lines are located over the array. Each NAND string comprises a semiconductor channel, a tunnel dielectric located adjacent to an end portion of the semiconductor channel, a charge storage region located adjacent to the tunnel dielectric, a blocking dielectric located adjacent to the charge storage region, a source side select gate electrode, a gate insulating layer, a drain side select gate electrode, and a plurality of control gate electrodes extending substantially parallel to a major surface of the substrate. The plurality of control gate electrodes comprise at least a first control gate electrode located in a first device level and a second control gate electrode located in a second device level located over the major surface of the substrate and below the first device level. The source side select gate electrode, the first control gate electrode and the second control gate electrode are continuous in the array. A first portion of the gate insulating layer contacts a first side of the source side select gate electrode, a second portion of the gate insulating layer contacts a second side of the source side select gate electrode, and a third portion of the gate insulating layer contacts bottom of the source side select gate electrode. A first portion of the semiconductor channel contacts the first portion of the gate insulating layer, a second portion of the semiconductor channel contacts the second portion of the gate insulating layer, and a third portion of the semiconductor channel contacts the third portion of the gate insulating layer.

Another embodiment relates to a method of making a semiconductor device, comprising forming a first semiconductor protrusion and a second semiconductor protrusion that extend perpendicular to a major surface of a substrate such that the first semiconductor protrusion is connected to the second semiconductor protrusion by a third semiconductor region which extends parallel to the major surface of the substrate, forming a gate insulating layer over at least a first side of the first semiconductor protrusion, over at least a second side of the second semiconductor protrusion and over a top of the third semiconductor region, and forming a gate electrode over the gate insulating layer between the first side of the first semiconductor protrusion, the second side of the second semiconductor protrusion and the top of the third semiconductor region.

BRIEF DESCRIPTION OF THE DRAWINGS

FIG. 1A is a side cross sectional view of the device along line Y-Y' in FIG. 1B, while FIG. 1B is a side cross sectional view of the device along line X-X' in FIG. 1A.

FIG. 1C is a side cross sectional view of the device along line Y-Y' in FIG. 1D, while FIG. 1D is a side cross sectional view of the device along line X-X' in FIG. 1C.

FIG. 2B is a side cross sectional view of the device along line B-B' in FIG. 2A, while FIG. 2C is a side cross sectional view of the device along line W-W' in FIG. 2A.

FIG. 3A is a schematic top view of a memory block of FIG. 2A showing the location of the bit lines.

FIGS. 4, 5A and 5B are schematic top views of a memory device containing plural memory blocks according to embodiments of the invention.

FIGS. 6-10, 11B, 12-44, 45B, 46-54, 55A-55F, and 56-60 are side cross sectional views illustrating steps in an embodiment method of making the device illustrated in FIGS. 2, 3, 4 and 5 along line W1-W2 in the word line direction, then line W2-B1 in the bit line direction and then line W2-W3 in the word line direction. FIGS. 11A and 45A are top views of the steps shown in FIGS. 11B and 45B, respectively.

DETAILED DESCRIPTION

The embodiments of the invention provide a select gate transistor for a NAND device where the semiconductor channel is located adjacent to at least three sides of the select gate electrode, such as the bottom side and at least two sidewalls of the select gate electrode. The embodiments of the invention provide a longer semiconductor channel with a more reliable, higher quality gate insulating layer and a low resistance metal select gate in the select gate transistor. In one embodiment, at least one vertical portion of the channel comprises epitaxial, single crystalline silicon. This leads to a higher performance bottom select gate transistor in a vertical NAND device compared to lower performance prior art bottom select gate transistor containing a shorter polysilicon channel, a lower quality gate insulating layer, and high resistance polysilicon select gate electrode.

In various embodiments, the select gate transistor is part of a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 1C:
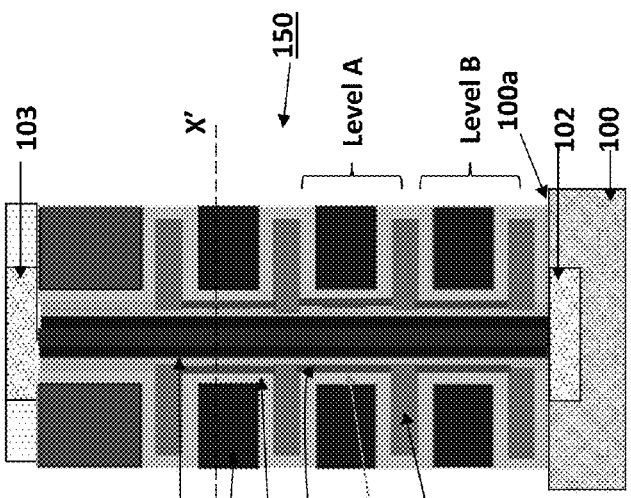
FIGS. 1C-1D are respectively side cross sectional and top cross sectional views of a NAND string of another embodiment.
Figure 3B:
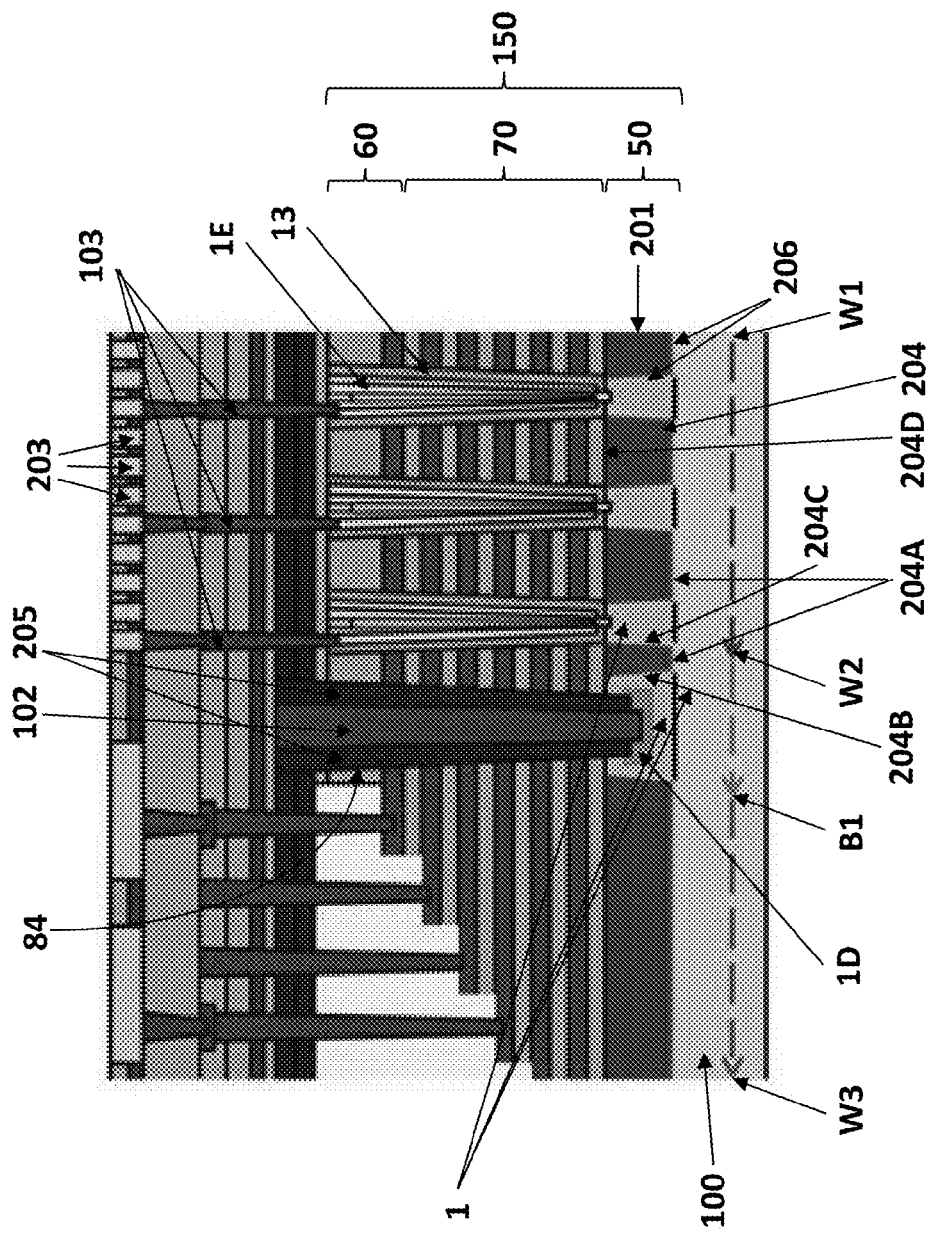
FIG. 3B is a composite bit line and word line side cross sectional view of the memory block of FIG. 3A along line W1-W2 in the word line direction, then line W2-B1 in the bit line direction and then line W2-W3 in the word line direction.

In some embodiments, the monolithic three dimensional NAND string 150 comprises lower 50 and upper 60 select gate device levels located below and above the memory device levels 70, as shown in FIG. 3B. The memory device levels 70 include a semiconductor channel 1 having at least one end portion extending substantially perpendicular to a major surface 100a of a substrate 100, as shown in FIGS. 1A and 1C. For example, the semiconductor channel 1 may have a pillar shape in the memory device levels 70 and the entire pillar-shaped semiconductor channel in the memory device levels 70 extends substantially perpendicularly to the major surface of the substrate 100, as shown in FIGS. 1A and 1C. In these embodiments, the source/drain electrodes of the device can include a first electrode 102 and a second electrode 103 formed over the semiconductor channel 1, as shown in FIGS. 1A and 1C. The NAND string's select or access transistors are not shown in FIGS. 1A-1D for clarity and will be described in more detail below with reference to additional figures.

Figure 1D:
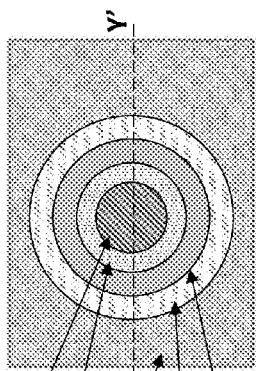
Figure 1A:
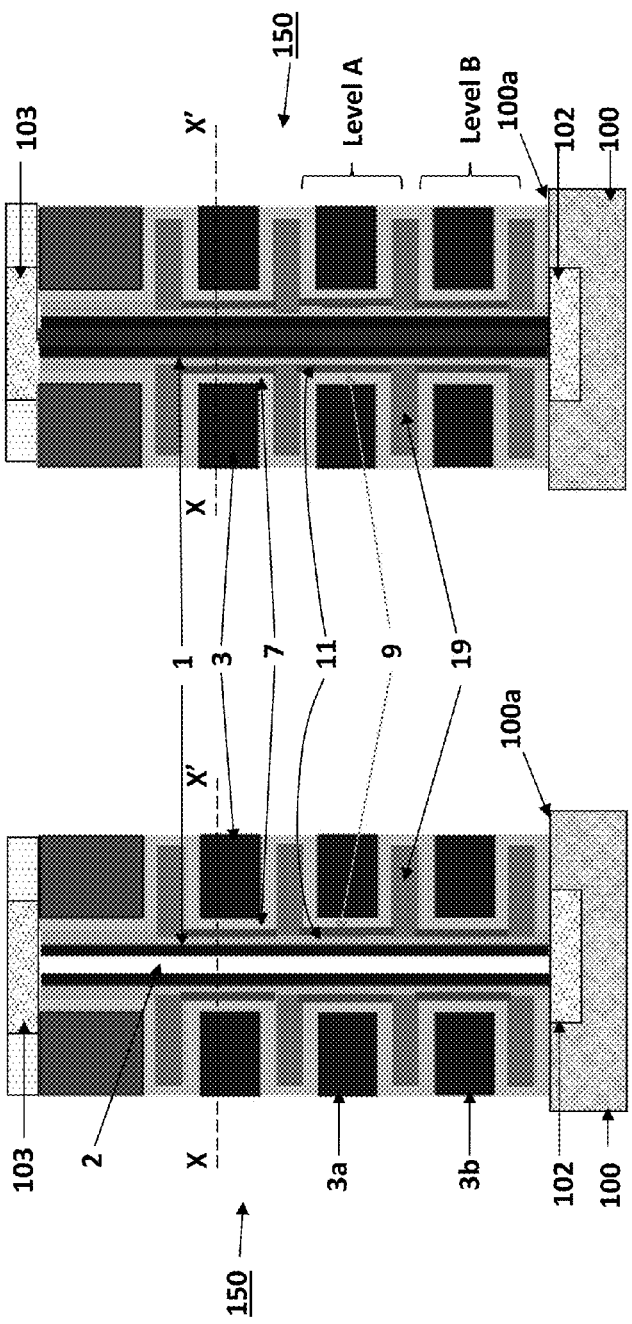
FIGS. 1A-1B are respectively side cross sectional and top cross sectional views of a NAND string of one embodiment.
Figure 1B:
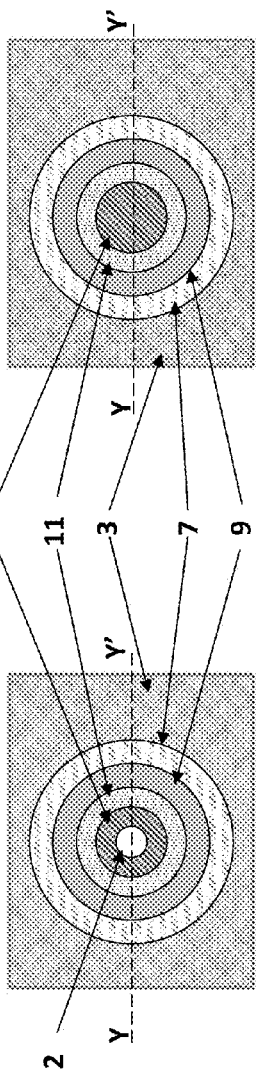

In some embodiments, the semiconductor channel 1 may be a filled feature, as shown in FIGS. 1C and 1D. In some other embodiments, the semiconductor channel 1 may be hollow, for example a hollow cylinder filled with an insulating fill material 2, as shown in FIGS. 1A and 1B. In these embodiments, an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The channels 1 are electrically connected to source and drain electrodes 102, 103 which are schematically shown in FIGS. 1A and 1C. More detailed description of the electrodes will be provided with respect to FIGS. 2-4 below.

The monolithic three dimensional NAND strings 150 in memory device levels 70 further comprise a plurality of control gate electrodes 3, as shown in FIGS. 1A-1D. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride, alloys thereof or combination of these materials.

A blocking dielectric 7 is located adjacent to the control gate(s) 3 and may surround the control gate 3. The blocking dielectric 7 may comprise one or more layer having plurality of blocking dielectric segments located in contact with a respective one of the plurality of control gate electrodes 3. Alternatively, the blocking dielectric may comprises one or more continuous layers which extend the entire length of the memory cell portion of the NAND string.

The monolithic three dimensional NAND string also comprise a charge storage region 9. The charge storage region 9 may comprise one or more continuous layers which extend the entire length of the memory cell portion of the NAND string. Alternatively, the charge storage region may comprise a plurality of discrete charge storage regions or segments 9 located between the blocking dielectric 7 and the channel 1.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the charge storage region 9 may comprise an insulating charge trapping material, such as a silicon nitride layer or silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIGS. 2A to 3E illustrate a memory block 400 containing an array of a plurality of vertical NAND strings 150 according to one embodiment of the invention. Each string includes the lower 50 (e.g., source) and upper 60 (e.g., drain) select gate device levels located below and above the memory device levels 70, respectively, as shown in FIG. 3B. These figures also show the location of memory region 200 containing the bottom select gate transistor 201 in each of the plurality of NAND strings 150 and the stepped word line contact region 300.

Figure 2C:
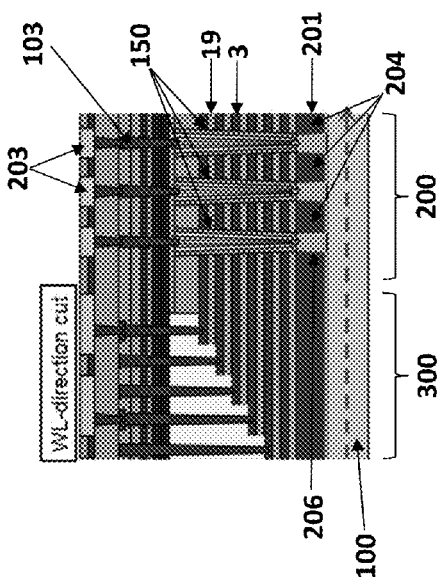
FIGS. 2B and 2C are side cross sectional views of the memory block of FIG. 2A along the bit line and word line directions, respectively.
Figure 2A:
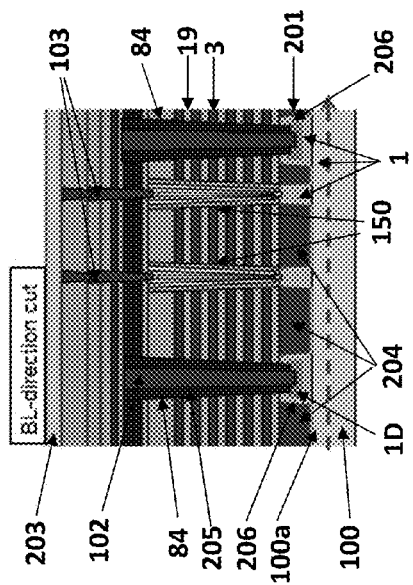
FIG. 2A is a top cross sectional view of a memory block of an embodiment of the invention.
Figure 2B:
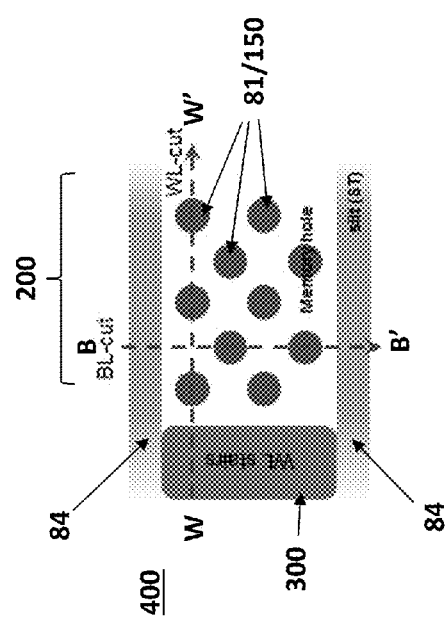

FIG. 2A is a top cross sectional view of a memory block of an embodiment of the invention. FIGS. 2B and 2C are side cross sectional views of the memory block of FIG. 2A along the bit line and word line directions, respectively. FIG. 2B is a side cross sectional view of the device along line B-B' in FIG. 2A, while FIG. 2C is a side cross sectional view of the device along line W-W' in FIG. 2A.

Figure 3C:
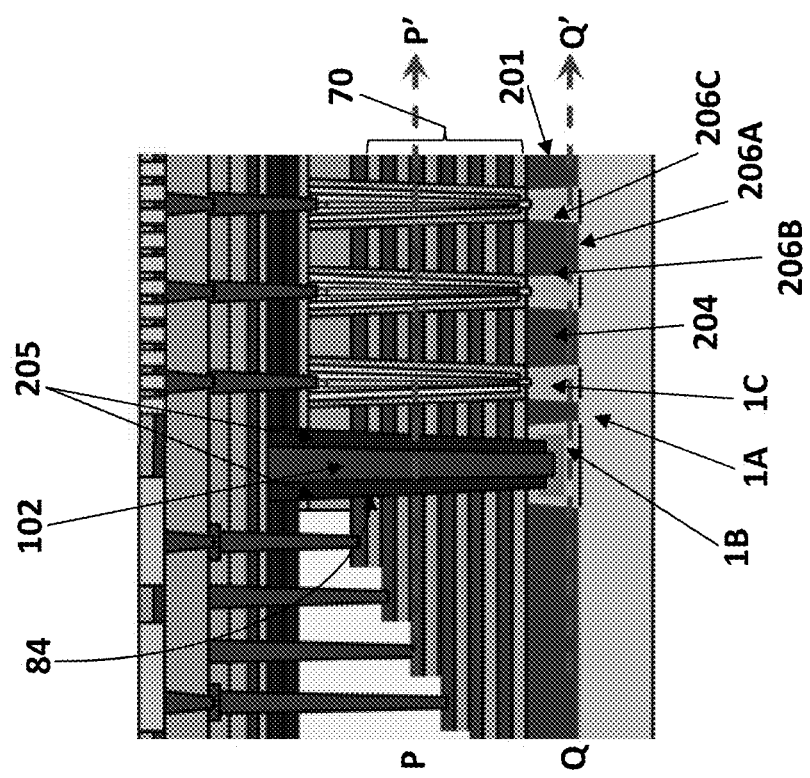
FIG. 3C is another composite bit line and word line side cross sectional view of the memory block of FIG. 3A along line W1-W2 in the word line direction, then line W2-B1 in the bit line direction and then line W2-W3 in the word line direction.
Figure 3E:
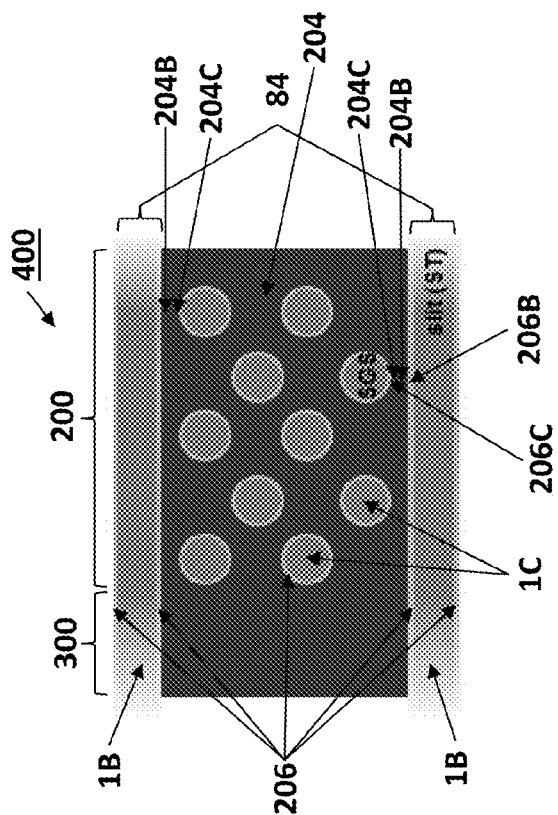
FIGS. 3D and 3E are respective top cross sectional views along lines P-P' and Q-Q' shown in FIG. 3C for the respective memory and lower select gate device levels.
Figure 3D:
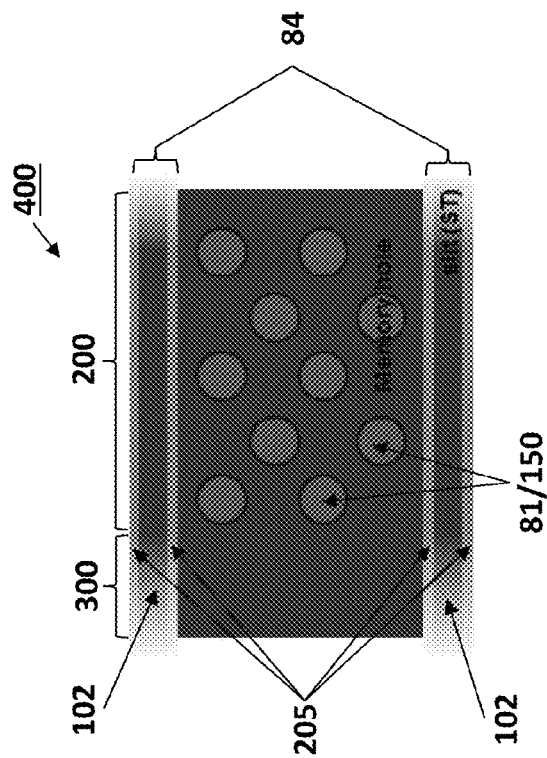

FIG. 3A is a schematic top view of a memory block of FIG. 2A showing the location of the bit lines 203. FIG. 3B is a composite bit line and word line side cross sectional view of the memory block of FIG. 3A along line W1-W2 in the word line direction, then line W2-B1 in the bit line direction and then line W2-W3 in the word line direction. FIG. 3C is another composite bit line and word line side cross sectional view of the memory block of FIG. 3A. FIGS. 3D and 3E are respective top cross sectional views along lines P-P' and Q-Q' shown in FIG. 3C for the respective memory and lower select gate regions.

As shown in FIGS. 2B, 2C, 3B, 3C and 3E, the semiconductor channel 1 is located adjacent to at least three sides of the select gate electrode 204, such as the bottom side 204A and at least two sidewalls 204B, 204C of the select gate electrode 204. For example, as shown in FIG. 3E, the first side 204B of the select gate electrode is located opposite to the second side 204C of the select gate electrode 204.

The select gate electrode 204 in each select gate transistor 201 has a bottom side 204A, a first lateral side 204B, a second lateral side 204C, and top side 204D. The semiconductor channel 1 is located adjacent to bottom side 204A, the first side 204B and the second side 204C of the select gate electrode. A gate insulating layer 206, such as a silicon oxide layer or another suitable insulating layer, is located between the channel 1 and the bottom 204A, the first side 204B, and the second side 204B of the select gate electrode 204.

The select gate electrode 204 may comprise any suitable electrically conductive material, such as heavily doped semiconductor (e.g., heavily doped polysilicon), a metal or metal alloy. The select gate electrode 204 preferably comprises a metal or metal alloy, such as tungsten, copper, aluminum, tantalum, titanium, cobalt, titanium nitride, alloys thereof or combination of these materials. In one non-limiting embodiment, the select gate electrode 204 comprises a titanium nitride liner peripheral portion contacting the gate insulating layer 206, and a tungsten central portion contacting the titanium nitride liner peripheral portion.

As shown in FIGS. 3C and 3E, a first portion 206B of the gate insulating layer 206 contacts the first side 204B of the select gate electrode 204, a second portion 206C of the gate insulating layer contacts the second side 204C of the select gate electrode, and a third portion 206A of the gate insulating layer contacts the bottom side 204A of the select gate electrode. A first portion 1B of the semiconductor channel 1 contacts the first portion 206B of the gate insulating layer 206, a second portion 1C of the semiconductor channel contacts the second portion 206C of the gate insulating layer, and a third portion 1A of the semiconductor channel contacts the third (e.g., bottom) portion 206A of the gate insulating layer.

The first portion 1B of the semiconductor channel 1 comprises a first semiconductor protrusion which extends vertically (i.e., perpendicular to the major surface 100a of the substrate 100). Preferably, the first semiconductor protrusion 1B comprises an epitaxial silicon rail having straight or tapered sidewalls, as shown in FIG. 3E. Thus, the protrusion 1B sidewalls may be perpendicular to the major surface 100a of the substrate 100 or they may be inclined at an angle of 60-89 degrees with respect to the major surface 100a of the substrate 100. For a tapered rail 1B, the top surface is preferably narrower than the bottom surface. Preferably, the first semiconductor protrusion 1B comprises low doped silicon containing a heavily doped region 1D which contacts the source electrode (e.g., source line 102), a shown in FIG. 3B.

The second portion 1C of the semiconductor channel 1 comprises a second semiconductor protrusion which also extends vertically (i.e., perpendicular to the major surface 100a of the substrate 100). Preferably, as shown in FIGS. 3C and 3E, the second semiconductor protrusion 1C comprises an epitaxial silicon pillar having a cylindrical, truncated cone or inverse truncated cone shape. The cylindrical protrusion has straight sidewall, while the cone shaped protrusions have a tapered sidewall. A truncated cone has a smaller diameter on top then on the bottom. An inverse truncated cone has a smaller diameter on the bottom than on the top. Preferably, the second semiconductor protrusion 1C has a smaller width (e.g., smaller diameter or similar horizontal dimension) than the width of first semiconductor protrusion 1B (e.g., the width dimension in the bit line direction in FIG. 3E)

The third portion 1A of the semiconductor channel 1 comprises a semiconductor portion of the substrate 100, as shown in FIG. 3C, or a semiconductor layer extending parallel to the major surface 100a of the substrate 100 under the select gate electrode 201. Thus, the third portion 1A of the semiconductor channel comprises an upper portion containing the top major surface 100a of the substrate 100. The third portion 1A of the channel connects the first semiconductor protrusion 1B to the second semiconductor protrusion 1C. Preferably, at least the top major surface 100a of the substrate 100 comprises single crystal silicon. The entire substrate 100 preferably comprises a single crystal silicon substrate, such as a silicon wafer. Alternatively, the substrate may comprise a single crystal silicon layer which forms the top major surface 100a located over a silicon wafer or another supporting material.

Preferably, the select gate transistor 201 comprises a source side select gate transistor located in the lower select gate device level 50 of each NAND string 150, as shown in FIG. 3B. The upper select gate device level 60 contains the drain side select gate transistor (not shown for clarity) located over the NAND memory cell region in memory device levels 70. As discussed above, each NAND string 150 contains a NAND memory cell region in the memory device levels 70 which includes the semiconductor channel 1 portion 1E which extends perpendicular to the major surface 100a of the substrate 100. A bottom portion of the semiconductor channel portion 1E contacts the second semiconductor protrusion portion 1C of the channel.

As illustrated in FIG. 3B, each NAND string 150 contains a plurality of control gate electrodes 3 extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain line 203 electrically contacts an upper portion of the semiconductor channel 1 portion 1E via drain electrodes 103.

Furthermore, each NAND string 150 contains at least one memory film 13 which is located adjacent to the semiconductor channel 1 portion 1E in the memory device levels 70, as shown in FIG. 3B. Specifically, the memory film 13 is located between the semiconductor channel 1 and the plurality of control gate electrodes 3. The memory film 13 contains the tunnel dielectric 11, the charge storage region(s) 9 (e.g., a charge trapping layer or floating gates), and the blocking dielectric 7.

In one embodiment which will be described in more detail below, the tunnel dielectric 11 comprises a silicon oxide layer which extends perpendicular to the major surface 100a of the substrate 100, and the charge trapping layer 9 comprises a silicon nitride layer which extends perpendicular to the major surface 100a of the substrate 100 and which contacts the tunnel dielectric 11. The blocking dielectric 7 comprises a first silicon oxide layer which is patterned into regions which extend perpendicular to the major surface 100a of the substrate 100 and which contacts the charge trapping layer 9, and a second metal oxide layer 184 (shown in FIG. 55D) which has a plurality of clam shape regions, each of which surrounds a respective one of the plurality of control gate electrodes 3.

FIGS. 2A, 3A, 3D and 3E illustrate a top view of a memory block 400. The memory block includes an array of NAND strings including at least one row of monolithic three dimensional NAND strings 150 described above, a first dielectric filled trench 84 located on a first side of the array, and a second dielectric filled trench 84 located on a second side of the array opposite to the first side of the array.

The array NAND strings may include any number of rows of NAND strings 150. For example, the array shown in FIGS. 2A, 3A, 3D and 3E comprises at least a 4×4 array of NAND strings. In other words, the array shown in these figures has four rows of NAND strings, and there are at least four NAND strings in each row. The rows of NAND strings extend in the word line direction (e.g., along line W-W' in FIG. 2A). Thus, the array in the block 400 comprises first, second, third and fourth rows of NAND strings 150 extending in the word line direction. As shown in FIG. 2A, the semiconductor channels in the first and the third rows of NAND strings are preferably offset from respective semiconductor channels in the second and fourth rows of NAND strings along the word line direction. In general, the semiconductor channels in the odd numbered rows of NAND strings are offset from respective semiconductor channels in the even numbered rows of NAND strings along the word line direction.

As shown in FIGS. 2B and 3D, the first semiconductor protrusion 1B in each of the first and the second rows of NAND strings 150 comprises a doped region 1D which contacts the first source line 102 (e.g., the left side source line in FIG. 2B which corresponds to the source line positioned in the "upper" trench 84 in FIG. 3D). The first semiconductor protrusion 1B in each of the third and the fourth rows of NAND strings comprises a doped region 1D which contacts the second source line 102 (e.g., the right side source line in FIG. 2B which corresponds to the source line positioned in the "lower" trench 84 in FIG. 3D).

The second semiconductor protrusion 1C in each of the first, second, third and fourth rows of NAND strings 150 contacts the respective end portion 1E of the semiconductor channel 1 in each of the first, second, third and fourth rows of NAND strings to form a continuous vertical channel portion 1C-1E.

In other words, the semiconductor channels in each string have a "J" shape (i.e., shape of English capital letter "J"), comprised of vertically extending portions 1B and 1C-1E connected by a horizontally extending portion 1A. Each vertical portion 1B of each channel 1 is located under one of two trenches 84 in each block 400. Each vertical portion 1C-1E of each channel 1 is located between the two trenches 84 in each block. Each vertical portion 1B has a shorter height than the vertical portion 1C-1E to form the "J" shape. However, portions 1B and 1C preferably have the same height. Furthermore, each vertical portion 1C-1E of each channel 1 is electrically and physically connected by the horizontal portion 1A to the vertical portion 1B of the same channel which is located under the closer one of the two trenches 84 in each block. Thus, the length of the horizontal portion 1A of each channel is different in different rows in the block 400 if there are more than two rows in the block. For example, in a four row block shown in FIGS. 2A and 2B, the length of the horizontal portion 1A of each channel in the edge rows closer to one of the trenches (e.g., first and fourth rows) is shorter than the length of the horizontal portion 1A of each channel in the middle rows farther from one of the trench (e.g., second and third rows).

In alternative embodiments, each memory block 400 may have an array with less than 4 rows of NAND strings, such as only one row of NAND strings, as shown in FIG. 5A or two rows of NAND strings, as shown in FIG. 5B. Alternatively, the array in each block may have more than 4 rows, such as 5 to 20 rows of NAND strings, where each row contains 4 to 100 NAND strings.

As shown in FIGS. 2A, 3C and 3D, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory holes) which contain the NAND strings 150. However, the control gate electrodes 3 have electrical and physical continuity in the bit line direction between the trenches 84 and in the word line direction throughout the block 400. In other words, the memory holes 81 do not completely sever the continuous electrical and physical path in the control gate electrodes from one trench 84 to the opposite trench 84 in each block.

Likewise, as shown in FIGS. 2A, 3C and 3E, the select gate electrode 204 also extends in the word line direction W-W' which is perpendicular to the bit line direction B-B'. The select gate electrode 204 is also continuous in the array in the memory block 400. In other words, the select gate electrode 204 has a shape of a continuous strip or sheet with electrically insulated second protrusion 1C portions of the channels extending through the electrode 204. However, the select gate electrode 204 has electrical and physical continuity in the bit line direction between the gate insulating layer 206 under trenches 84 and in the word line direction throughout the block 400. In other words, the protrusions 1C do not completely sever the continuous electrical and physical path in the select gate electrode from gate insulating layer 206 under one trench 84 to the gate insulating layer 206 under the opposite trench 84 in each block 400.

Figure 4:
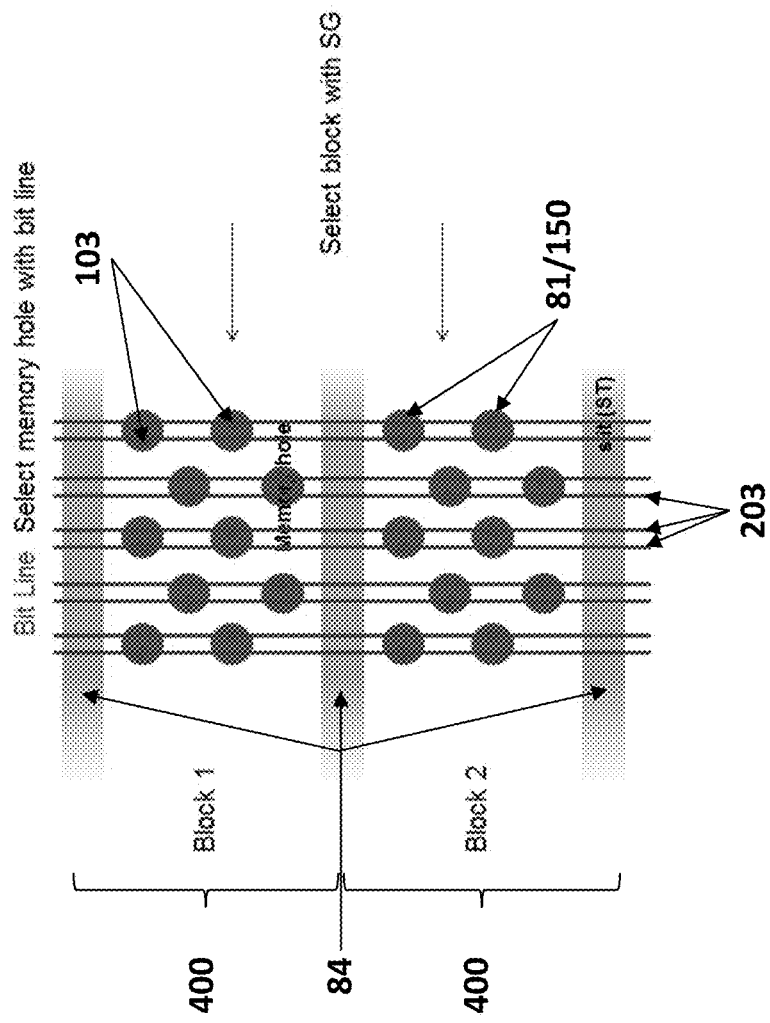

Thus, the memory block 400 contains a common control gate electrode 3 in each of the plurality of memory device levels 70 for the first, second, third and fourth rows of NAND strings shown in FIG. 3D. Likewise, the source side select gate electrode 204 comprises a common source side select gate electrode for the first second, third and fourth rows of NAND strings in the block 400. Therefore, all of the NAND strings in the array in each block 400 can be erased together in the same erase step, as shown in FIG. 4. For example, one specific memory cell can be selected by selecting (i.e., applying a current or voltage) to one select gate 204, one bit line (i.e., drain line) 203 and one word line (e.g., control gate electrode) 3. Specifically, a particular block 400 is selected with the common select gate 204 in that block, the specific memory hole 81/NAND string 150 is selected with the bit line 203, and the particular cell in one memory device level 70 in the NAND string 150 is selected with the word line 3.

A first source line 102 is located in the first dielectric filled trench 84 and a second source line 102 is located in the second dielectric filled trench 84 in each block 400, as shown in FIGS. 3C and 3D. In the memory device levels 70, the dielectric fill in the trench 84 may comprise any suitable insulating layer 205, such as silicon oxide, etc., which is located on both walls of the trench 84. In the lower select gate device level 50, the dielectric fill in the trench 84 comprises the gate insulating layer 206, which is located on both walls of the trench 84. The source line 102 is located in the middle of the trench 84 and is separated from the control gate electrodes 3 and from the select gate electrode 204 by the insulating layer 205 and the gate insulating layer 206, respectively, as shown in FIGS. 3D and 3E, respectively.

A plurality of drain lines (e.g., bit lines) 203 are located over the array of NAND strings 150 in each block 400, as shown in FIGS. 3B and 3C. The drain lines 203 extend in the bit line direction B-B' from the first dielectric filled trench 84 to the second dielectric filled trench 84 in each block 400, as shown in FIG. 3A. Furthermore, as shown in FIGS. 4, 5A and 5B, each trench 84 (except the end trenches in the device) extends in the word line direction and separates two adjacent blocks 400. The drain lines 203 extend over and perpendicular to the trenches over plural memory blocks 400. Each drain line 203 contacts the channel 1 in one NAND string 150 in one memory hole 81 in each block.

The density of the drain lines 203 depends on the number of rows of NAND strings 150 and on the spacing between adjacent NAND strings in each row, as shown in FIGS. 4, 5A and 5B. For example, as shown in FIGS. 5A and 5B, each memory hole 81 has one drain line 203 passing over it. A respective drain electrode 103 connects the channel 1 in each memory hole 81 to the respective drain line 203 passing over the memory hole 81. In this case, the drain electrode may be located over the middle of the memory hole 81.

In contrast, in the four row layout shown in FIG. 4, each memory hole 81 has two drain lines 203 passing over it. A respective drain electrode 103 connects the channel 1 in each memory hole 81 to only one of the two respective drain lines 203 passing over the memory hole 81. In this case, the drain electrode 103 may be located off center of the memory hole 81 (e.g., closer to the periphery than to the middle). The drain electrode 103 contacts the channel 1 at the periphery of the memory hole 81.

Thus, as shown in FIG. 4, one bit line 203 passing over the left side of two memory holes 81 aligned in the bit line direction in the odd or even numbered rows, may have electrical contact via the drain electrode 103 with the left side of the cylindrical channel in one memory hole in one row. Another bit line 203 passing over the right side of the same two memory holes 81, may have electrical contact via the respective drain electrode 103 with the right side of the channel in the memory hole in the in the other row.

Thus, as described above, the semiconductor channel 1 includes a solid rod shaped or a hollow cylinder shaped portion 1E in the memory device levels 70. The tunnel dielectric 11 comprises a cylinder which surrounds the semiconductor channel portion 1E. The charge storage region 9 comprises a cylinder which surrounds the tunnel dielectric 11. The blocking dielectric 7 comprises a cylinder which surrounds the charge storage region 9. The plurality of control gate electrodes 3 preferably comprise metal or metal alloy control gate electrodes which surround the blocking dielectric 7 in each NAND string 150. Finally, the source side select gate electrode 204 preferably comprises a metal or metal alloy select gate electrode, as described above.

Figure 60:
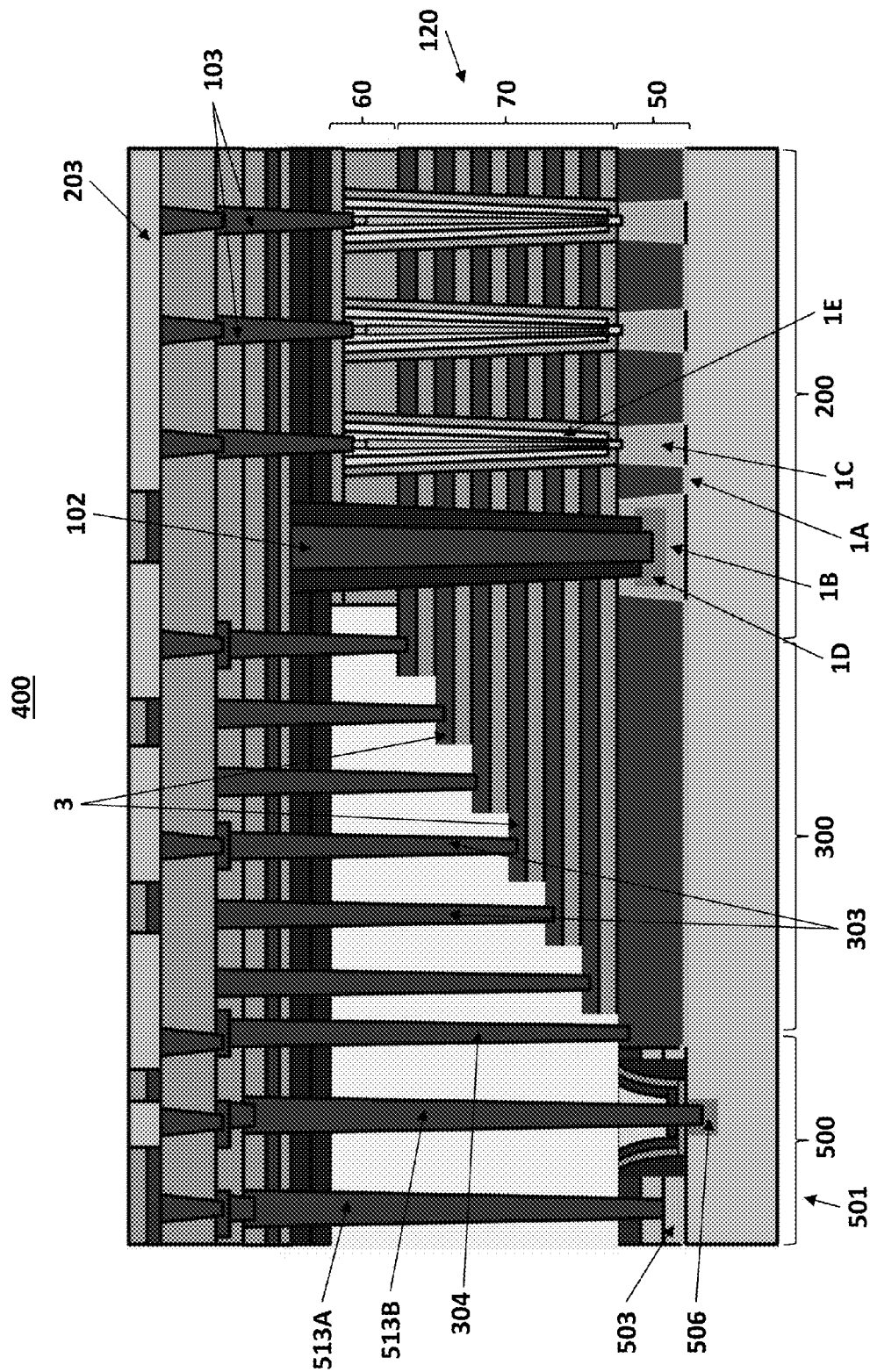

FIGS. 6 to 60 illustrate a method of making a NAND string according to a preferred, non-limiting embodiment of the invention. Specifically, the method results in a higher quality gate insulating layer 206 for the source side select gate transistor 201. The gate insulating layer 206 is not subject to processing damage because it is formed after forming channel 1 portions 1B, 1C of the select gate transistor 201. Thus, the vertical portions of the gate insulating layer 206 are not subjected to etching damage that occurs in a prior art method.

Specifically, in the prior art method, the polysilicon select gate is formed first. Then, vertical and horizontal portions of the gate insulating layer are formed on the sidewalls of the select gate portions and over the substrate between the select portions. Then, the horizontal portions of the gate insulating layer are reactively ion etched to form openings exposing the major surface 100a of the substrate 100 under the gate insulating layer. The vertical channel portions are then epitaxially grown on the major surface of the substrate through respective openings in the gate insulating layer. The reactive ion etching ("RIE") of the horizontal portion of the gate insulating layer damages the remaining vertical portions of the gate insulating layer, resulting in a lower quality gate insulating layer.

In contrast, as will be explained in more detail with reference to FIGS. 6-60, in the embodiment method of the present invention, after fabricating peripheral devices, such as peripheral transistors, an epitaxial silicon film, is grown on the etched major surface 100a of a single crystalline silicon substrate 100. The epitaxial silicon film will be used as the select gate transistor's 201 channel 1 portions 1B, 1C. Then, the silicon film is patterned using lithography and RIE fabricate the epitaxial silicon channel portions 1B, 1C (i.e., the protrusions). In other words, the patterning of the epitaxial silicon layer forms the first semiconductor protrusion 1B and the second semiconductor protrusion 1C that extend perpendicular to the major surface 100a of the substrate 100, such that the first semiconductor protrusion 1B is connected to the second semiconductor protrusion 1C by a third semiconductor region 1A which extends parallel to the major surface 100a of the substrate 100. Preferably, the third semiconductor region 1A is located in the single crystal silicon substrate 100.

The gate insulating layer 206 is then formed on the surface of the channel portions 1A, 1B and 1C. Specifically, the gate insulating layer 206 is formed over at least a first side of the first semiconductor protrusion 1B, over at least a second side of the second semiconductor protrusion 1C and over a top of the third semiconductor region 1A.

Then, a metal or metal alloy select gate layer 204 (e.g., tungsten) is deposited on the opposite side of the gate insulating layer 206. Specifically, the gate electrode 204 is formed over the gate insulating layer 206 between the first side of the first semiconductor protrusion 1B, the second side of the second semiconductor protrusion 1C and the top of the third semiconductor region 1A.

After the fabrication of the select gate transistor 201 in the select gate transistor device level 50, the three dimensional memory device levels 70 are fabricated over the select gate transistor device level by depositing and patterning a plurality of memory device layers. Finally, the trenches 84 are formed through the memory device levels 70 to expose the channel portion 1B in the select gate transistor level 50 and the trenches 84 are filled with the insulating layer 205 and the source electrode (e.g., source line) 102. With this process, the gate insulating layer 102 on the select gate channel portions is not exposed to etching damage.

This embodiment process also results in a longer channel 1 length of the select gate transistor 201 compared to the prior art process. The prior art process results in an "L" shaped channel in the select gate transistor, such that the channel has one vertical and one horizontal portion and the channel is located adjacent to only two sides (i.e., one lateral side and the bottom side) of the select gate electrode. In contrast, the embodiment process results in a longer select gate transistor channel having two vertical portions 1B, 1C and one horizontal portion 1A, and the channel is located adjacent to three sides (i.e., two lateral sides and the bottom side) of the select gate electrode 204, which also improves the select gate transistor performance.

FIGS. 6-12 illustrate a method of making the source side select transistor 201. FIG. 6 illustrates a first step in the embodiment method of making the NAND device. FIG. 6 shows the same combined bit line and word composite side cross sectional view as FIGS. 3B and 3C. In addition to the memory region 200 and the word line contact region 300 described above with reference to FIGS. 2 and 3, FIG. 6 also illustrates the peripheral device region 500. The word line contact region 300 is preferably located between the memory region 200 and the peripheral device region 500.

The peripheral devices 501, such as peripheral transistors, are first formed on the substrate 100, as shown in FIG. 6. The peripheral devices include a silicon oxide layer 502 (e.g., gate insulating layer), polysilicon layer(s) 503 (e.g., gate electrodes for the peripheral transistors), sidewall spacers 504, a silicon nitride layer 505, a doped source or drain region 506 of the peripheral transistor in the substrate 100, and one or more electrode layers contacting region 506, such as TiN 507 and tungsten 508 electrode layers. A non-doped silica glass layer 509 is then formed over the peripheral devices 501.

Figure 7:
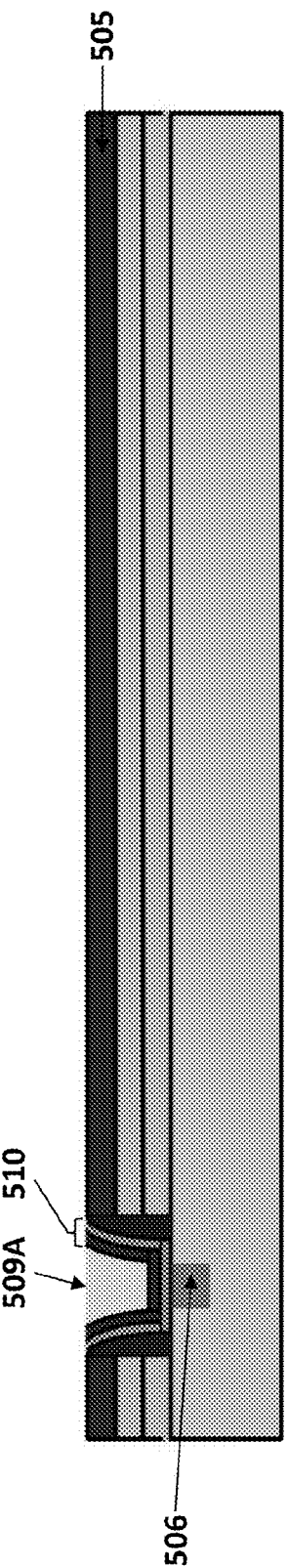

As shown in FIG. 7, layers 507, 508 and 509 are then planarized by chemical mechanical polishing ("CMP") using the silicon nitride layer 505 as a polish stop. The CMP step exposes the silicon nitride layer 505, and leaves the TiN/W electrode 510 covered by a non-doped silica glass cap 509A in a groove over the source/drain region 506.

Figure 8:
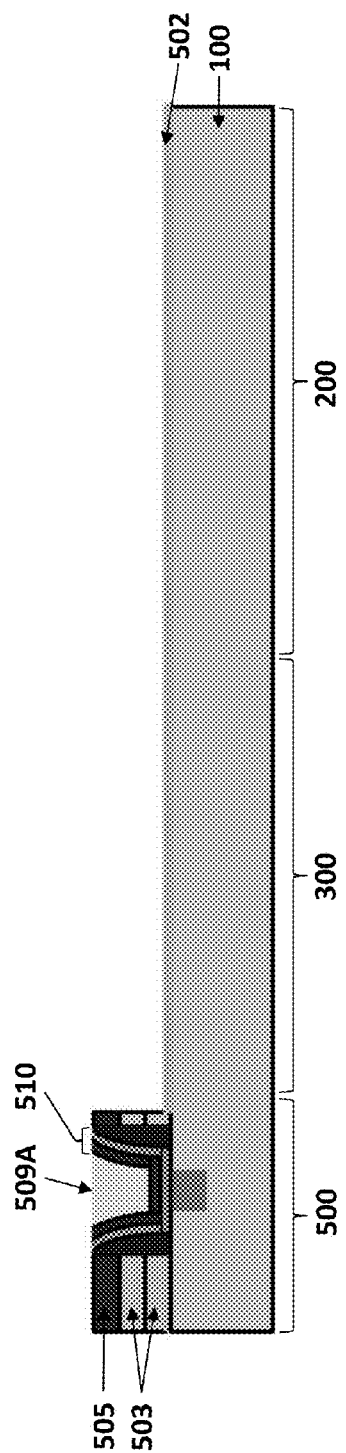
Figure 9:
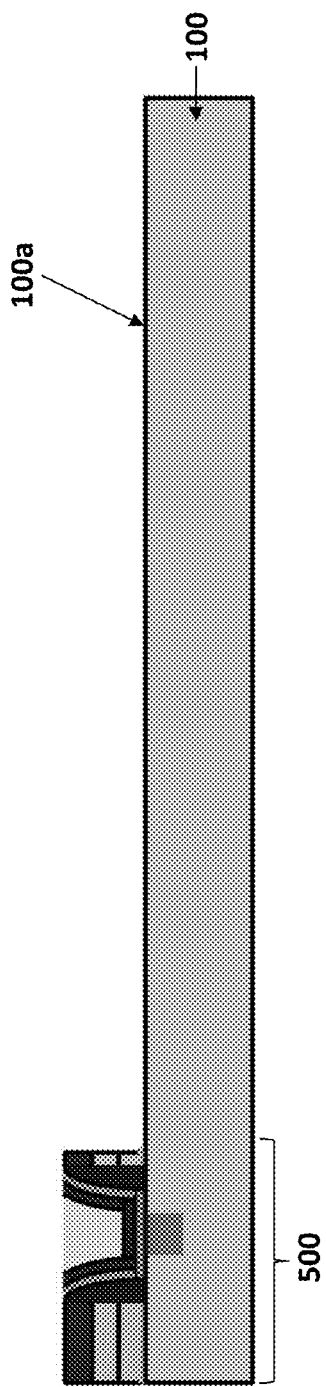

The peripheral device region 500 is then covered by a mask (e.g., photoresist, not shown in Figures for clarity), and the exposed portions of the silicon nitride 505 and polysilicon 503 layers are removed by etching in regions 200 and 300 using RIE, as shown in FIG. 8. This step exposes the silicon oxide layer 502 in regions 200 and 300. The exposed portion of the silicon oxide layer 502 in regions 200 and 300 is then removed by wet etching to expose the major surface 100a of the single crystalline silicon substrate 100 in regions 200 and 300, while leaving the peripheral devices 501 in region 500, as shown in FIG. 9.

Figure 10:
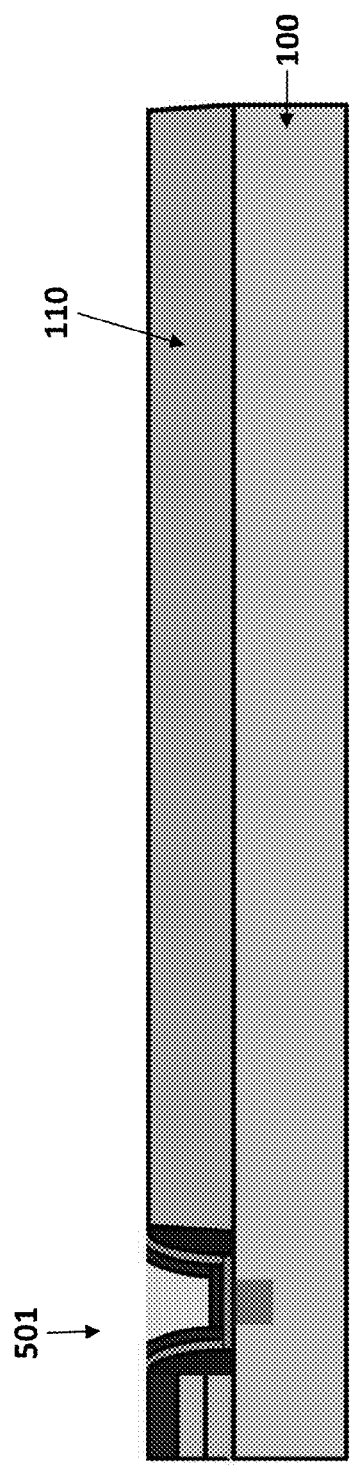

Then, as shown in FIG. 10, an epitaxial single crystal semiconductor layer, such as a single crystal silicon layer 110 is epitaxially grown on the exposed major surface 100a of the substrate 100. Layer 110 is then planarized by CMP to remove portions of the layer 110 extending over the peripheral devices 501, such that the top of layer 110 is planar with the top of the peripheral devices 501.

A mask layer is then formed over the peripheral devices 501 and layer 110. As shown in FIGS. 11A and 11B, the mask layer is then patterned into a mask pattern having mask portions 111A, 111B and 111C to cover the respective peripheral devices 501 and portions of layer 110 which will become the protrusion portions 1B, 1C of the channel 1. The mask layer may comprise any suitable mask layer, such as photoresist or a hard mask material, such as amorphous carbon, silicon nitride, metal, etc. The mask portions 111A, 111B and 111C are then used as a mask to etch uncovered portions of layer 110 to form the protrusion portions 1B, 1C of the channel 1 in remaining portions of layer 110. The recessed space 112 between the mask portions will then be filled with the gate insulating layer 206 and select gate electrode 204 in subsequent steps.

Thus, the step of patterning the epitaxial silicon layer 110 comprises forming a first mask portions 111B and second mask portions 111C over the epitaxial silicon layer and etching portions of the epitaxial silicon layer 110 that are not covered by the first mask portions and the second mask portions to form the first semiconductor protrusions 1B covered by the first mask portions 111B and the second semiconductor protrusions 1C covered by the second mask portions 111C.

As described above with respect to FIGS. 2 and 3, each first semiconductor protrusion 1B preferably comprises an epitaxial silicon rail having straight or tapered sidewalls. The second semiconductor protrusions 1C comprise epitaxial silicon pillars having a cylindrical, truncated cone or inverse truncated cone shape having a smaller width than the first semiconductor protrusion 1B.

While the protrusion portions 1B, 1C of the channel 1 are preferably formed by etching the epitaxial silicon layer 110, other methods may be used to form the protrusion portions 1B, 1C. For example, in a less preferred embodiment, the protrusion portions 1B, 1C may be formed by etching the major surface 100a of the substrate 110 such that the portions 1B, 1C comprise protruding substrate portions surrounded by a recessed space 112.

Figure 12:
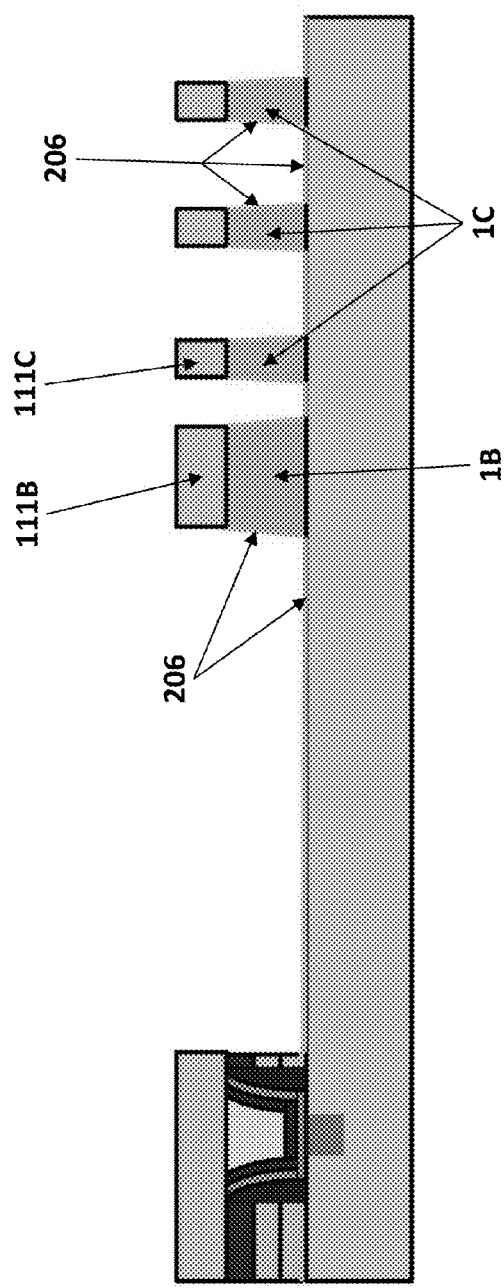

Referring to FIG. 12, the gate insulating layer 206 is formed on the sidewalls of the protrusions 1B, 1C and on the channel portion 1A (i.e., the major surface 100a of the substrate 100) exposed in space 112. The gate insulating layer 206 may be formed by oxidation of the exposed silicon sidewalls protrusions 1B, 1C and on the channel portion 1A to form a silicon oxide gate insulating layer 206. Layer 206 is not formed on top surfaces of the protrusions 1B, 1C because the top surfaces of the protrusions 1B, 1C are covered by the mask portions 111B, 111C, respectively. Any suitable oxidation process may be used, such as radical oxidation, dry oxidation, wet oxidation, etc. Alternatively, rather than oxidizing the exposed silicon surfaces, a silicon oxide gate insulating layer 206 may be deposited by chemical vapor deposition ("CVD") or sputtering.

Thus, the step of forming the gate insulating layer 206 comprises oxidizing the first and second side of the first semiconductor protrusion 1B, the first and second side of the second semiconductor protrusion 1C and the top of the third semiconductor region 1A without oxidizing tops of the first and the second semiconductor protrusions which are covered by the respective first 111B and second mask portions 111C.

Figure 13:
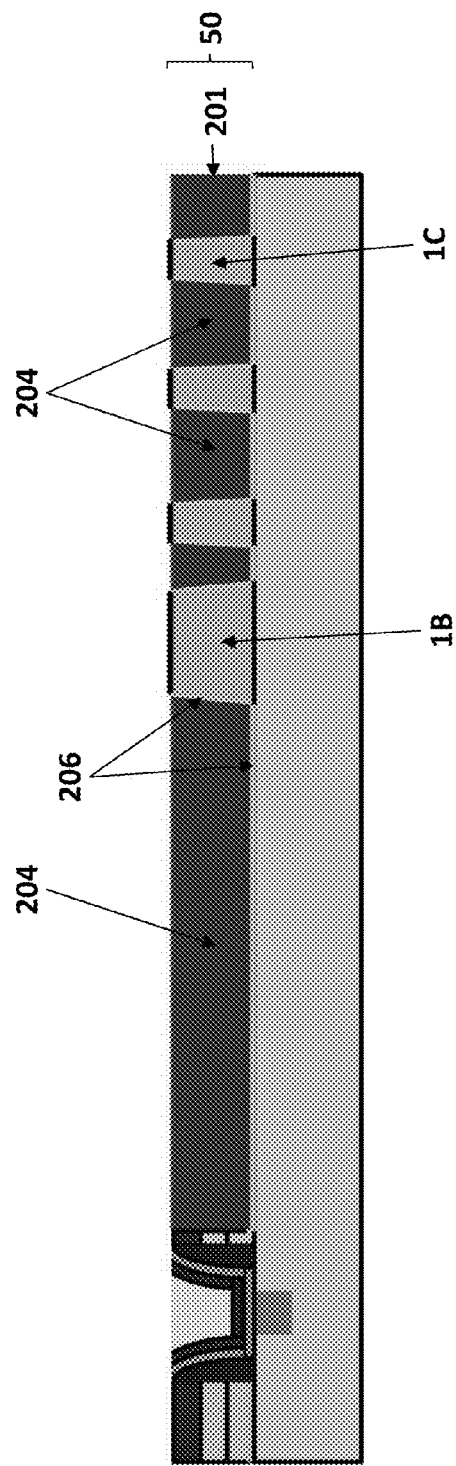

The metal or metal alloy layer that will be used to form the select gate electrode 204 is then deposited over the gate insulating layer 206 before or after removing the mask portions 111A, 111B and 111C, as shown in FIG. 13. For example, the select gate electrode 204 material may be deposited after removing the mask portions over the device, followed by planarization by CMP to expose the tops of the protrusions 1B, 1C. Alternatively, the select gate electrode material 204 may be deposited over the mask portions 111A, 111B and 111C, followed by a lift off step in which the mask portions are lifted off with the select gate material portions overlying the mask portions. As described above, the select gate electrode material 204 may comprise any suitable conductive material, such as a titanium nitride liner layer and tungsten layer on the titanium nitride liner layer.

Thus, the step of forming the select gate electrode 204 comprises removing the first 111B and the second 111C mask portions, forming a metal or metal alloy layer 204 over and between the first and the second semiconductor protrusions and planarizing the metal or metal alloy layer to expose the top of the first semiconductor protrusion 1B and the top of the second semiconductor protrusion 1C. The step of forming the metal or metal alloy layer 204 may comprise forming a titanium nitride liner over and between the first 1B and the second 1C semiconductor protrusions and forming a tungsten layer over the titanium nitride liner followed by planarizing by CMP the titanium nitride liner and the tungsten layer.

This completes the select gate transistor 201 in the select gate transistor device level 50. The memory device levels 70 are then formed over the select gate transistor device level 50, as shown in FIGS. 14-25.

Figure 14:
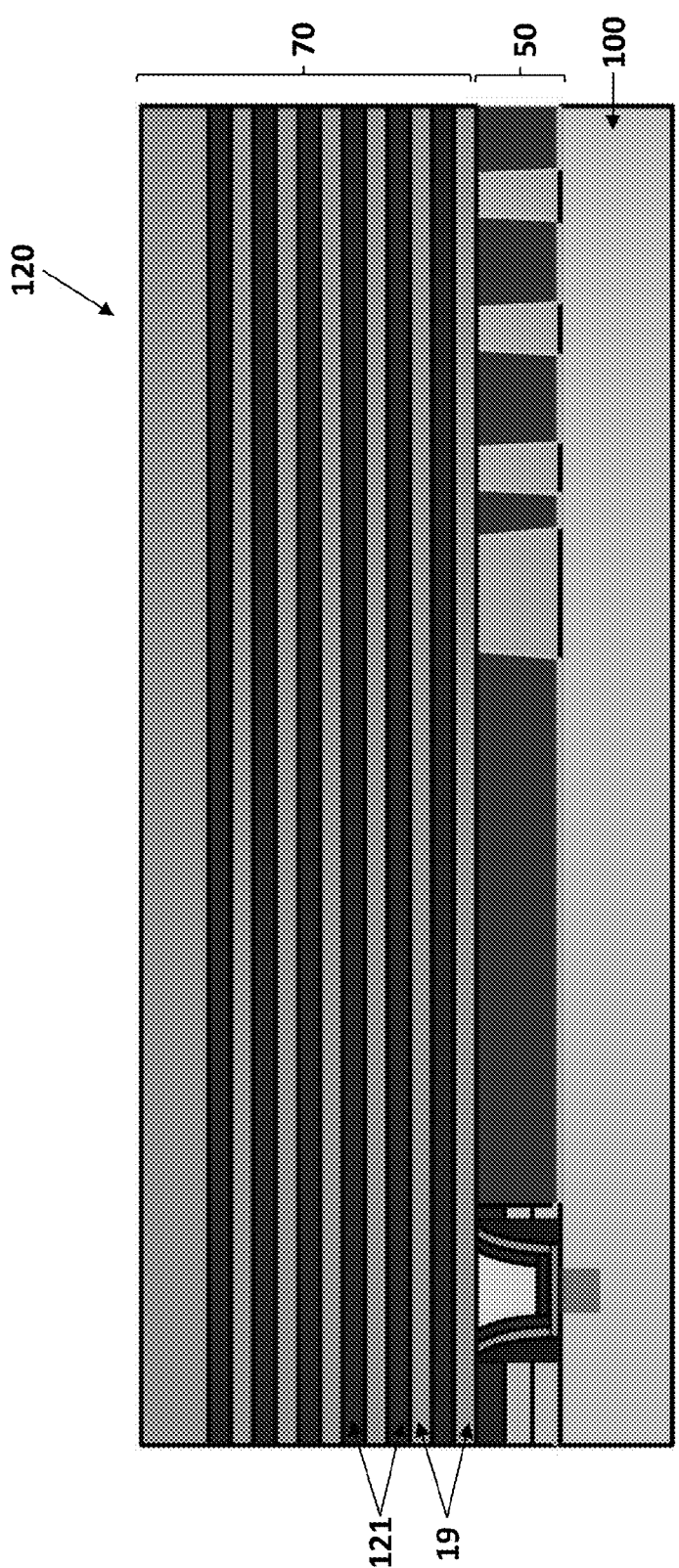

Referring to FIG. 14, a stack 120 of alternating layers 19 and 121 are formed over the memory device levels 70. Layers 19, 121 may be deposited over the device level 50 by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. Preferably, layers 121 comprise silicon nitride.

Figure 15:
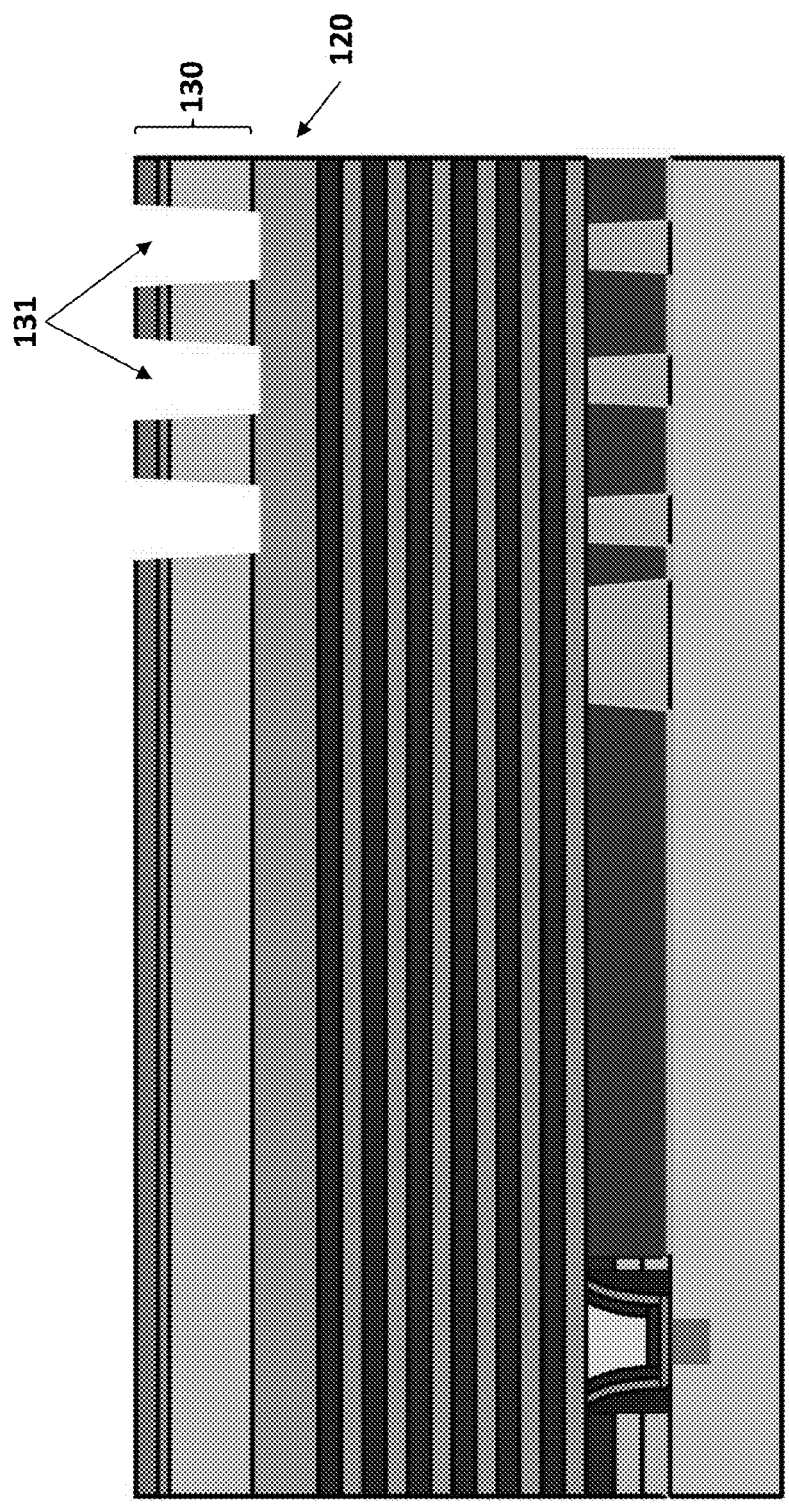
Figure 16:
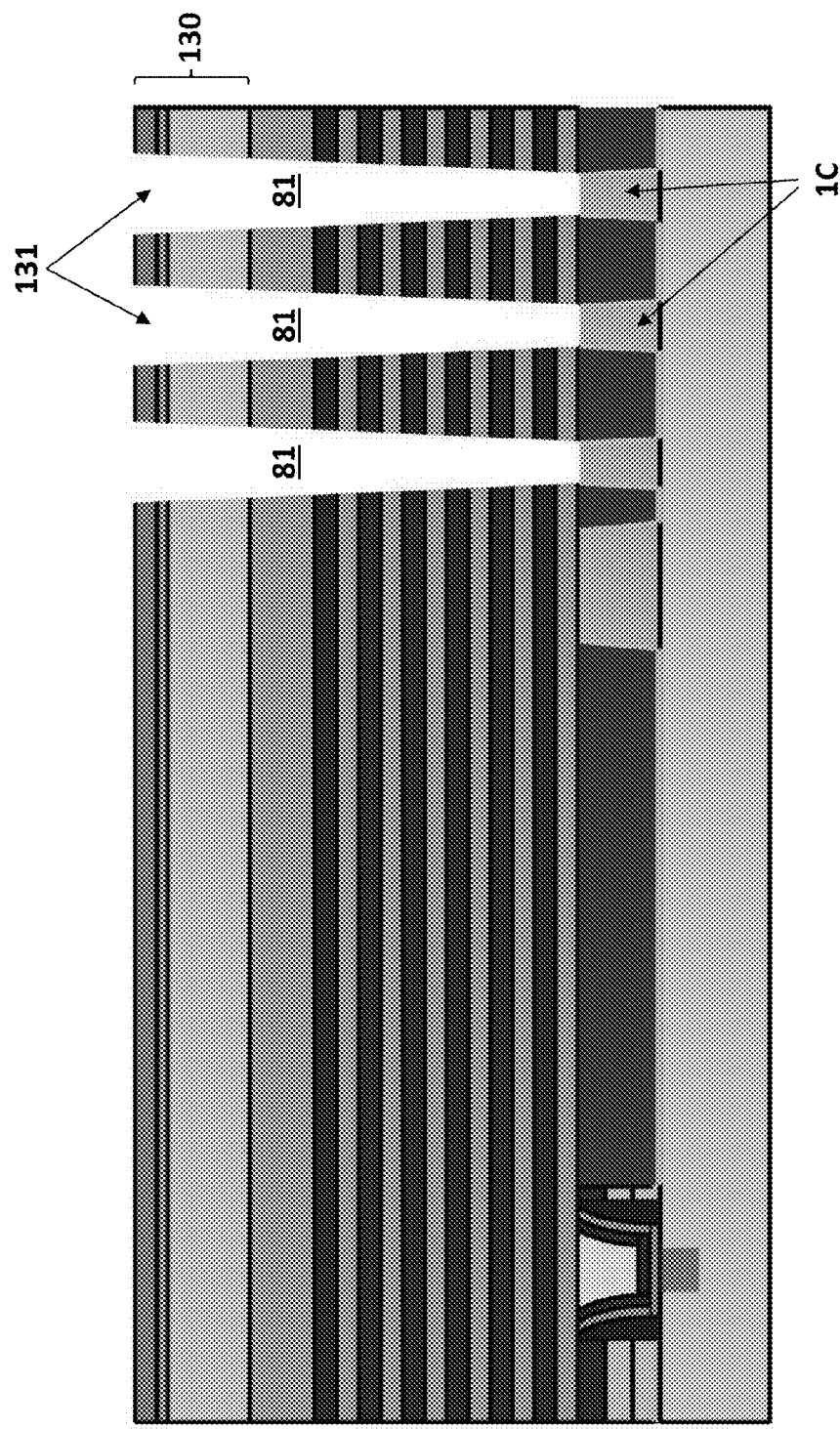

The deposition of layers 19, 121, is followed by etching the stack 120 to form at least one a front side opening 81 in the stack 120. An array of a front side openings 81 (e.g., cylindrical memory openings or holes) may be formed in locations where vertical channels of NAND strings 150 will be subsequently formed, as shown in FIGS. 15 and 16.

The openings 81 may be formed by photolithography and etching, as follows. First, a memory hole mask 130 is formed over the stack and patterned to form openings 131 exposing the stack 120, as shown in FIG. 15. Mask 130 may comprise any suitable material, such as one or more layer of photoresist and/or hard mask material described above. Then, the stack 120 is etched using RIE to form the openings 81 in the stack through the openings 131 in mask 130. Each front side memory opening 81 is etched until one of the respective second protrusions 1C is exposed in the opening 81, as shown in FIG. 16.

Figure 17:
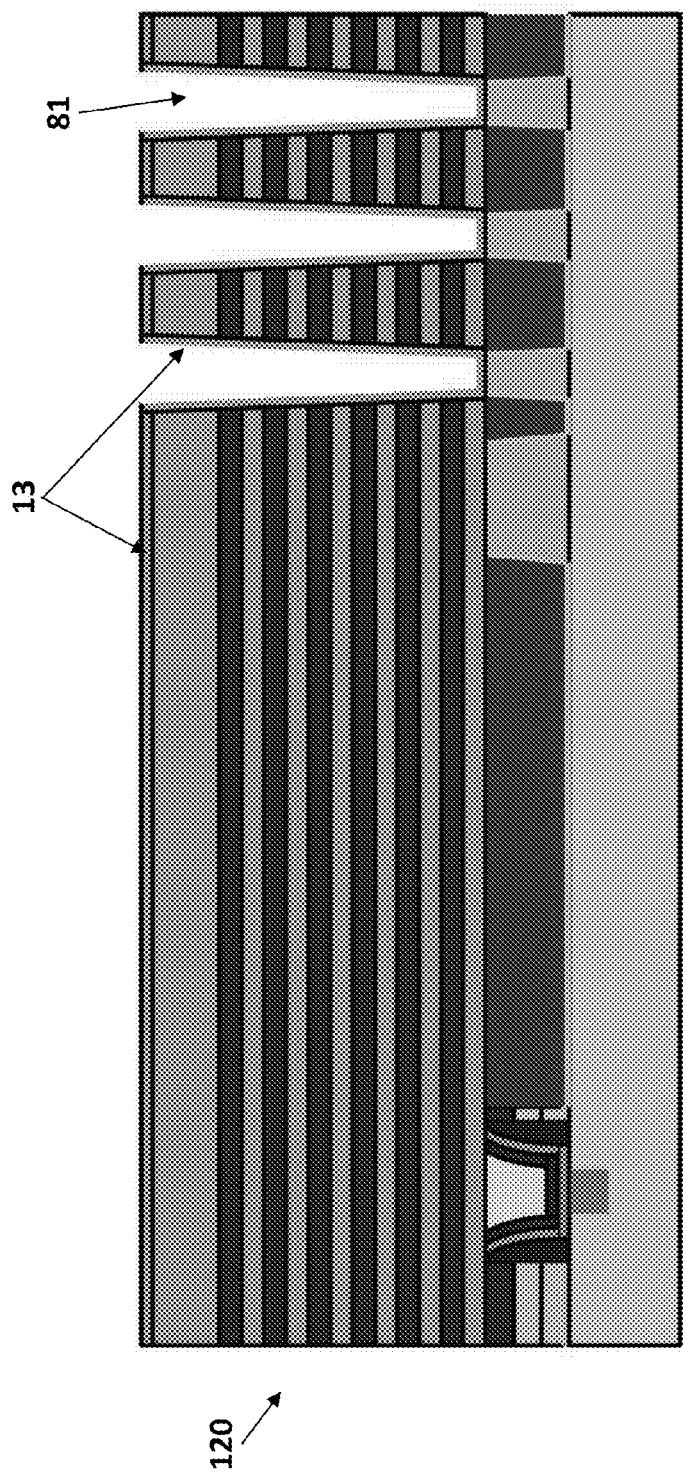

Then, as shown in FIG. 17, the memory film 13 is formed in the memory openings 81 and over the stack 120. Specifically, this step includes forming a blocking dielectric in the memory opening 81, forming a charge storage region (e.g., silicon nitride layer or a floating gate layer) over the blocking dielectric in the memory opening, and forming a tunneling dielectric over the charge storage region in the memory opening 81.

Then, the channel 1 portion 1E is formed by depositing channel material, such as a lightly doped or intrinsic polysilicon over the tunnel dielectric layer portion of the memory film 13 in the front side opening 81. If desired, a high temperature anneal may be performed after forming the channel portion 1E. As discussed above, the entire opening 81 may be filled to form the device illustrated in FIG. 1D. Alternatively, a layer of channel material may first be deposited in the opening 81 followed by deposition of an insulating fill material 2 to form the device illustrated in FIG. 1B.

Figure 18:
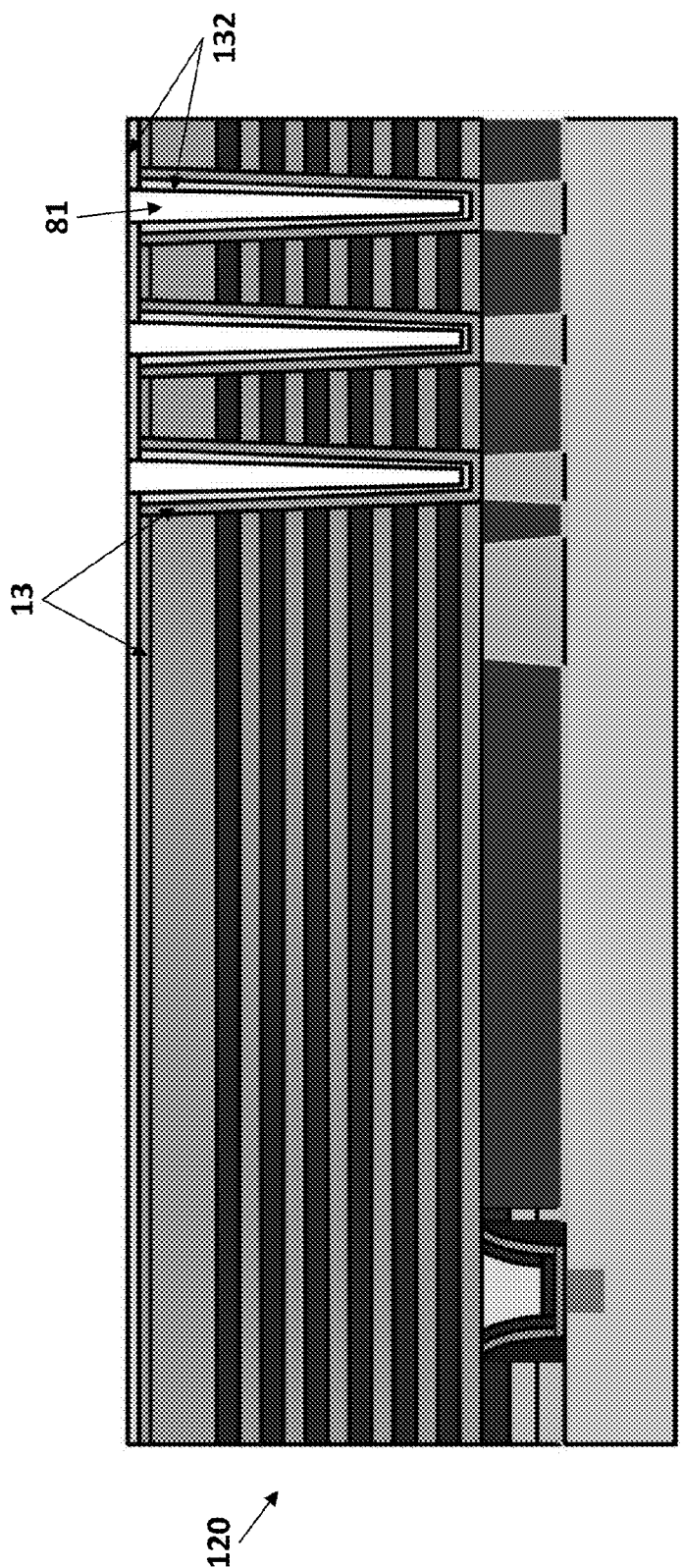

In a preferred embodiment, the channel may be formed by a multi-step process utilizing a protective layer, as will be described below with reference to FIGS. 18 to 25. First, as shown in FIG. 18, a cover semiconductor layer 132, such as an amorphous silicon or polysilicon layer, is formed in the memory openings 81 over the memory film 13 and over the stack 120. Layer 132 protects the memory film 13 from damage during a subsequent etching step.

Figure 19:
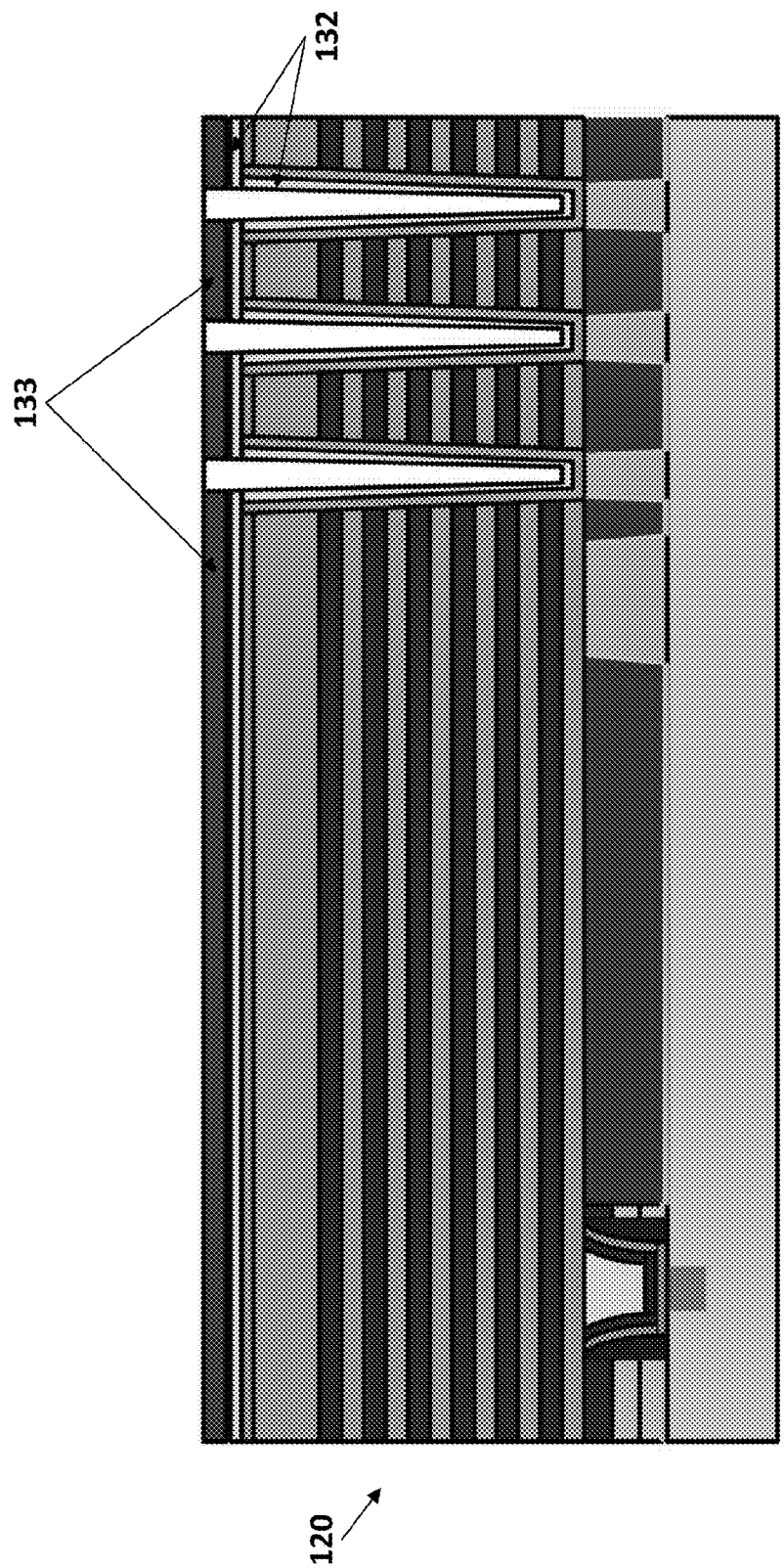

Then, a hard mask cover layer 133 is formed over layer 132. The hard mask cover layer 133 may comprise an amorphous carbon layer for example. Layer 133 is deposited non-conformally such that layer 133 is located over layer 132 on top of the stack 120, but does not extend into the memory openings 81, as shown in FIG. 19. Alternatively, layer 133 may be deposited conformally and then patterned by photolithography and etching to be removed from the memory openings.

Figure 20:
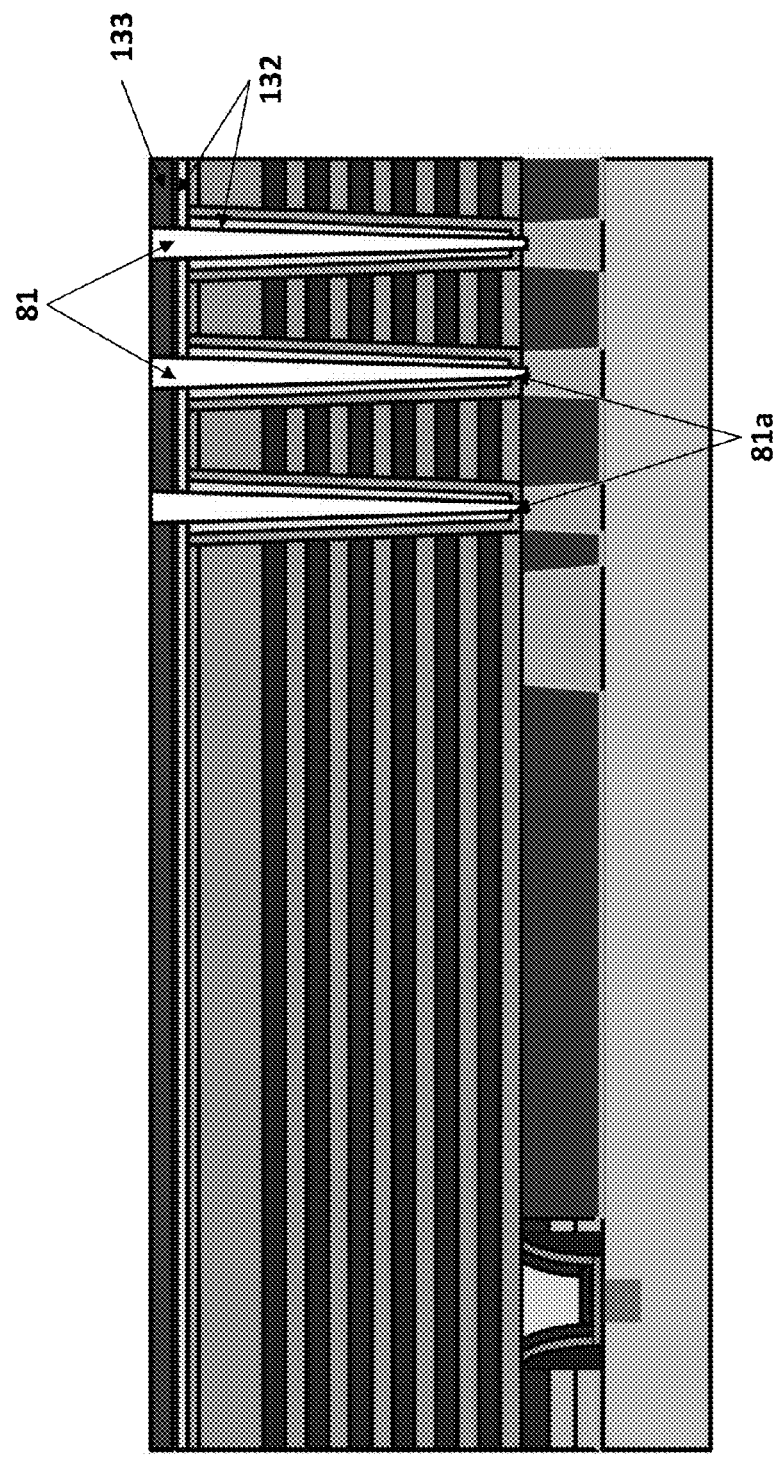

As shown in FIG. 20, the memory film 13 (e.g., the blocking dielectric, the charge storage region and the tunnel dielectric) is removed from a bottom of the memory openings 81 using RIE or another suitable anisotropic etching method. The cover semiconductor layer 132 protects the memory film 13 on the sidewalls of the memory openings 81 from etching damage, and the hard mask cover layer 133 protects the rest of the stack from being etched. The etching step forms extension portions 81A of the openings 81 which expose the second protrusions 1C at the bottom of the openings 81. The hard mask cover layer 133 is then removed by any suitable method, such as ashing or selective wet etching.

Figure 21:
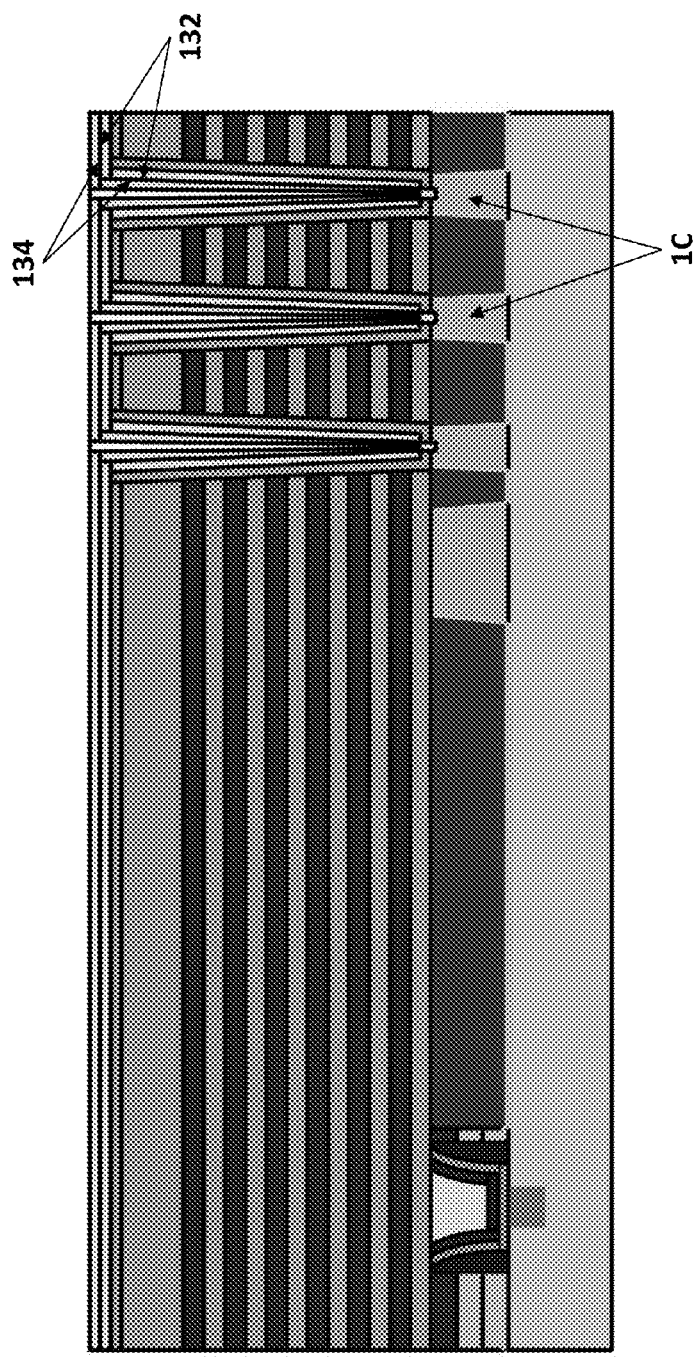

As shown in FIG. 21, a semiconductor channel body layer 134 is formed in the memory openings 81 such that it makes contact with the second semiconductor protrusions 1C exposed in the openings 81. The semiconductor channel body layer 134 comprises a channel material, such as amorphous silicon or polysilicon. Layers 132 and 134 preferably comprise the same materials, and layer 134 contacts layer 132 on the sidewalls of the openings 81.

Figure 22:
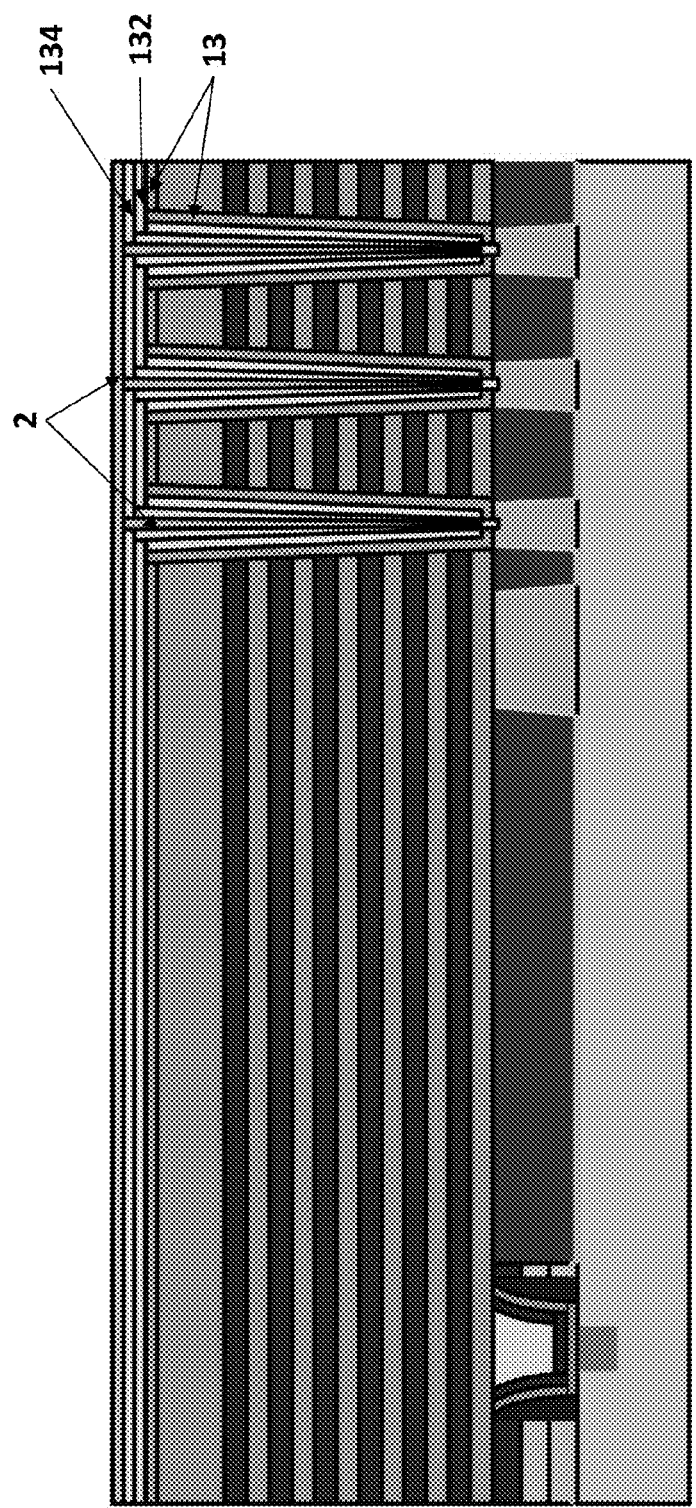
Figure 23:
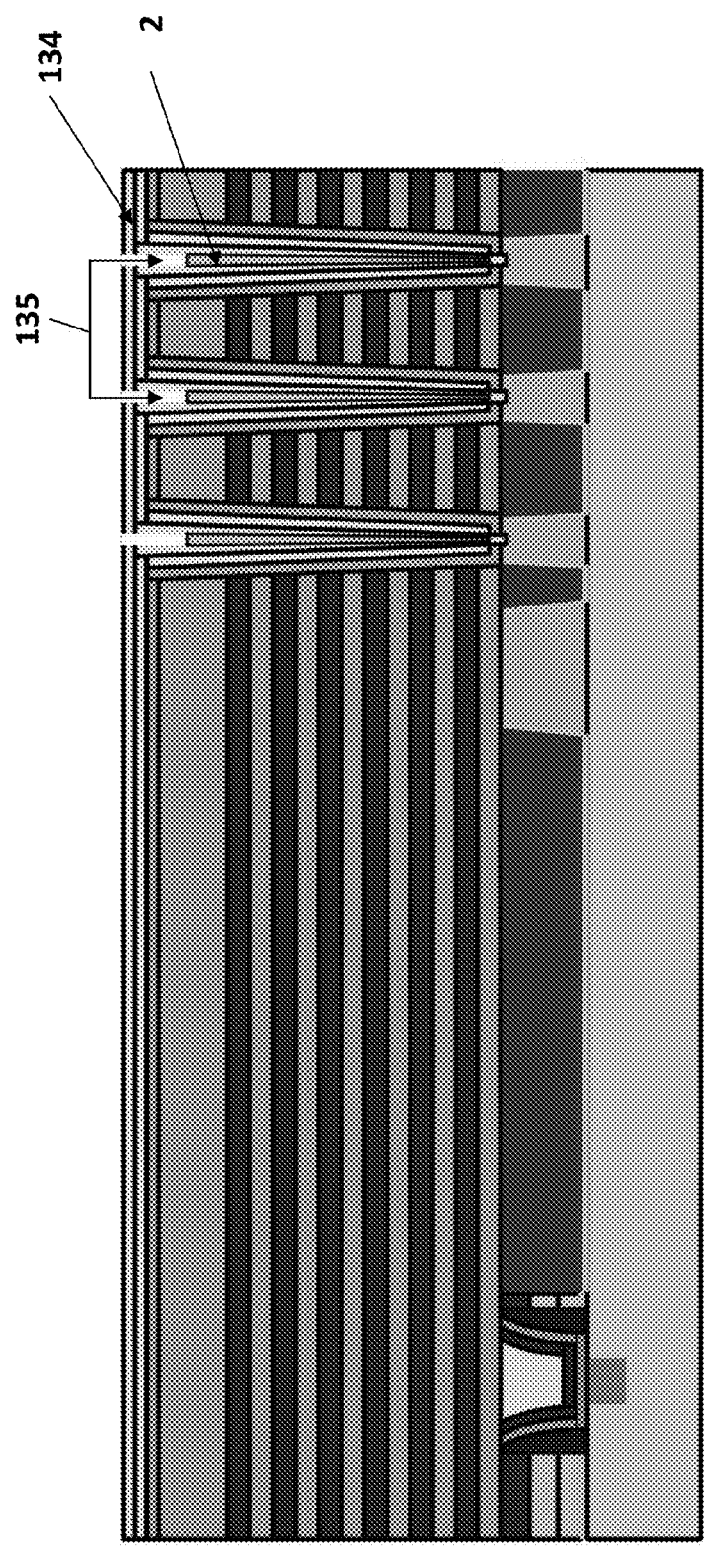

The optional core insulating layer 2, such as a silicon oxide layer is then deposited in the openings 81 and over the stack 120, as shown in FIG. 22. Layer 2 is also shown in FIGS. 1A and 1B. The core insulating layer 2 is then recessed from the top of the openings 81 by selective etchback to form recesses 135 in the top of the openings 81, as shown in FIG. 23.

Figure 24:
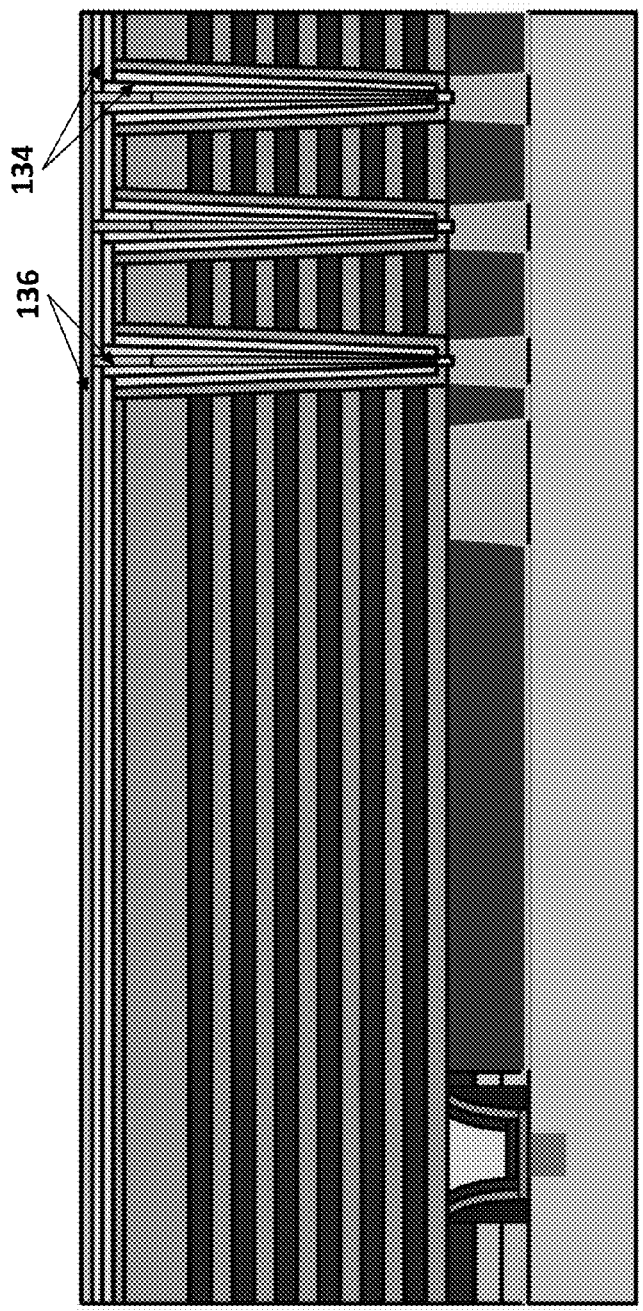

The recesses 135 are then filled by a semiconductor cap layer 136 which is deposited conformally over layer 134 on the stack 120 and in the recesses 135, as shown in FIG. 24. The cap layer 136 comprises a channel semiconductor material, such as amorphous silicon or polysilicon. Layer 136 preferably comprises the same material as layers 132 and 134. Layer 136 completely fills the recesses 135 and contacts layer 134 on the sidewalls of the recesses 135 in the openings 81.

Figure 25:
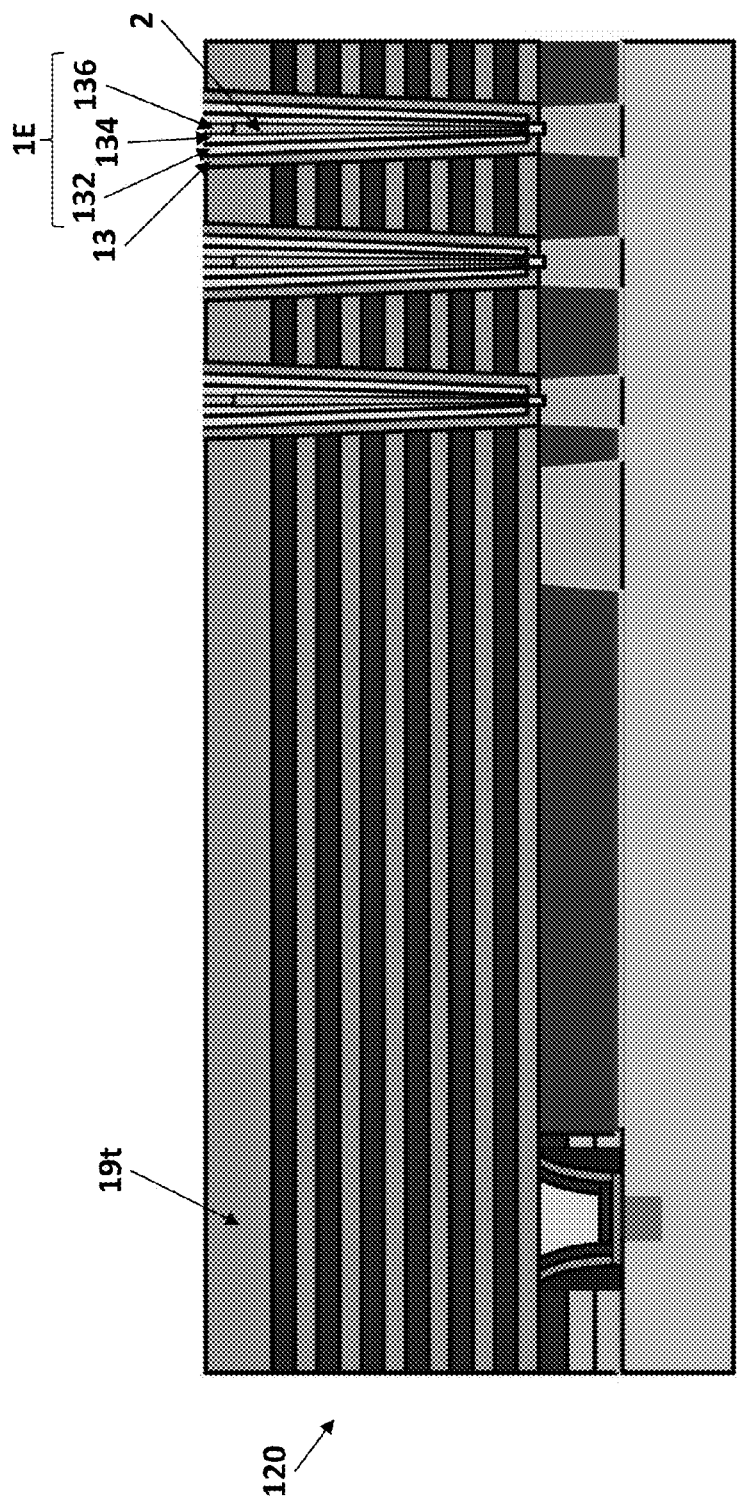

As shown in FIG. 25, the semiconductor channel layers 132, 134 and 136 are then planarized by etch back or CMP to remove these layers from the top of the stack 120 to expose the upper silicon oxide layer 19t of the stack. The channel layers 132, 134 and 136 remain in the openings 81 and together form the above described portion 1E of the channel 1 in the memory device levels 70.

Thus, as shown in FIG. 25, the channel 1 portion 1E of the embodiment of FIGS. 18-25 is composed of three sublayers 132, 134, 136. Sublayer 132 comprises an outer hollow cylinder or hollow inverse truncated cone which contacts the memory film 13 with its outer surface. Sublayer 132 does not contact the pillar/protrusion channel 1 portion 1C in the select gate transistor device level 50.

Sublayer 134 comprises an inner hollow cylinder or hollow inverse truncated cone which contacts sublayer 132 with its outer surface. Sublayer 134 contacts the core insulating layer 2 with its inner surface in the lower portion of the opening 81 and contacts sublayer 136 with its inner surface in the upper portion of the opening 81. Preferably, sublayer 134 completely fills the extension portion 81a of the opening 81 and contacts the pillar/protrusion channel 1 portion 1C in the select gate transistor device level 50.

Sublayer 136 comprises a filled cylinder or filled inverse truncated cone which is located only in the upper portion of the opening 81. Sublayer 136 contacts sublayer 134 with its outer surface. Sublayer 136 also contacts the top of the core insulating layer 2 with its bottom surface.

Figure 26:
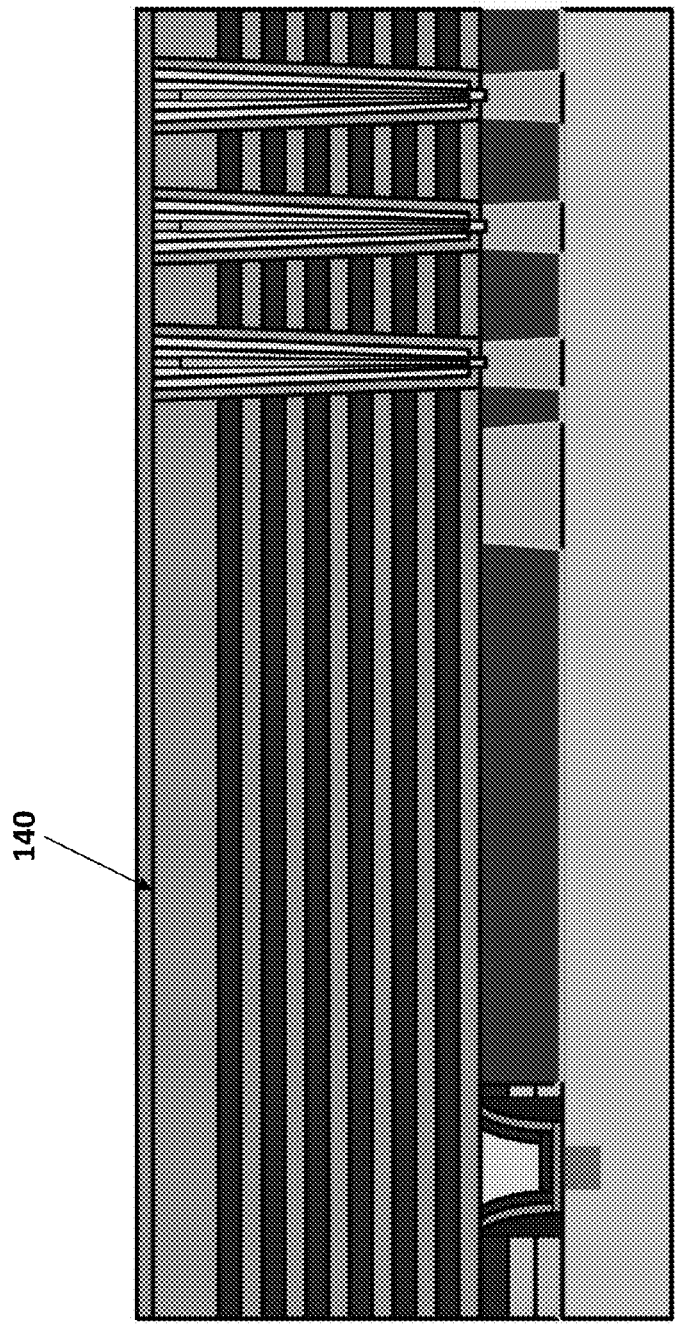
Figure 27:
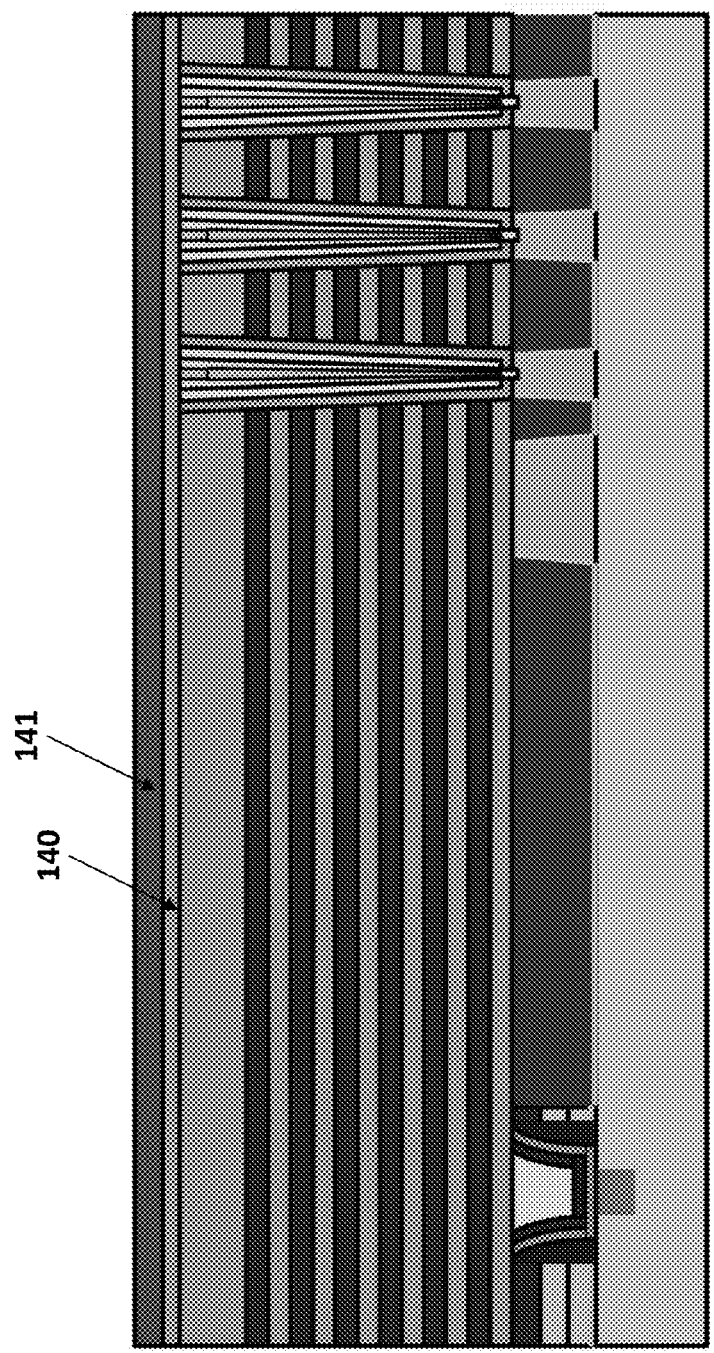

The stepped word line contact region 300 is then formed using the steps described below with respect to FIGS. 26-34. First, an insulating cap layer 140 is formed over the stack 120 and over the channel 1 filled openings 81, as shown in FIG. 26. Layer 140 may be a silicon oxide layer. A barrier layer 141, such as a silicon nitride layer, is formed over layer 140, as shown in FIG. 27.

Figure 28:
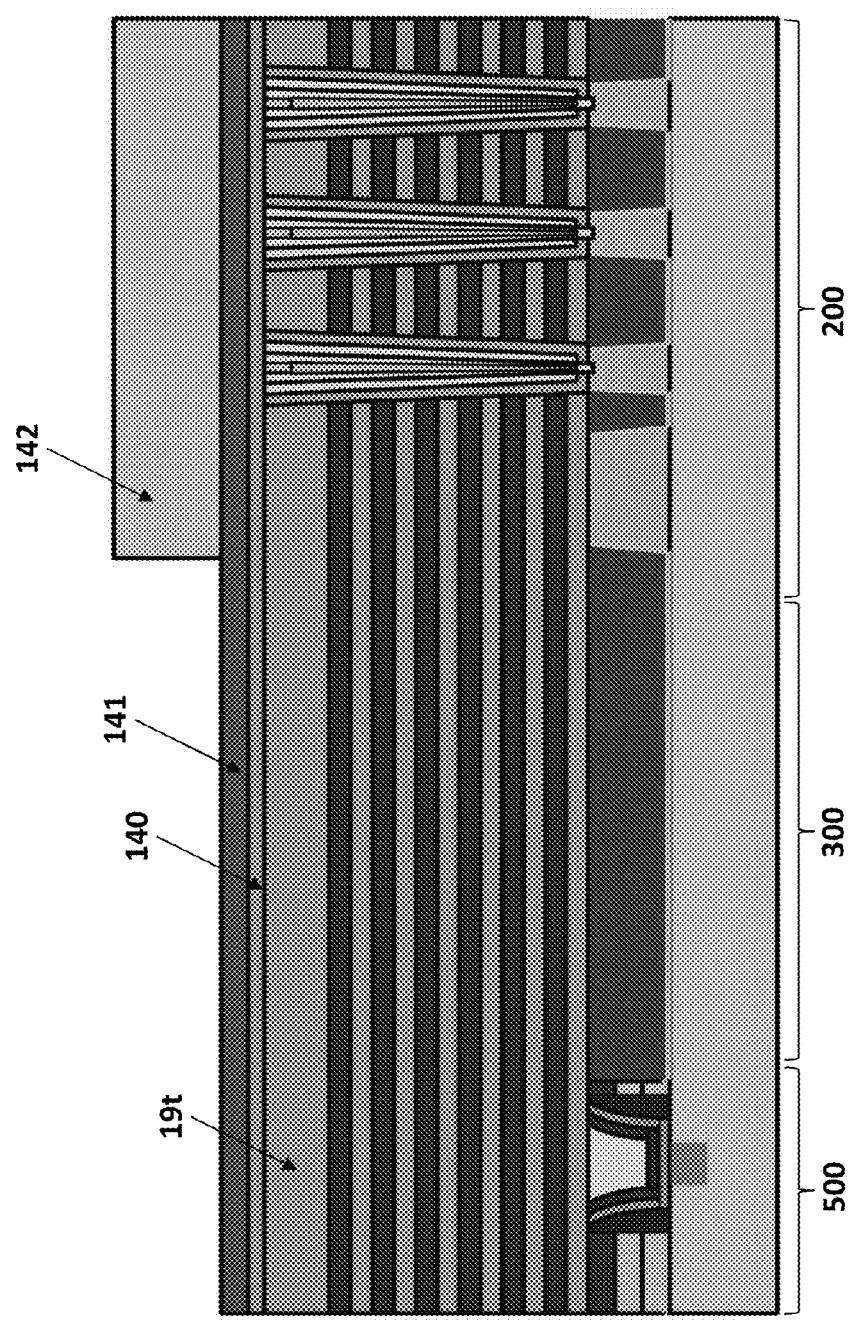
Figure 29:
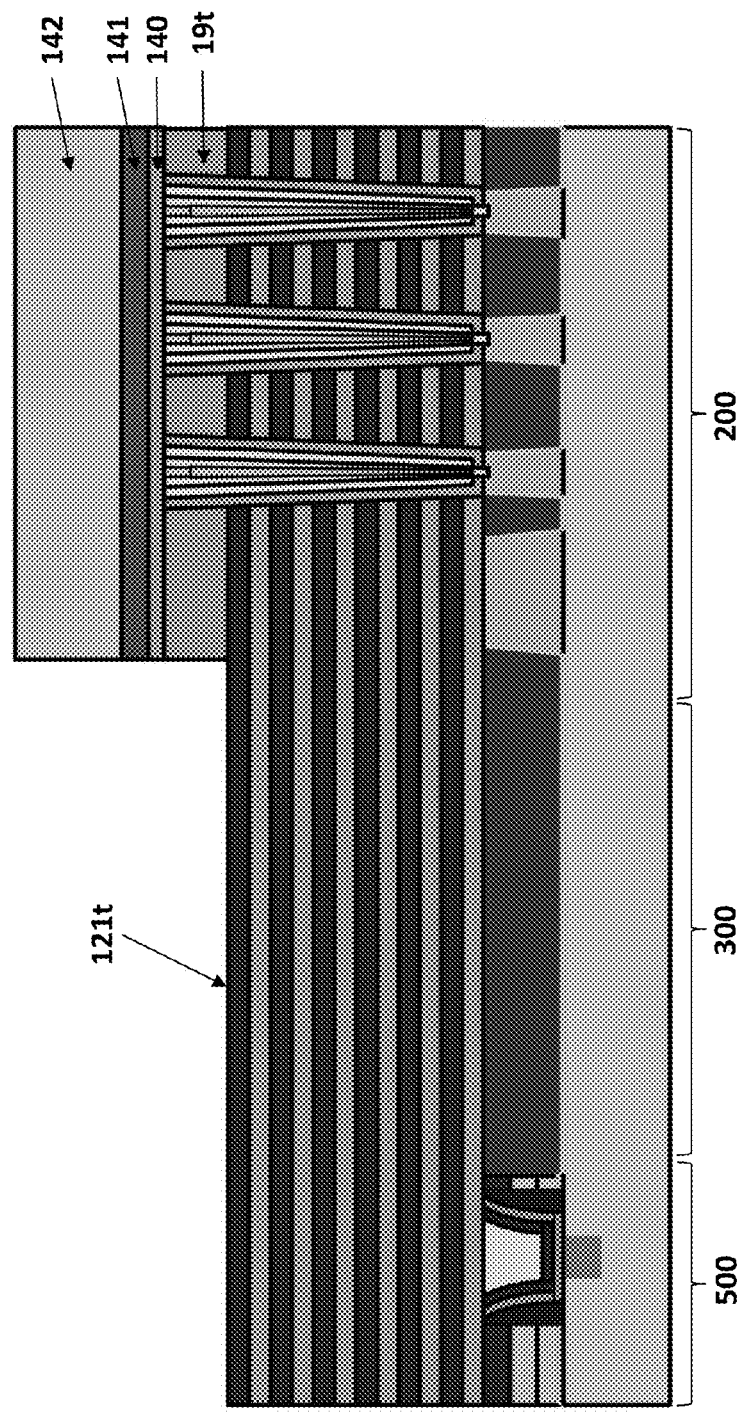

As shown in FIG. 28, a mask 142, such as a photoresist or hard mask, is then formed over layer 141 in the memory region 200 and exposing the layer 141 in stepped word line contact region 300 and in the peripheral region 500. Layers 141, 140 and 19t are then etched by RIE or another suitable etching method in the exposed regions 300 and 500 but not in the masked region 200. This etching step exposes the top sacrificial layer 121t in the stack in regions 300 and 500, as shown in FIG. 29. The mask 142 is then removed.

Figure 30:
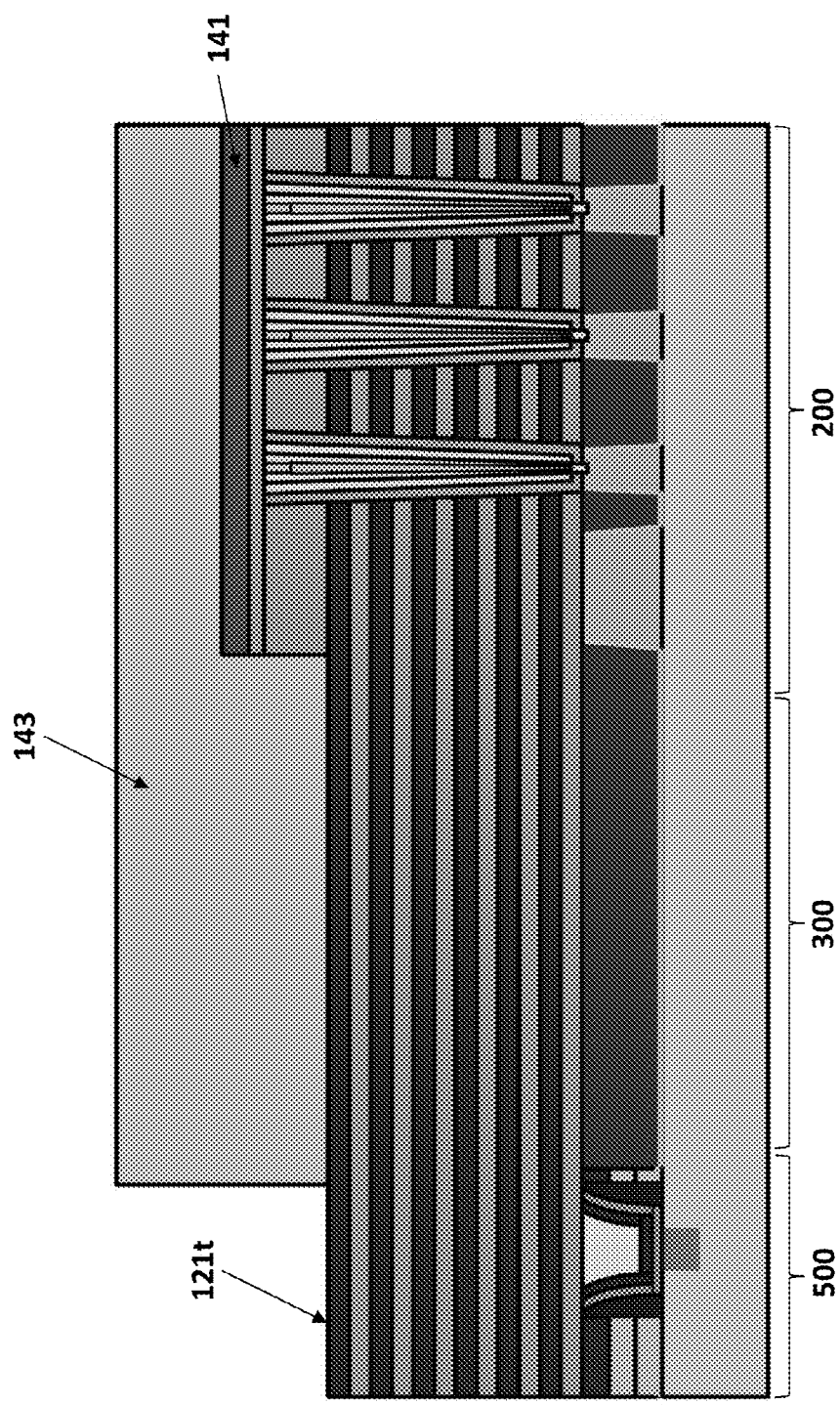

The masking and etching steps are then repeated multiple times to etch steps in the stack layers 19, 121 in the stepped word line contact region 300. For example, a second mask 143 is formed over the remaining unetched layer 141 in region 200 and over a portion of the exposed top sacrificial layer 121t in region 300. The second mask 143 covers regions 200 and 300 but not region 500, as shown in FIG. 30.

Figure 31:
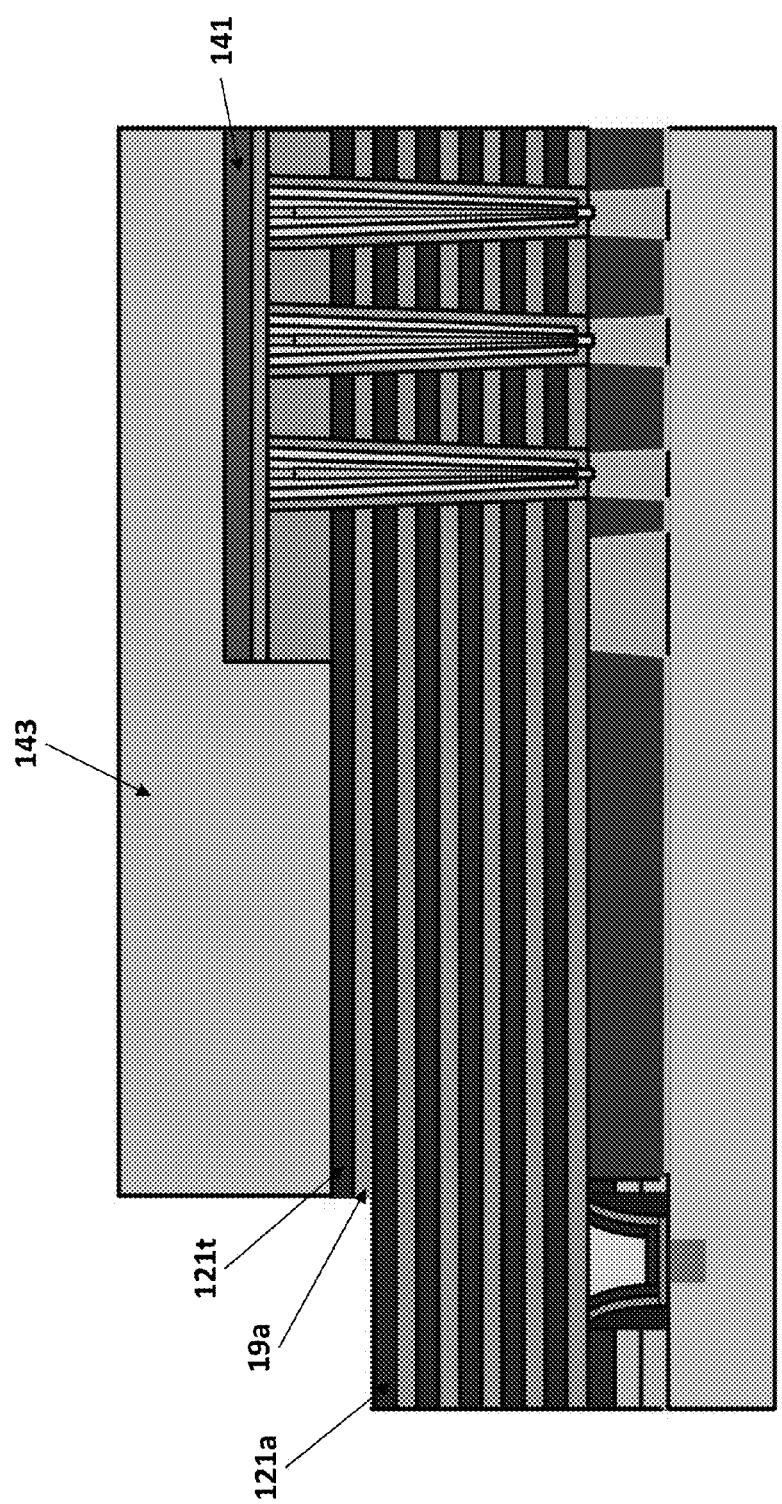

Layer 121t and the underlying insulating layer 19a in the stack are then etched by RIE or another suitable etching method in the exposed region 500 but not in the masked regions 200 and 300. This etching step exposes the second from the top sacrificial layer 121a in the stack in region 500, as shown in FIG. 31. The mask 143 is then removed.

Figure 32:
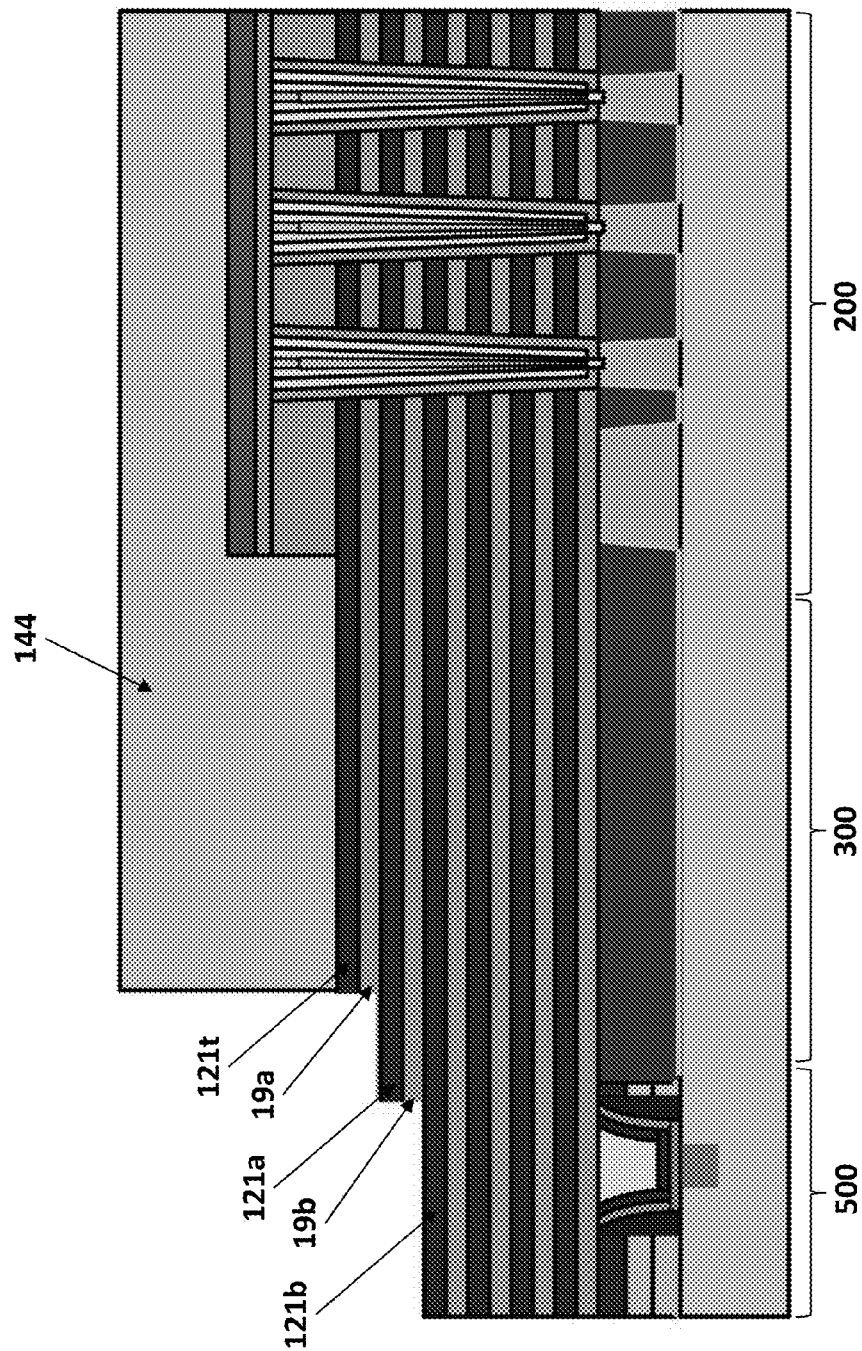

A third mask 144 is formed over the remaining unetched layer 141 in region 200 and over a portion of the exposed top sacrificial layer 121t in a first portion of region 300 adjacent to region 200. The third mask 144 covers region 200 and the adjacent first portion of region 300 but not region 500 and adjacent second portion of region 300, as shown in FIG. 32. Layers 121t, 19a, 121a and 19b in the stack are then etched by RIE or another suitable etching method in the exposed region 500 and the second portion of region 300 but not in the masked region 200 and the first portion of region 300. This etching step exposes the third from the top sacrificial layer 121b in the stack in region 500 and sacrificial layer 121a in the second portion of region 300, as shown in FIG. 32. The mask 144 is then removed.

Figure 33:
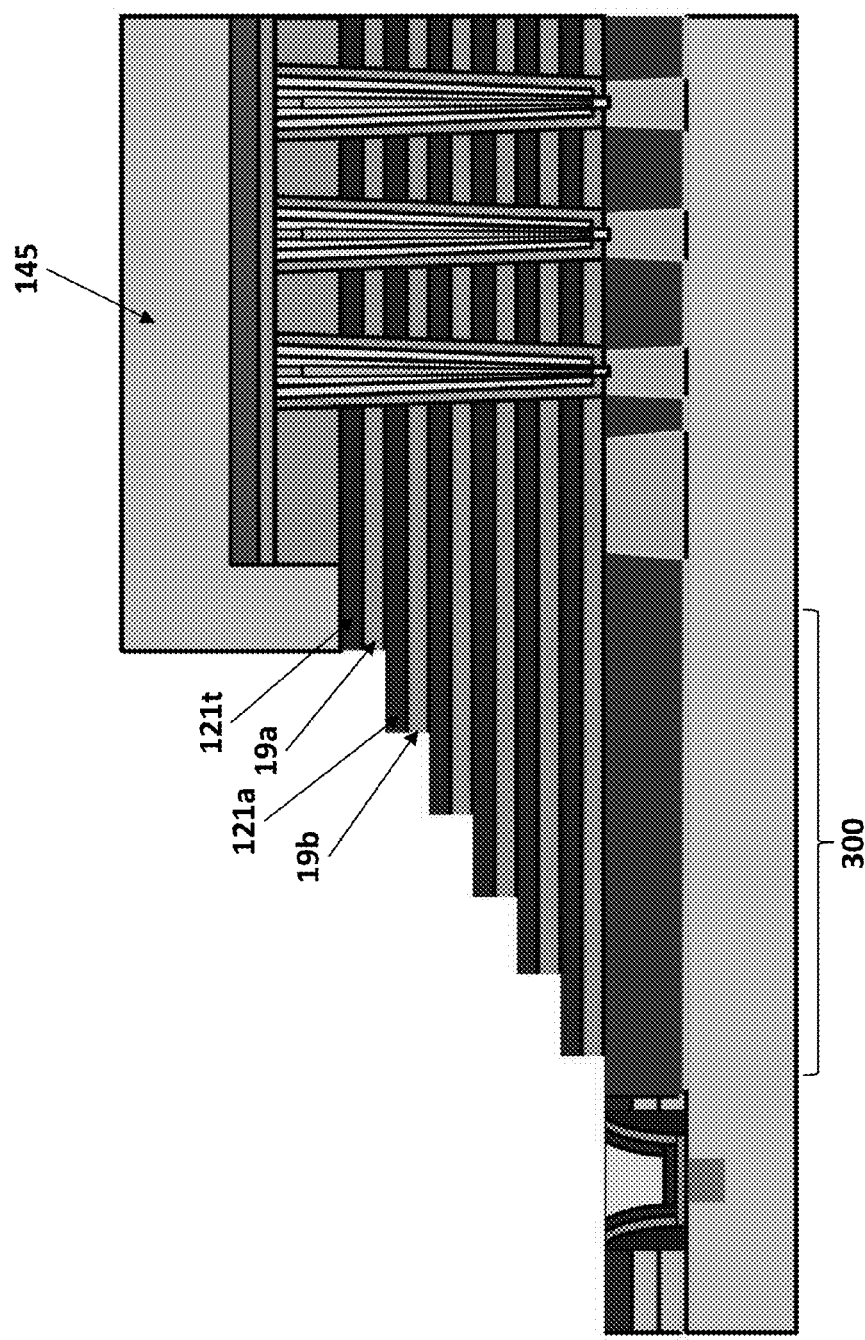
Figure 34:
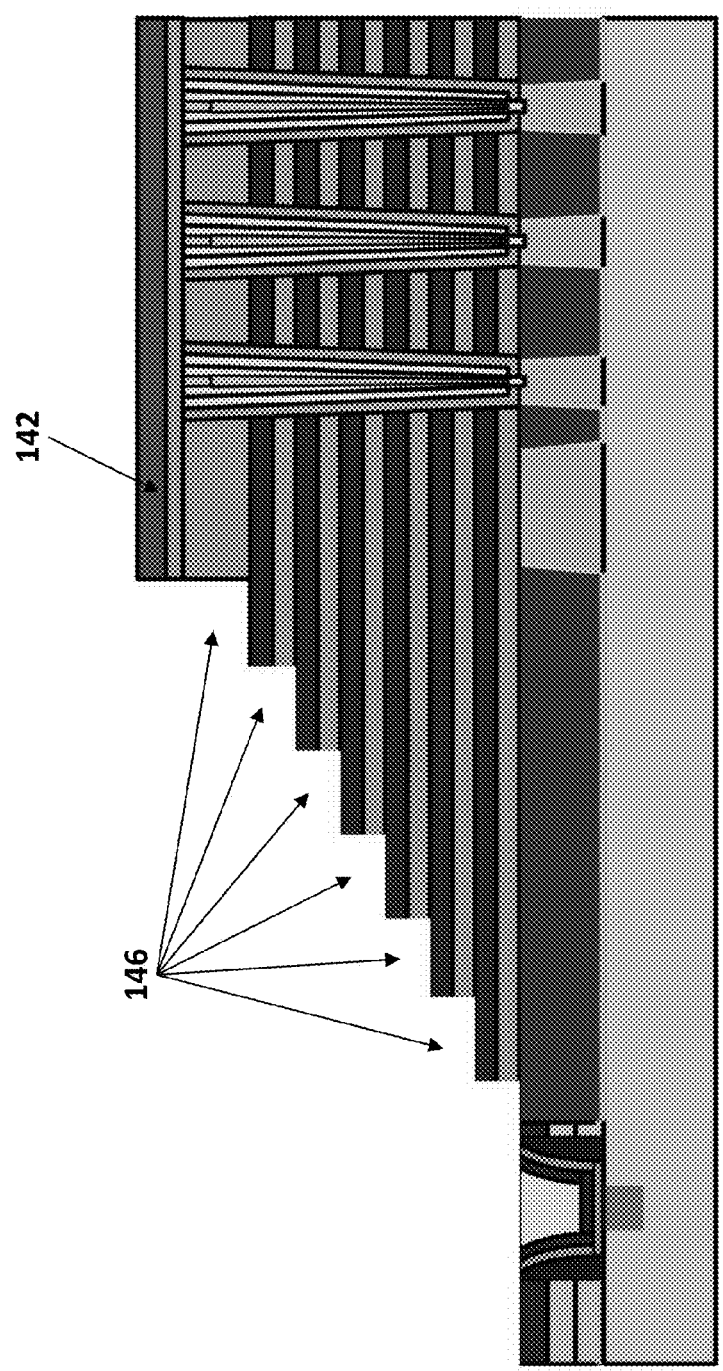

The process shown in FIG. 32 is then repeated with successively shorter masks until all of the steps are etched in region 300. For example, FIG. 33 shows the final mask 145 used to etch the final portions of the top sacrificial layer 121t and underlying layers. The mask 145 is then removed by wet etching or ashing, as shown in FIG. 34. This completes the steps 146 in region 300. The sacrificial layers 121 are exposed at the top of each step.

A planarized insulating fill is then formed over regions 300 and 500. This fill may be formed by depositing a single insulating layer over the device shown in FIG. 34 following by a planarization step, such as CMP. In an optional embodiment, the insulating fill is formed in plural steps with plural layers to reduce or avoid CMP dishing (i.e., erosion), as shown in FIGS. 35-43.

Figure 35:
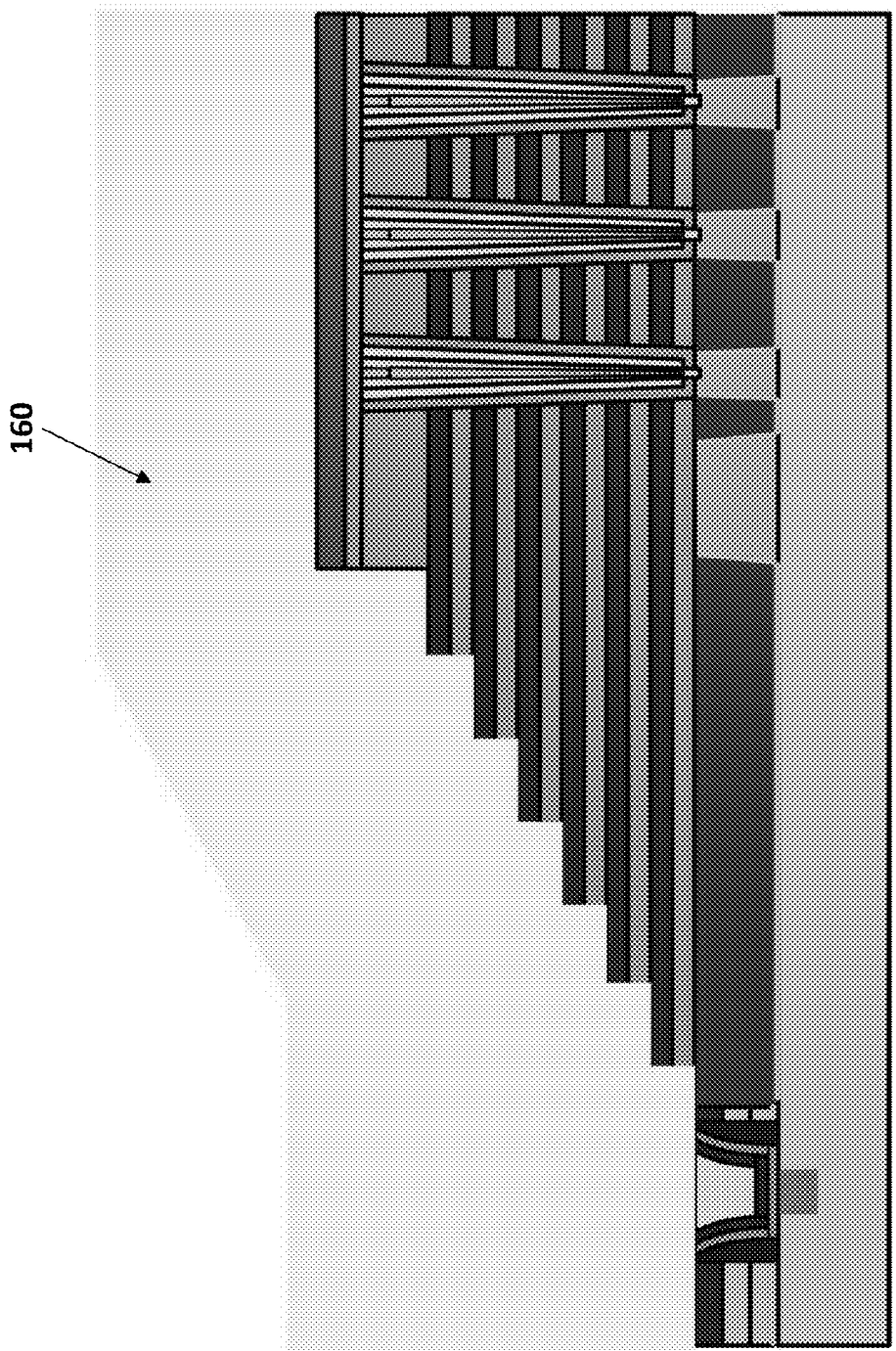
Figure 36:
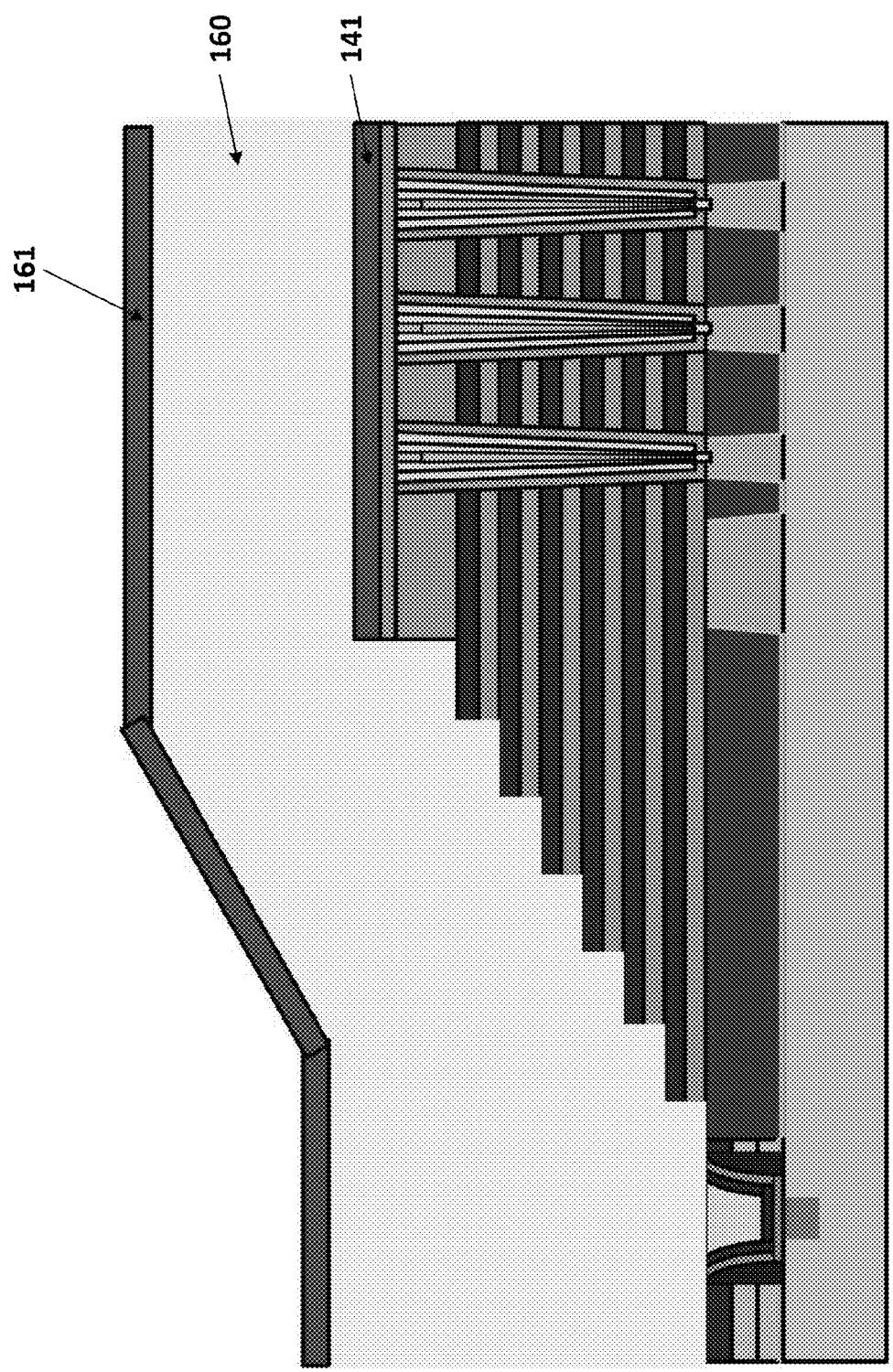
Figure 37:
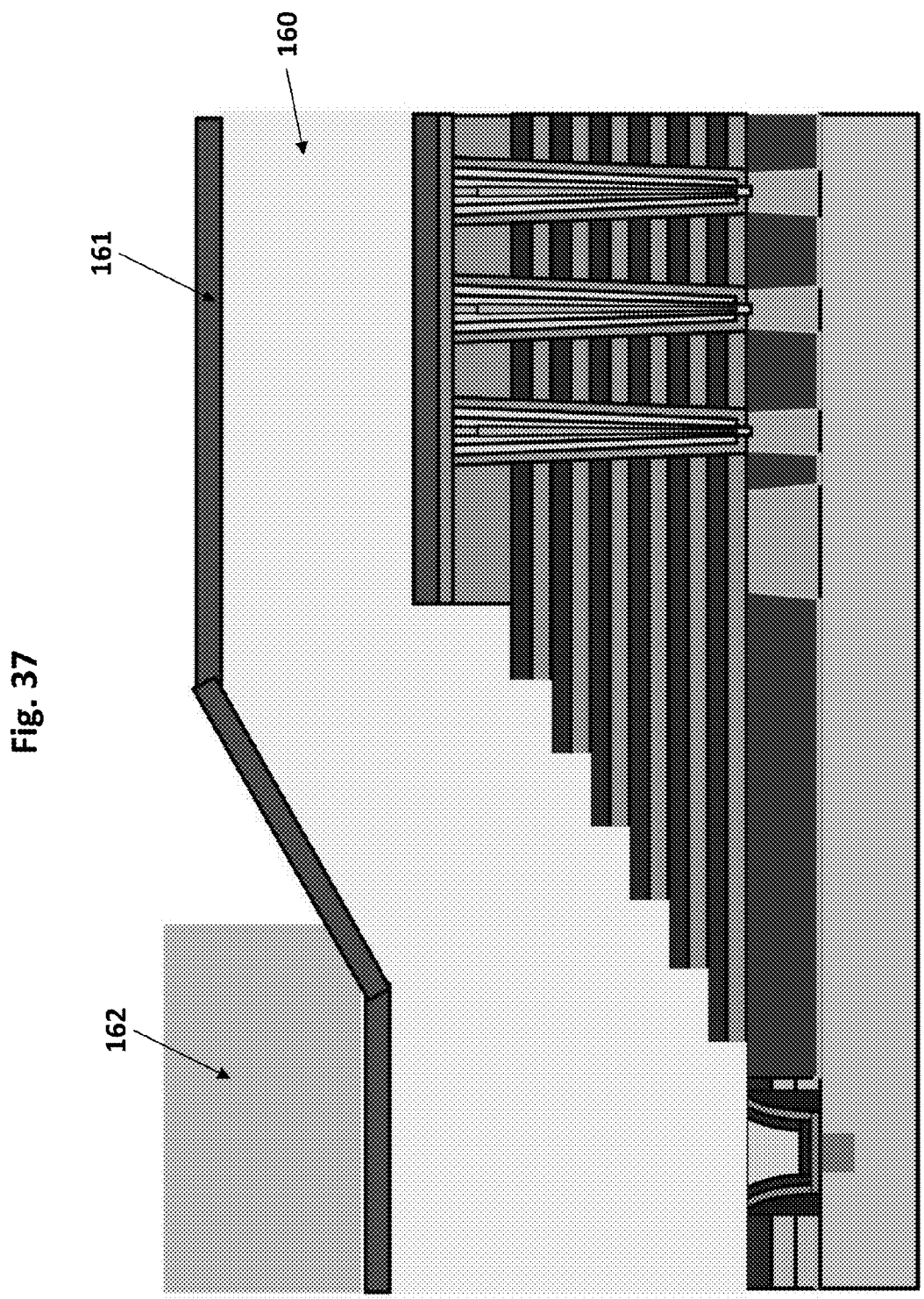

As shown in FIG. 35, a first insulating fill layer 160, such as a silicon oxide layer formed by CVD using a TEOS source is deposited over the device. Layer 160 has an uneven upper surface because the underlying layers in region 200 are taller than in regions 300 and 500. Then, a barrier layer 161, such as a silicon nitride layer, is formed over layer 160, as shown in FIG. 36. A mask 162 is then formed over layer 161 in region 500. If desired, mask 162 may also extend into the second portion of region 300 adjacent to region 500, as shown in FIG. 37.

Figure 38:
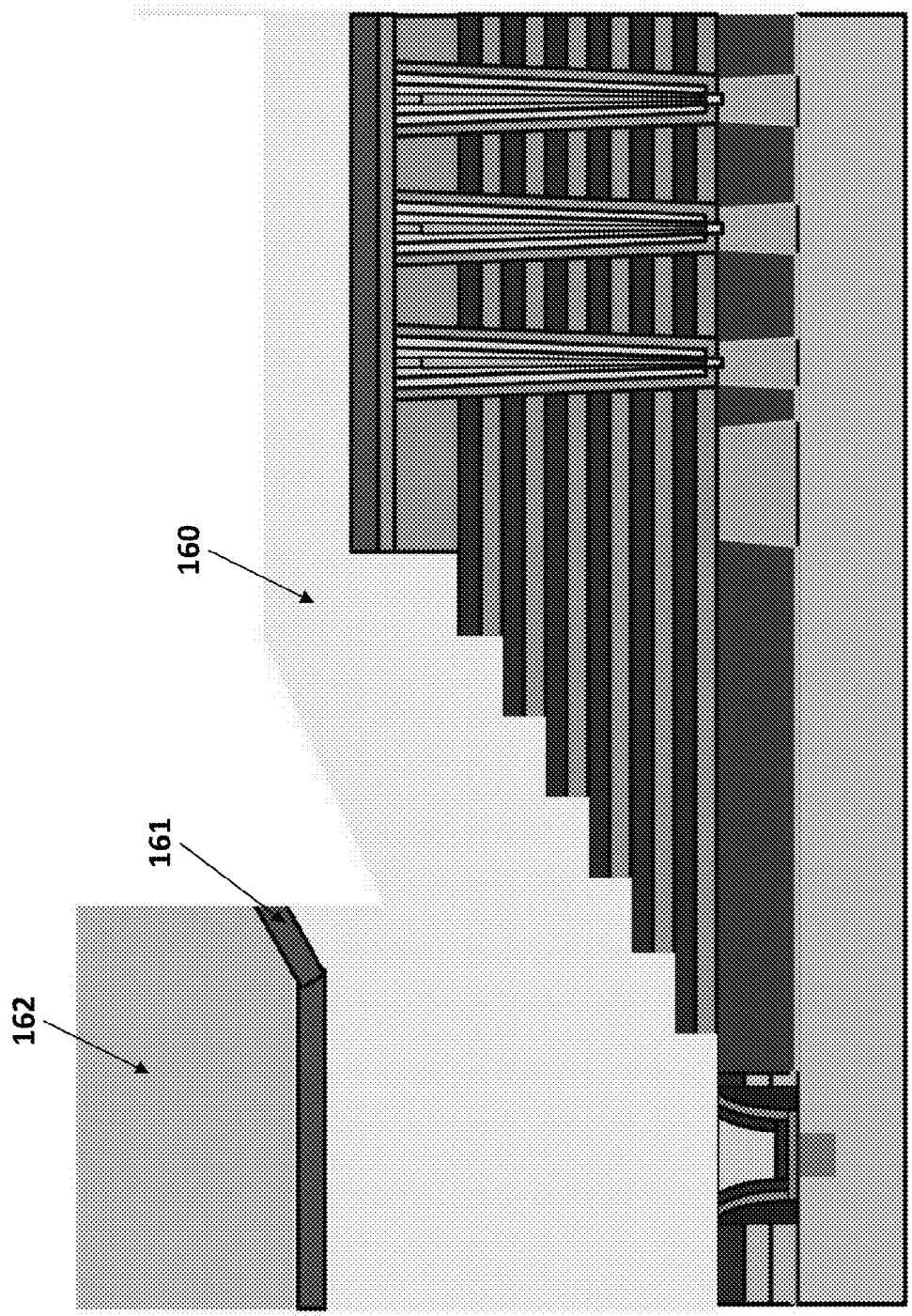
Figure 39:
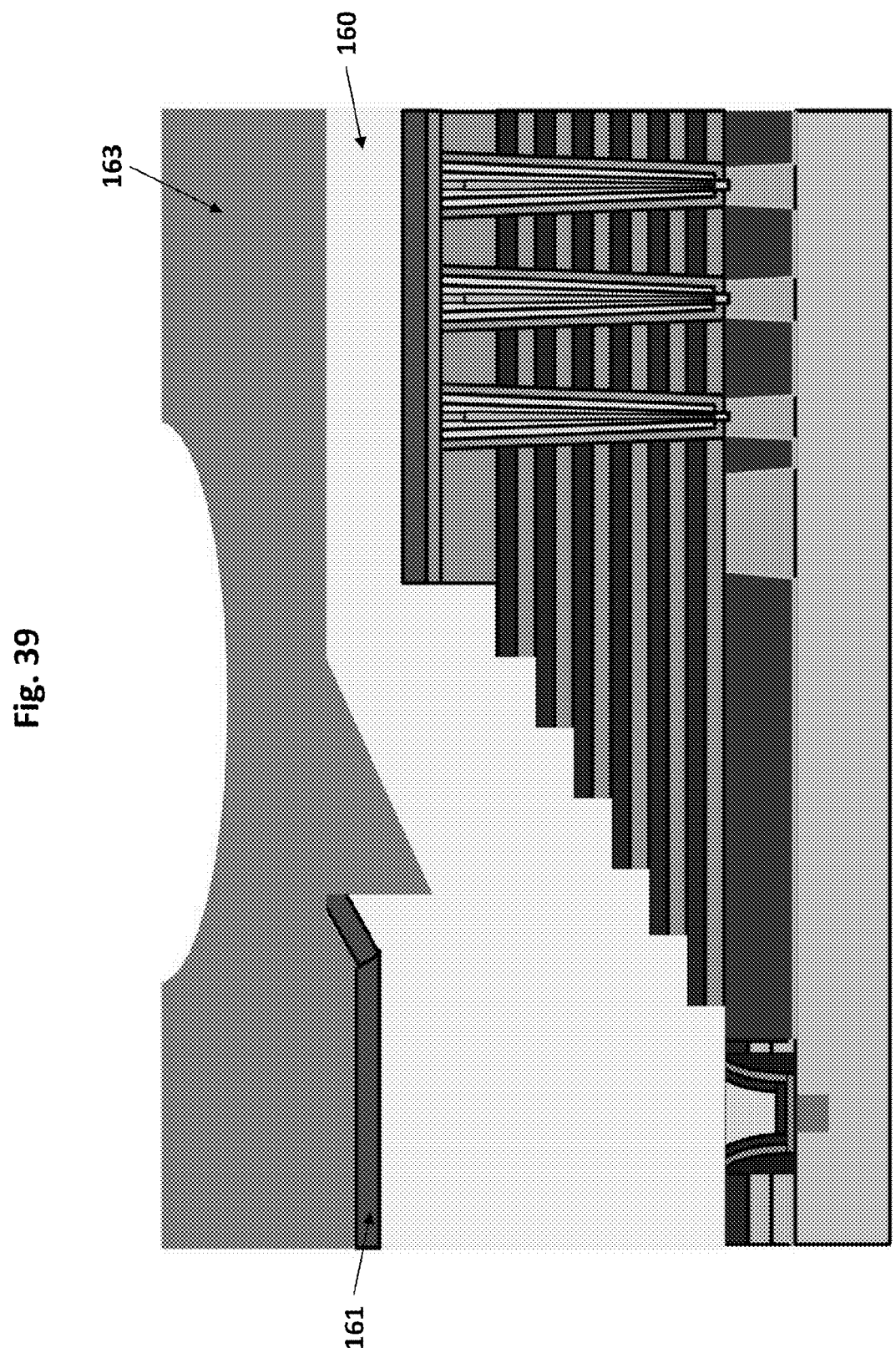

The exposed portions of layers 160 and 161 in regions 200 and 300 are then etched using RIE or another suitable method, as shown in FIG. 38. The entire exposed portion of layer 161 is removed, but only an upper exposed portion of layer 160 is removed, such that the lower portion of layer 160 remains over the underlying device layers. Mask 162 is then removed and another insulating layer 163 is formed over layer 161 in region 500 and over layer 160 in regions 300 and 200, as shown in FIG. 39. Layer 163 may be a silicon oxide layer formed by CVD using a TEOS source.

Figure 40:
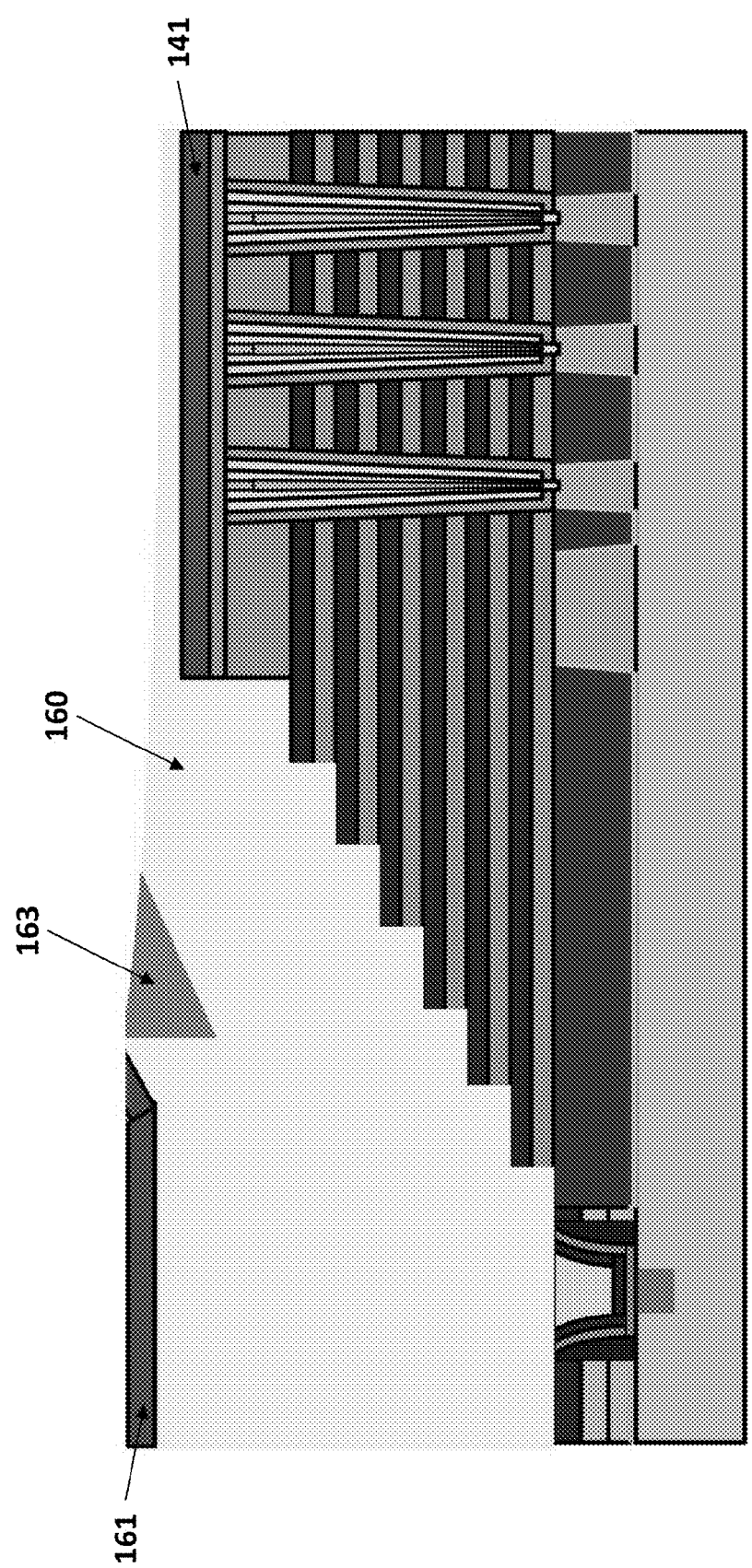
Figure 41:
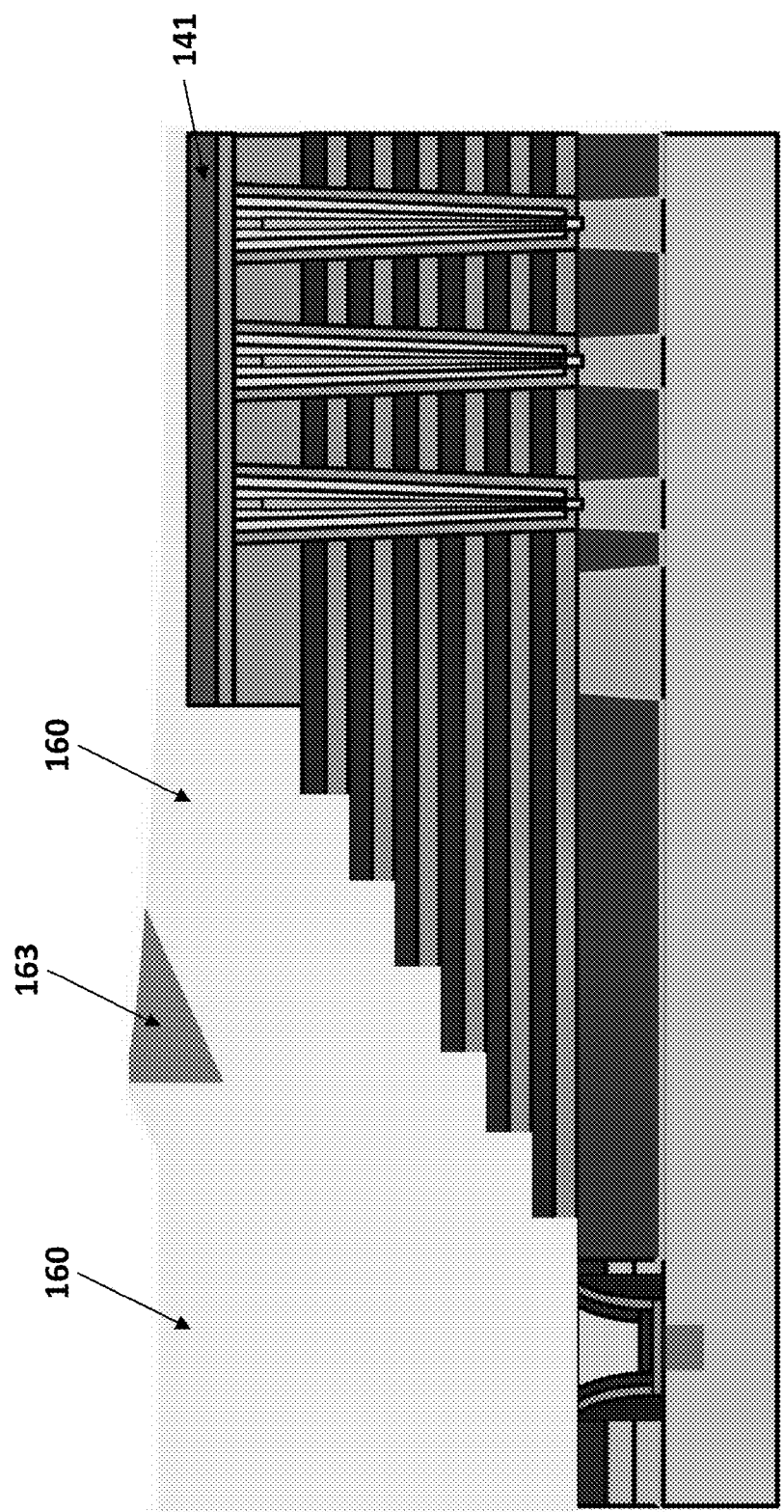

Layer 163 is then planarized by CMP as shown in FIG. 40. The CMP stops on the barrier layer 161 which remains in region 500 to prevent removal of layer 160 in region 500. Thus, layer 161 is used as a polish stop. Preferably, some silicon oxide layer 160 thickness remains in region 200 after the CMP step. Then, as shown in FIG. 41, the silicon nitride barrier layer (e.g., the polish stop layer) 161 is removed by selective wet etching. The remaining layer 160 protects the barrier layer 141 in region 200 from being removed.

Figure 42:
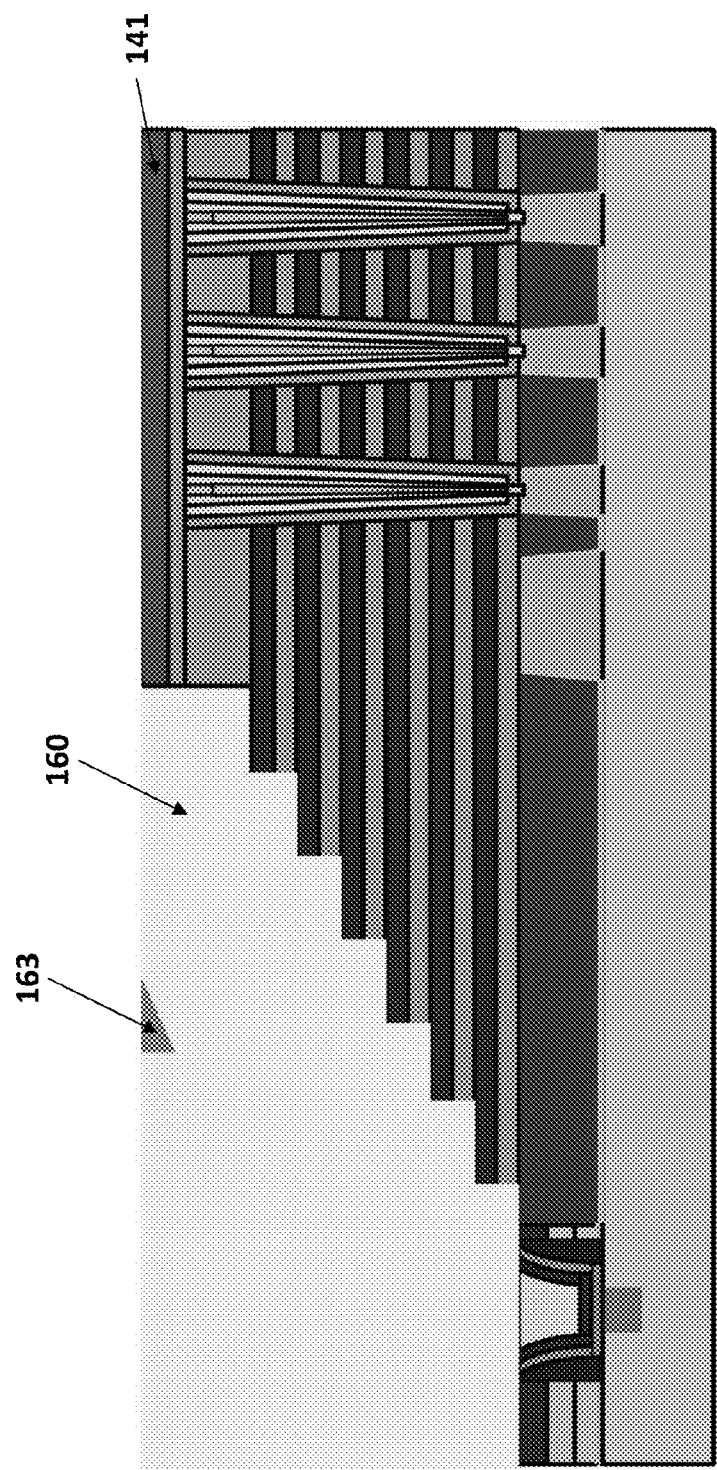
Figure 43:
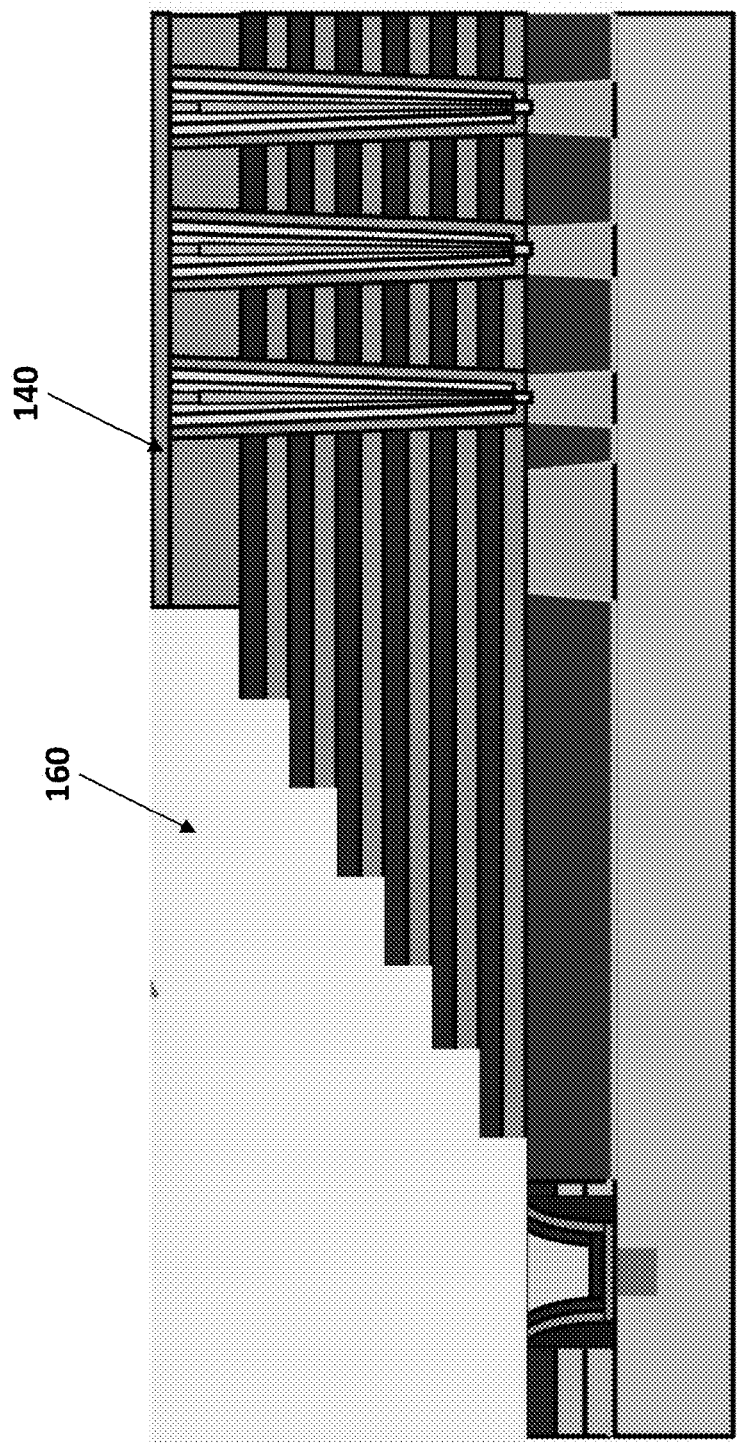

A second CMP step is then used to remove the remaining thickness of layer 160 in region 200 to expose the barrier layer 141 in region 200, as shown in FIG. 42. The barrier layer 141 in region 200 may is used as a polish stop in region 200. Layer 160 remains over regions 300 and 500 after the second CMP step. Finally, as shown in FIG. 43, the barrier layer 141 is removed by RIE. Likewise, any remaining portions of layer 163 are also removed during this step. This completes the formation of the planarized insulating fill 160 over regions 300 and 500.

Figure 44:
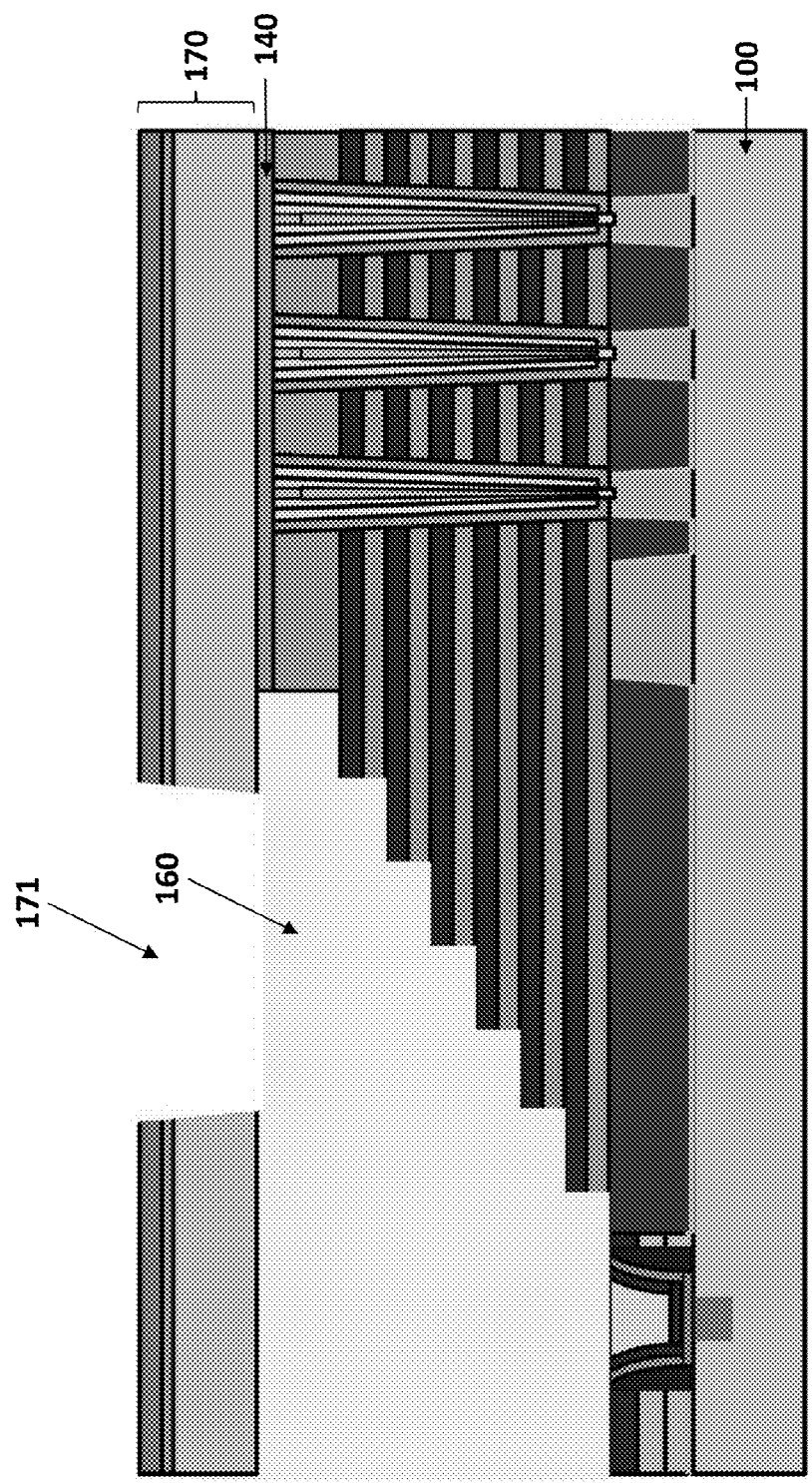
Figure 45A:
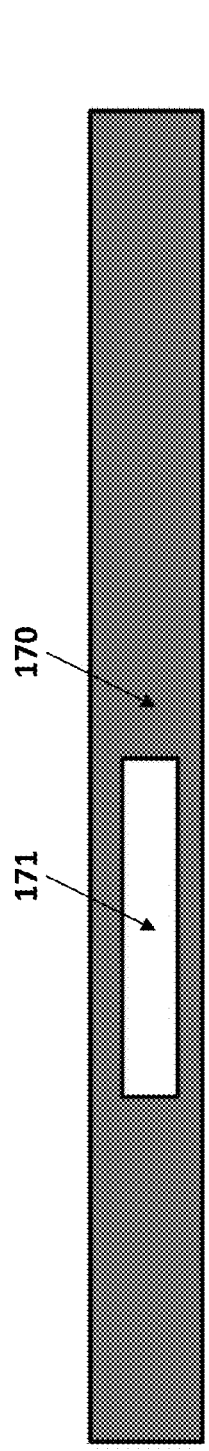
Figure 45B:
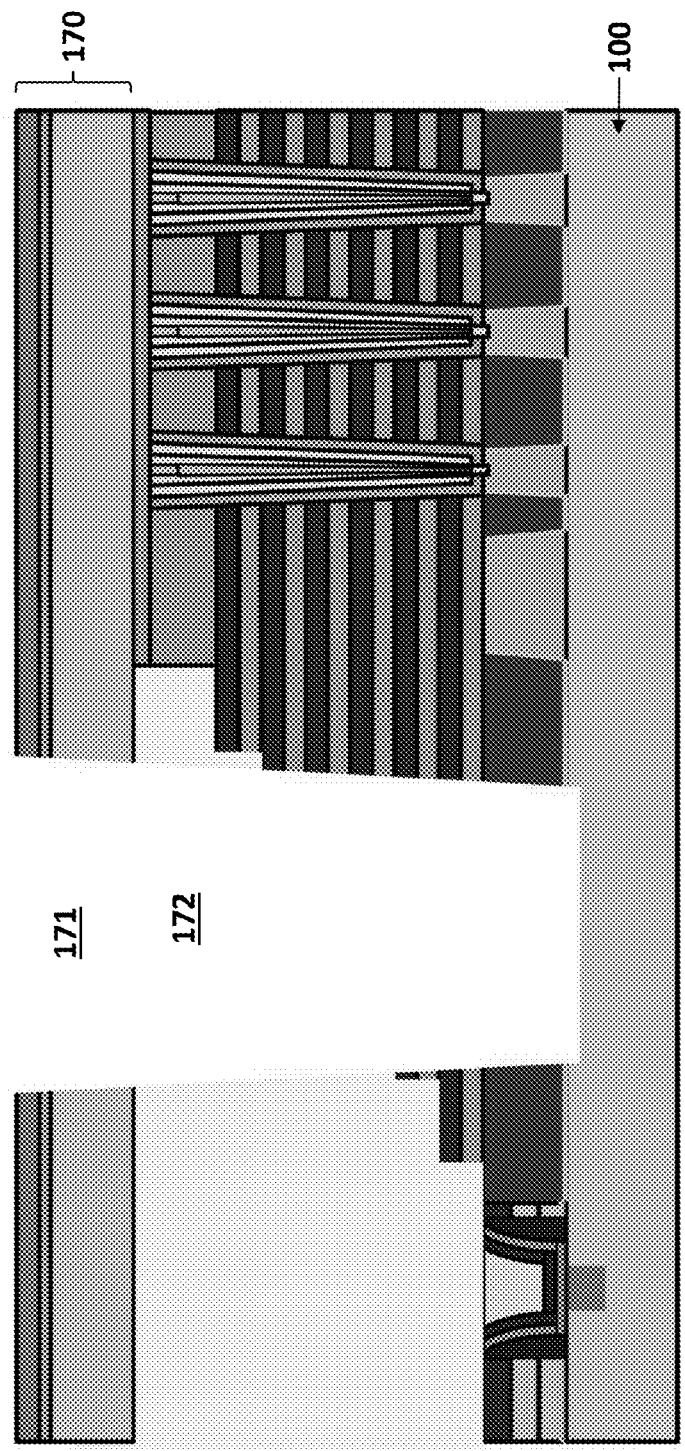
Figure 46:
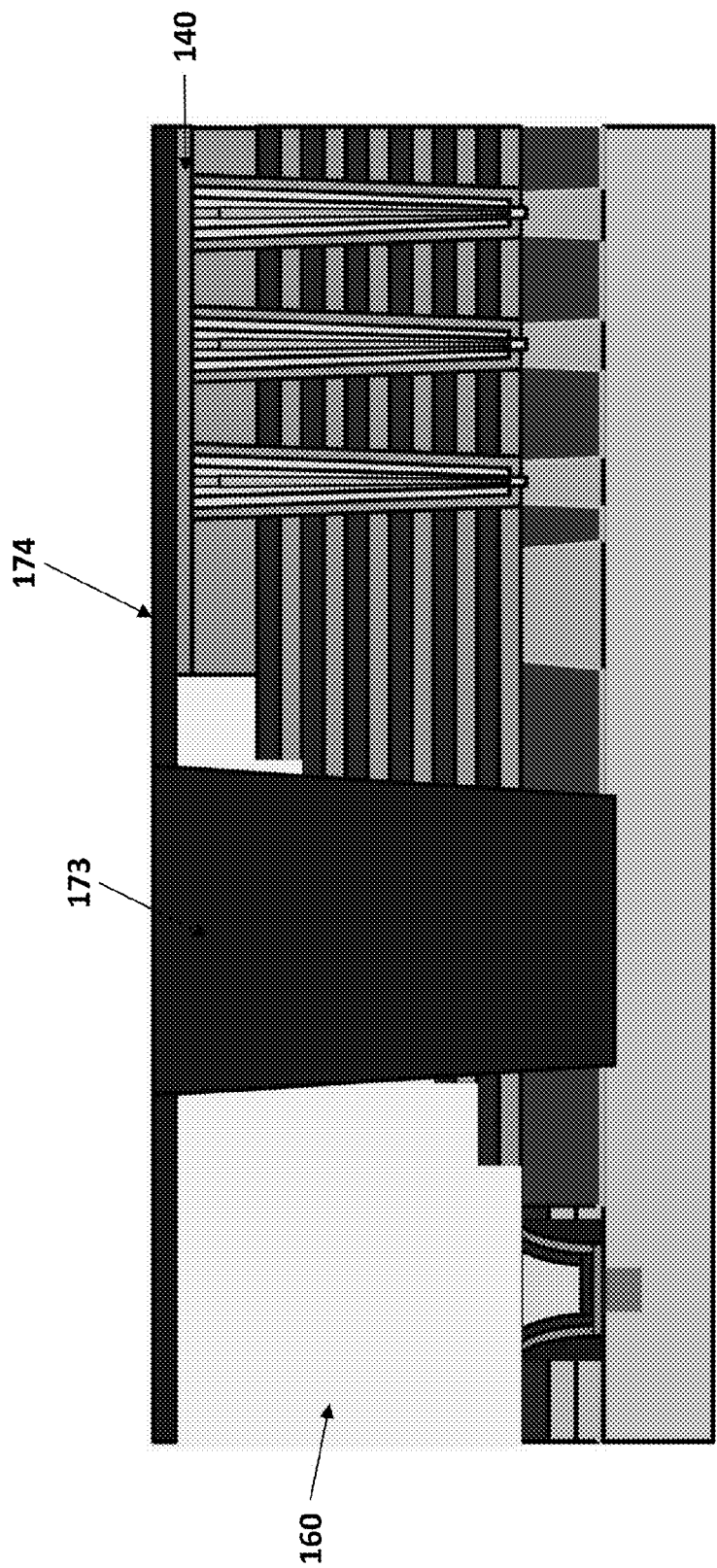

FIGS. 44-46 illustrate the formation of a support column which supports the stack layers after the sacrificial layer 121 are removed. FIGS. 44, 45B and 46 are side cross sectional views which have the same direction as the view in FIG. 43, but which are shifted into or out of the plane of the drawing in FIG. 43.

As shown in FIG. 44, a mask 170 is formed over the device and a column opening 171 is formed in the mask 170 to expose the insulating fill layer 160. FIG. 45A shows the top view of the mask 170 having the opening 171. As shown in FIG. 45B, a column opening 172 is etched through all of the layers in region 300 to the substrate 100 using RIE or another suitable method. Finally, as shown in FIG. 46, the insulating support column 173 is formed in the column opening 172. The column 173 may be formed by depositing an insulating layer 174, such as a silicon oxide layer into the opening 172 and over the remaining device layers followed by planarization, such as a CMP planarization. While only one column 173 is shown in the figures, more than one column may be formed at the same time.

Figure 47:
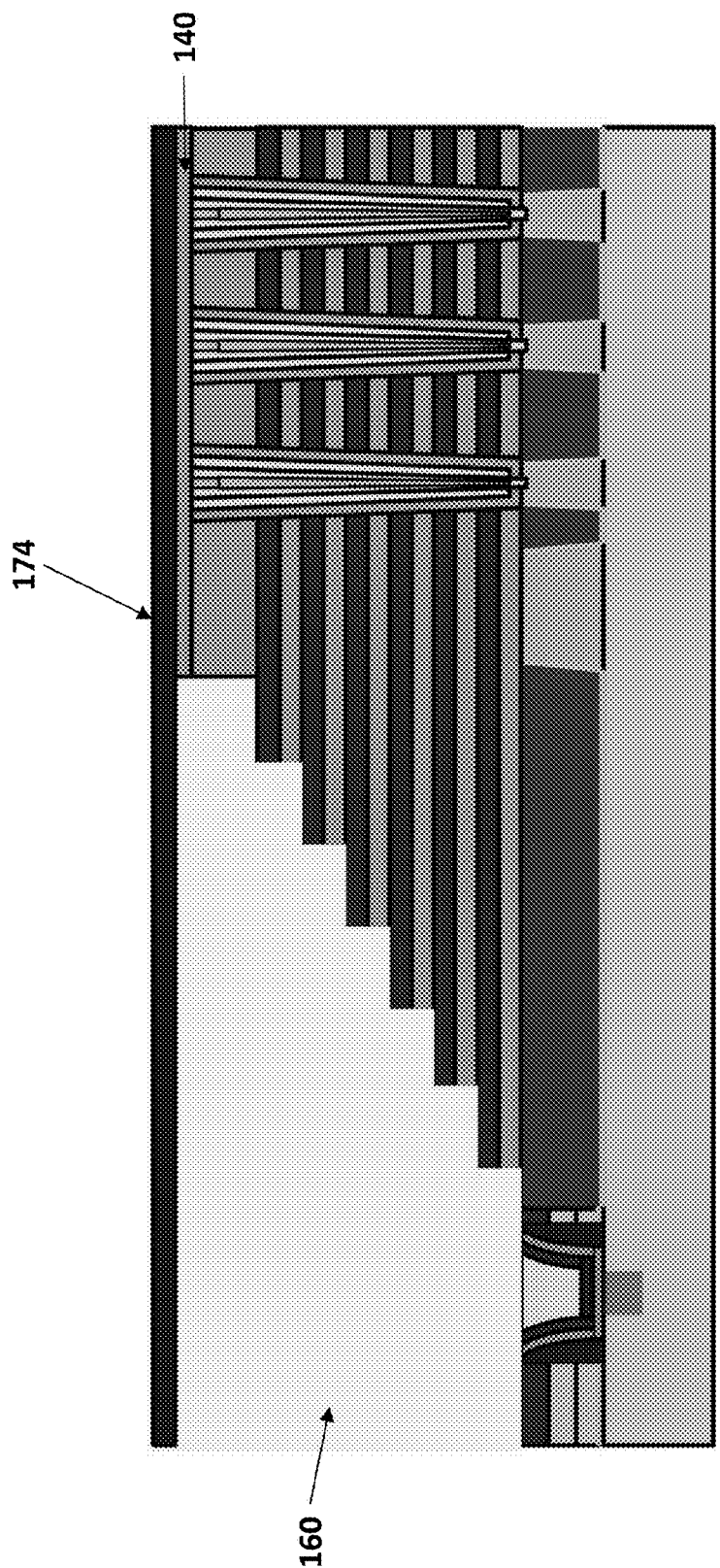

FIG. 47 shows the same cross sectional view as FIG. 43 after the formation of the column(s) 173 and layer 174. The view in FIG. 47 is in or out of the plane of the drawing in FIG. 46, such that the column 173 is not visible in FIG. 47.

FIGS. 48-59 illustrate a method of forming the trenches 84, the control gate electrodes 3 and the source electrodes (e.g., source lines) 102.

Figure 48:
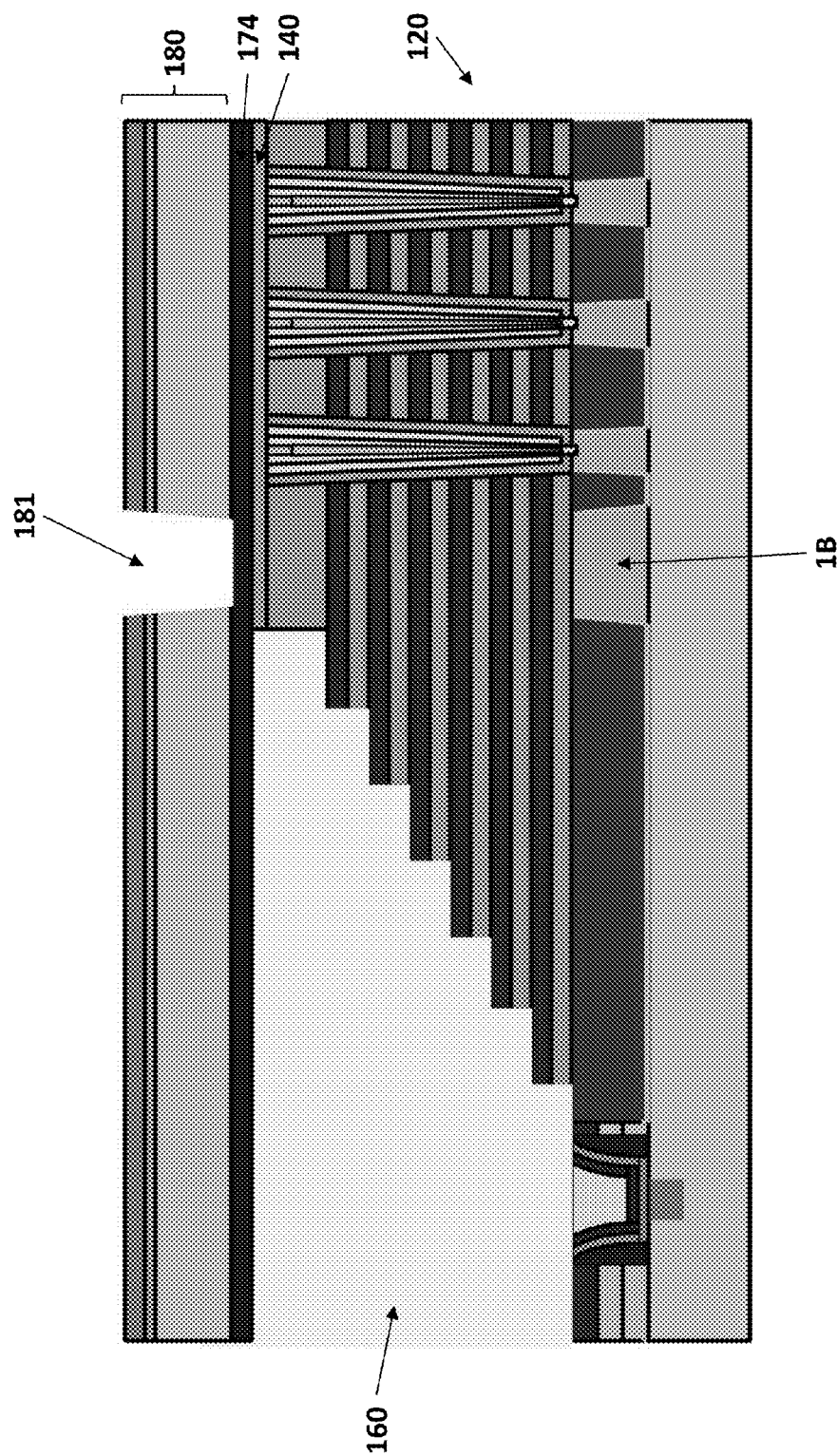

As shown in FIG. 48, a mask 180 is formed over layer 174. The mask 180 may be a photoresist and/or hard mask described above. At least one back side mask opening 181 is formed in the mask over the location of the first protrusion 1B. Preferably, a plurality of openings 181 are formed in the mask 180, which each opening 181 corresponding to the location of a respective one of the plurality of first protrusions 1B.

Figure 49:
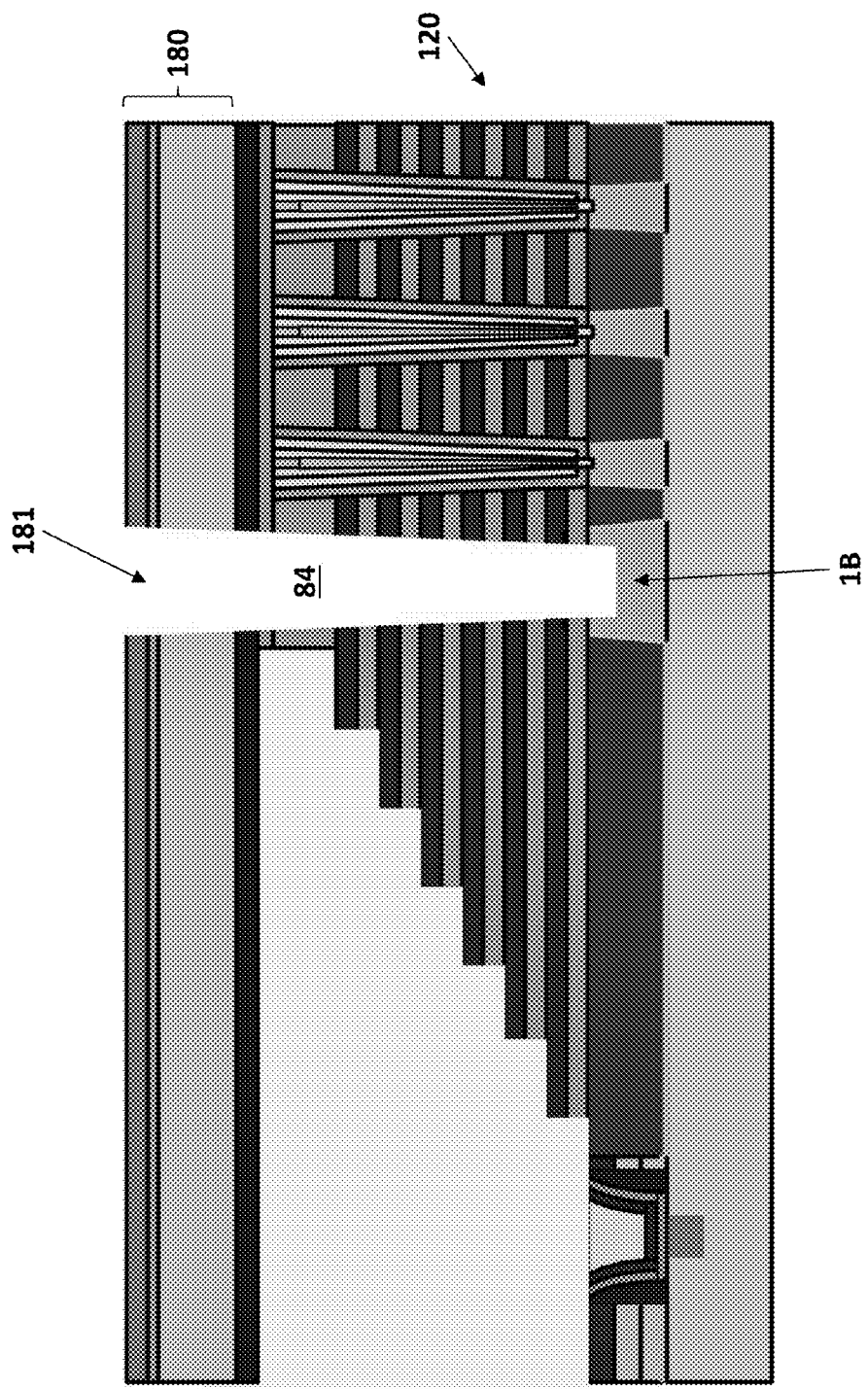
Figure 50:
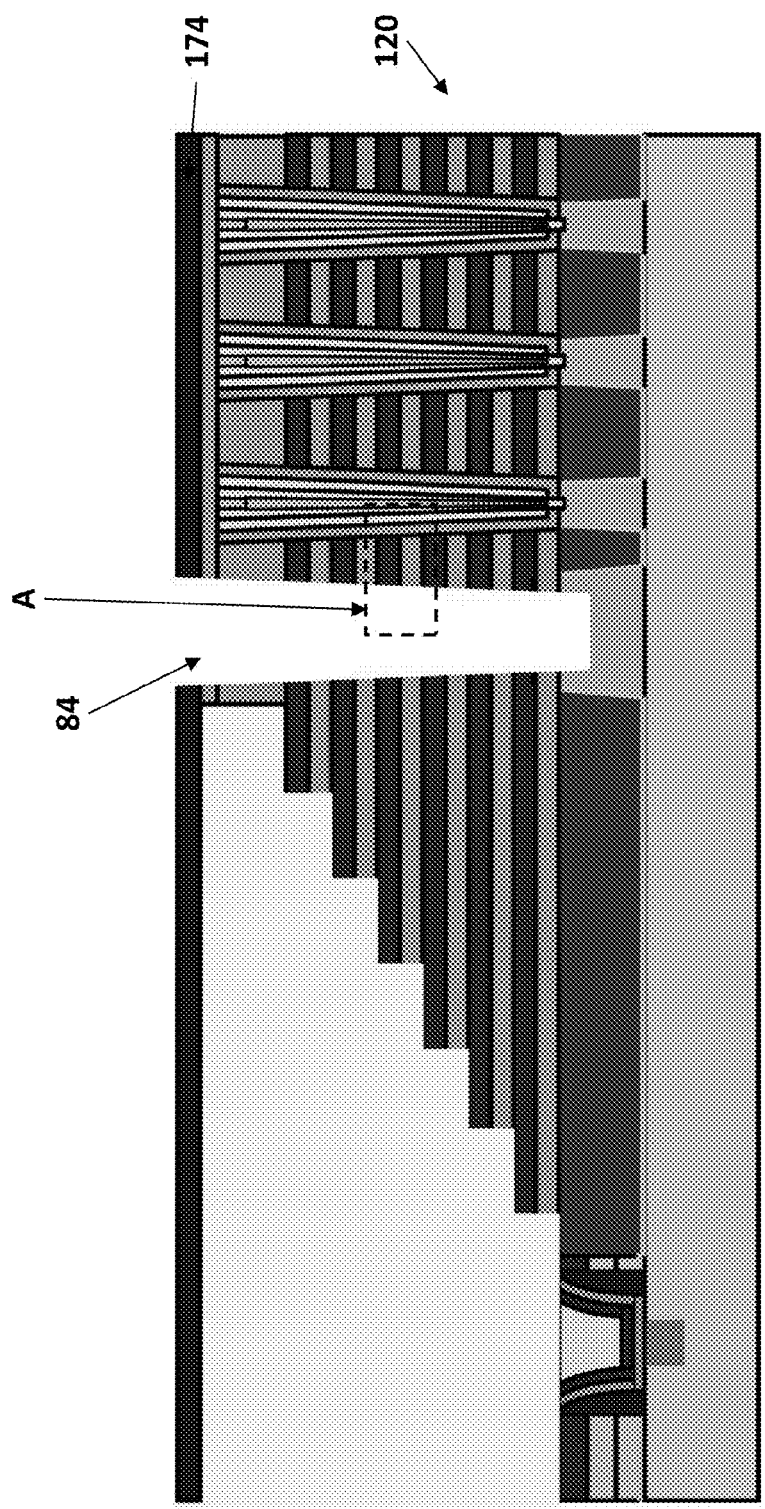

Then, as shown in FIG. 49, layers 174 and 140 and the stack 120 are etched through the openings 181 in the mask to form the back side openings (e.g., the trenches) 84 in the stack 120 extending to the first protrusions 1B. Preferably, the trenches 84 extend partially into the first protrusions 1B, as shown in FIG. 49. Thus, the step of forming the back side openings 84 forms back side trenches which exposes the second semiconductor protrusions 1B. The protrusions 1B have the rail shape and extend along the back side trenches 84 as described with respect to FIGS. 3D and 3E above. The mask 180 may then be removed, as shown in FIG. 50. Region "A" in FIG. 50 will be described in more detail with respect to FIG. 55A below.

Figure 51:
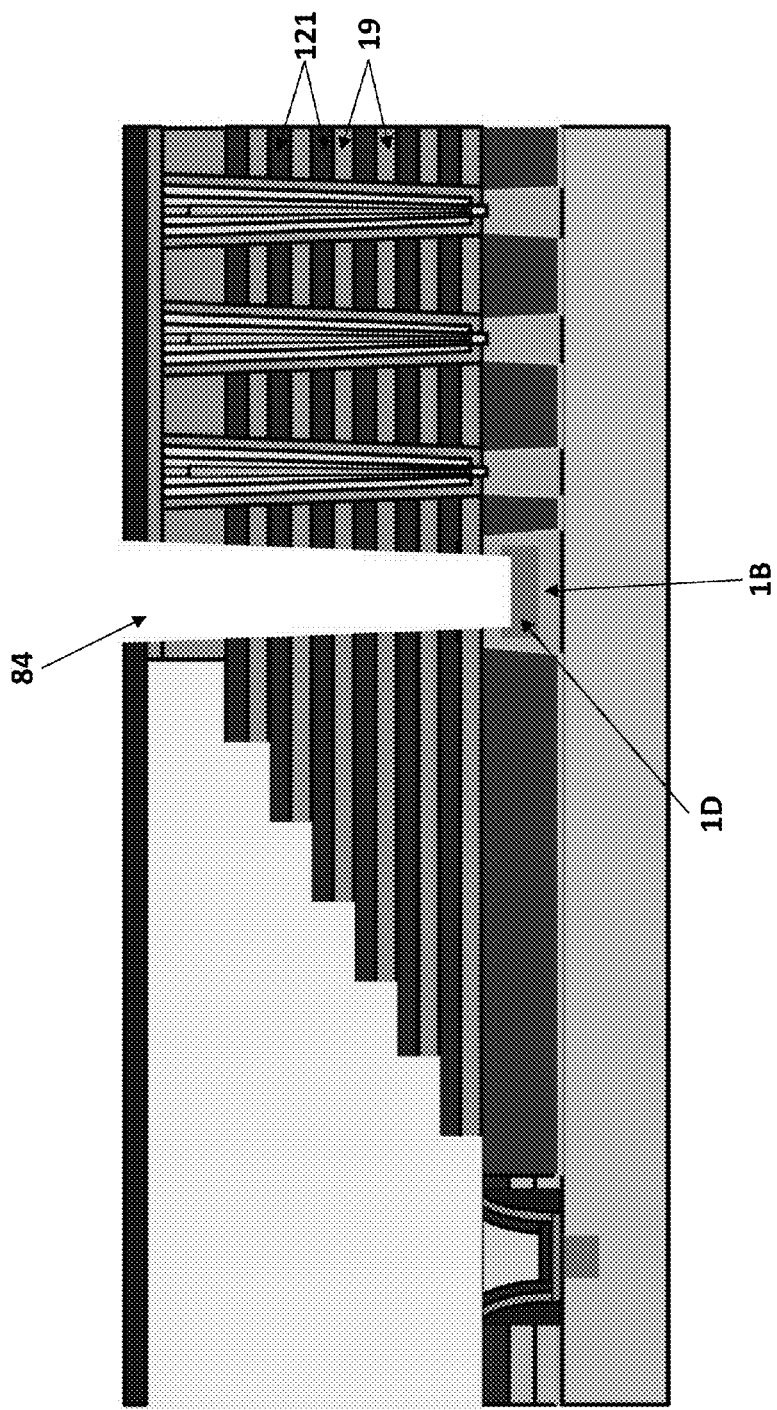

As shown in FIG. 51, a doped semiconductor region 1D is formed in the upper portion of the second semiconductor protrusion 1B through the back side trench 84. The doped region 1D may comprise a heavily doped source region formed by ion implantation. For example, region 1D may comprise an n-type doped region implanted into an undoped (e.g., intrinsic) or lightly doped protrusion 1B to make an ohmic contact with the subsequently formed source line 102.

Figure 52:
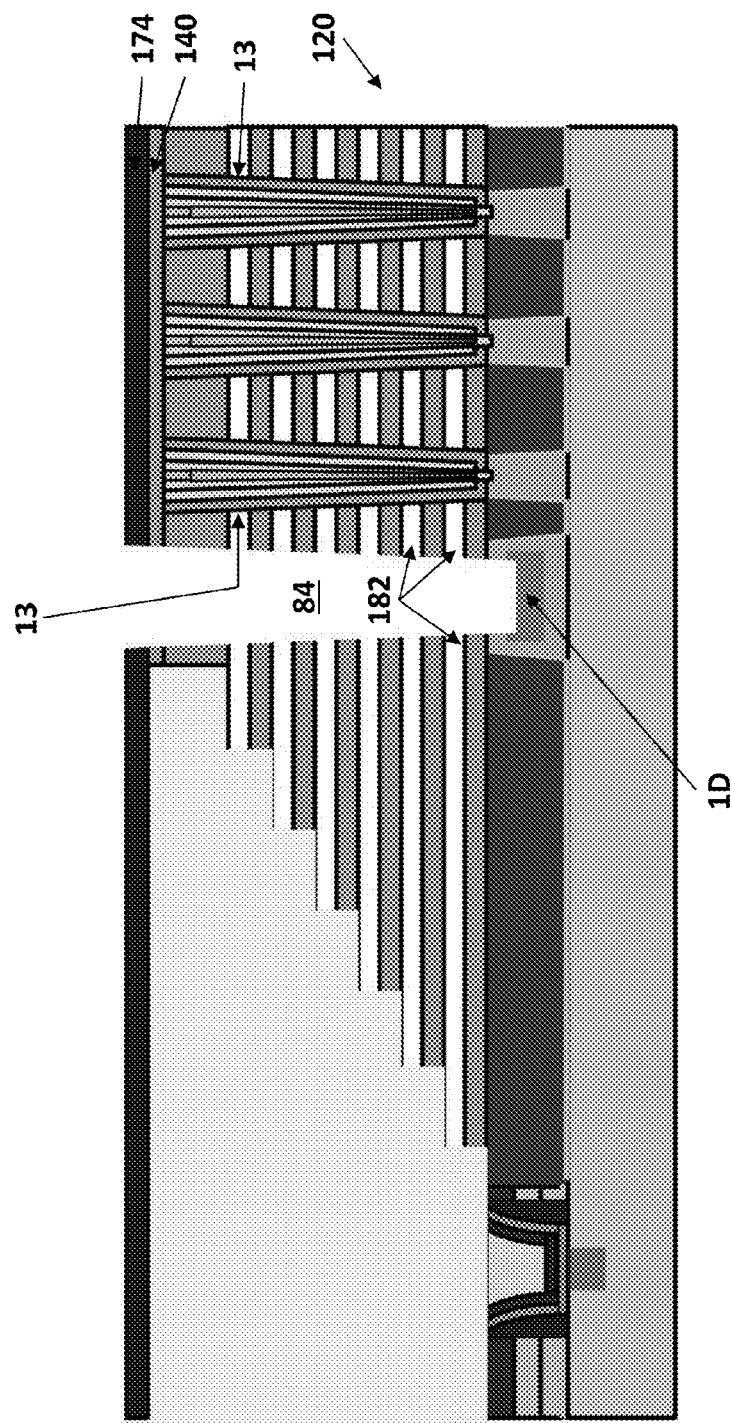

Then, at least a portion of the sacrificial second material layers 121 are removed through the back side openings 84 to form back side recesses 182 between the first material layers 19, as shown in FIG. 52. Layer 121 may be removed by selective etching, such as a silicon nitride selective etching which removes silicon nitride layers 121 but does not remove the silicon oxide layers 174, 149, 19 and 7 or the silicon regions (e.g., protrusion 1B). The selective etch may stop on the oxide blocking dielectric, such as a silicon oxide blocking dielectric 7 which forms the outer part of the memory film 13. The support column 173 described above supports the spaced apart layers 19 of the stack 120 and prevents layers 19 from collapsing on each other.

Figure 53:
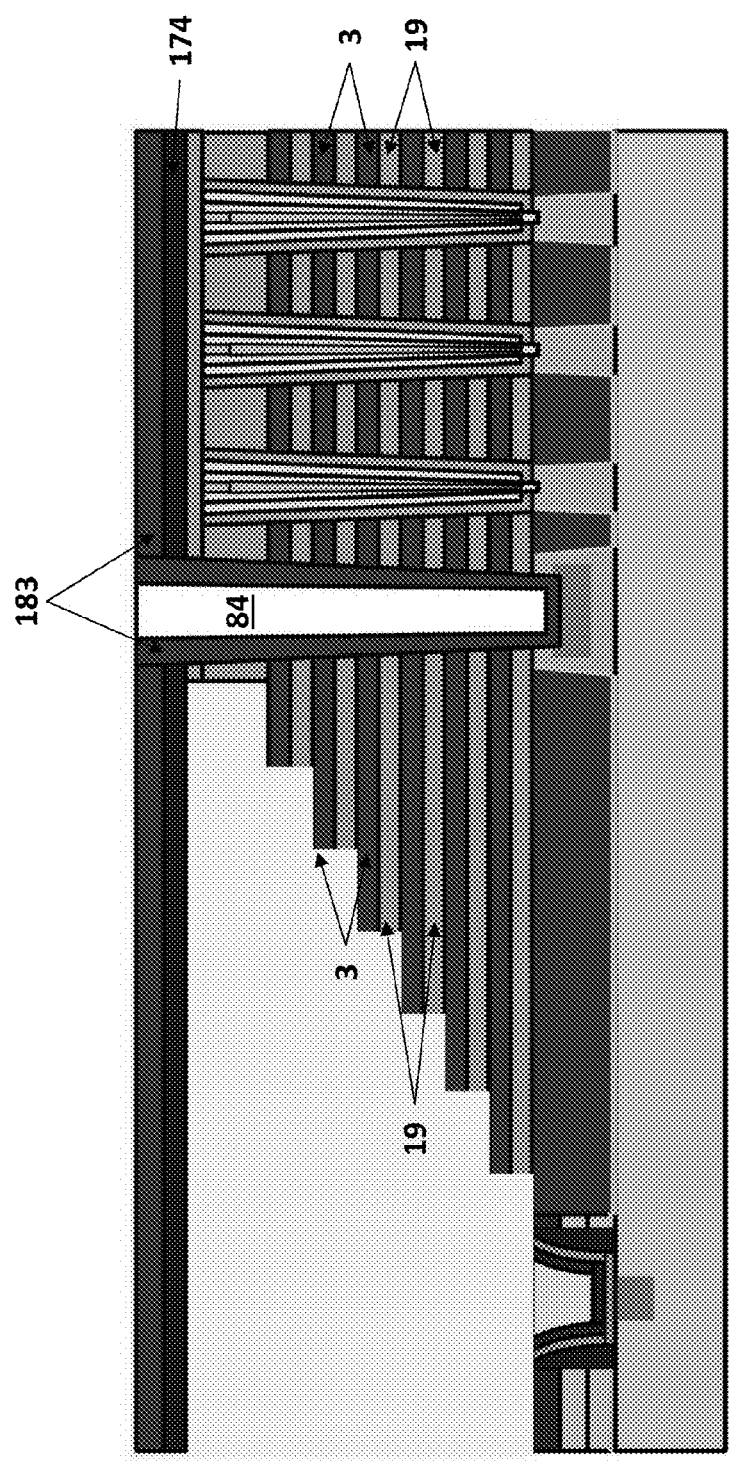
Figure 54:
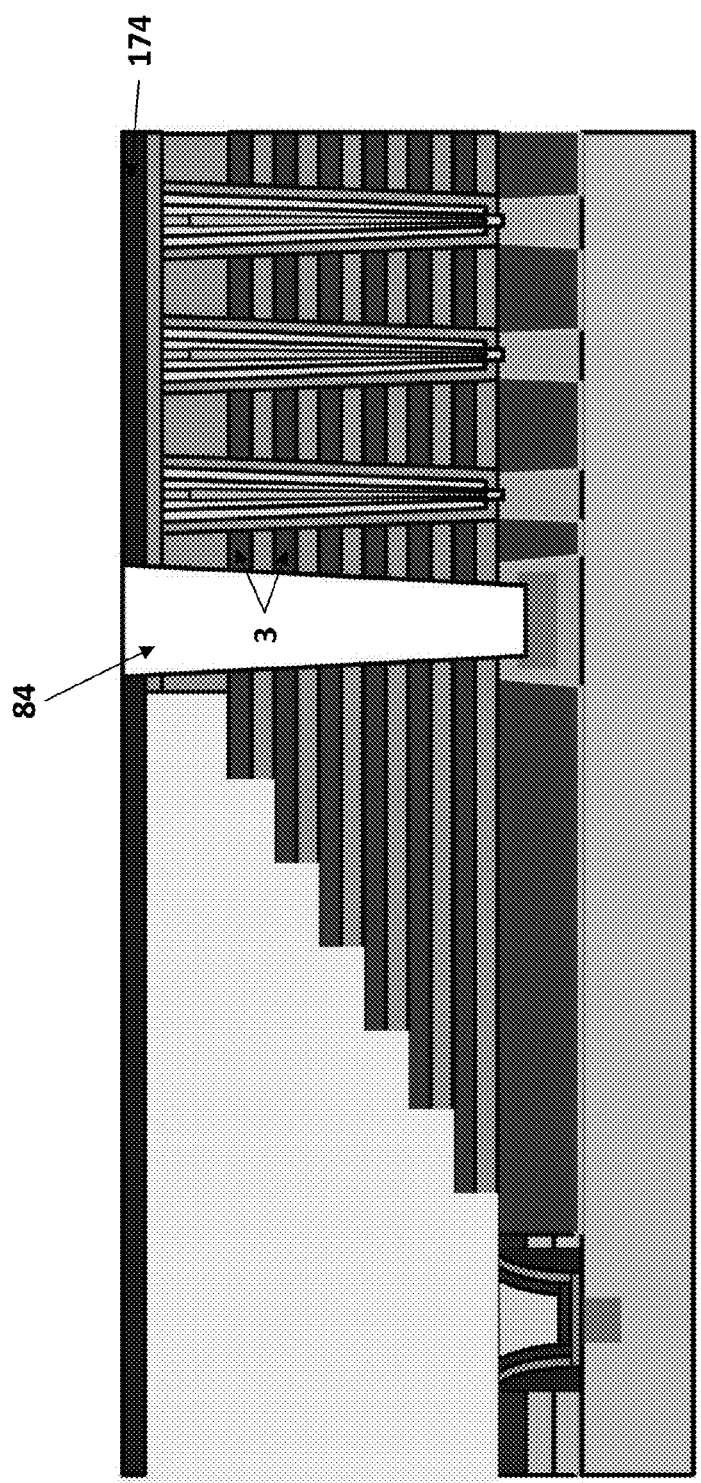

Metal or metal alloy control gate electrodes 3 are then formed in the back side recesses 182 through the back side openings 84, as shown in FIG. 53. A portion 183 of the metal or metal alloy control gate material partially or fully fills the back side openings (e.g., trenches) 84 and is located over layer 174. The control gate electrode 3 material may comprise any suitable materials described above with respect to FIGS. 2 and 3. For example, the material may comprise a TiN liner and tungsten gate material. Then, as shown in FIG. 54, the portion 183 of the metal or metal alloy control gate material is removed by anisotropic etching from the back side openings (e.g., trenches) 84 and from over layer 174 without removing the control gate electrodes 3 to complete the formation of the control gate electrodes 3.

Figure 55A:
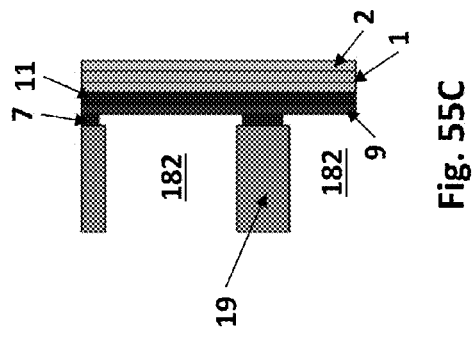
Figure 55B:
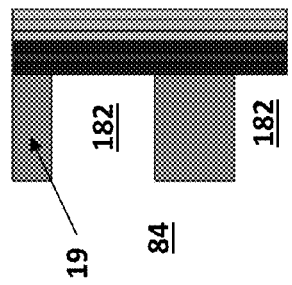
Figure 55C:
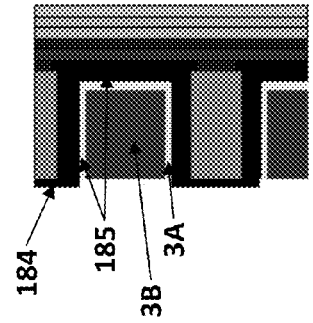

FIGS. 55A-55F illustrate an alternative control gate electrode 3 and blocking dielectric formation method. FIG. 55A shows a portion of the stack 120 shown in area A in FIG. 50. The stack 120 portion shown in FIG. 55A includes layers 19 and 121, a portion of the trench 84 and the memory hole 81 filled with a silicon oxide blocking dielectric layer 7, silicon nitride charge storage layer 9, silicon oxide tunnel dielectric layer 11, channel 1 and silicon oxide insulating fill material 2, in the radially inward direction. Then, as shown in FIG. 55B, the sacrificial silicon nitride layers 121 are selectively removed by a selective wet etch, similar to the step shown in FIG. 52 to form the recesses 182 exposing the silicon oxide blocking dielectric layer 7. The silicon oxide blocking dielectric layer 7 exposed in the recesses 182 is then removed by a timed selective wet silicon oxide etch, as shown in FIG. 55C. The selective etch also removes a portion of the silicon oxide layers 19 to widen the height of the recesses 182. However, since layers 19 are thicker than layer 7, portions of layers 19 remain after portions of layer 7 exposed in the recesses 182 are removed by the timed etch. The selective etch stops on the silicon nitride charge storage layer 9.

Figure 55D:
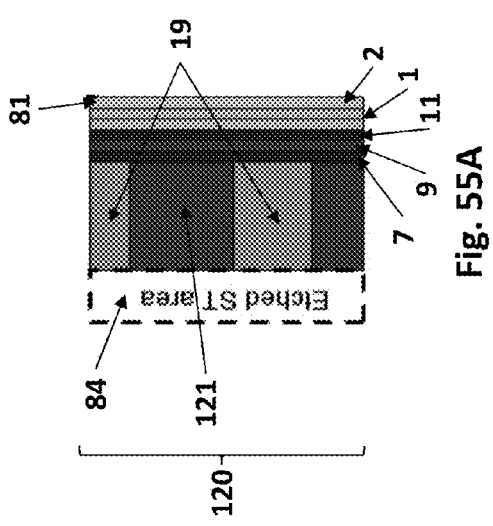

Then, as shown in FIG. 55D, an additional metal oxide blocking dielectric layer 184 is formed in the back side recesses 182 in contact with the charge storage layer 9 through the back side opening 84. The blocking dielectric layer 184 may be any suitable metal oxide layer or layers, such as aluminum oxide, hafnium oxide, etc.

Layer 184 contains a plurality of clam shape regions 185, with one region 185 in each respective recess 182. As used herein a "clam" shape is a side cross sectional shape configured similar to an English letter "C". A clam shape has two segments which extend substantially parallel to each other and to the major surface 100*a* of the substrate 100. The two segments are connected to each other by a third segment which extends substantially perpendicular to the first two segments and the surface 100*a*. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

Figure 55E:
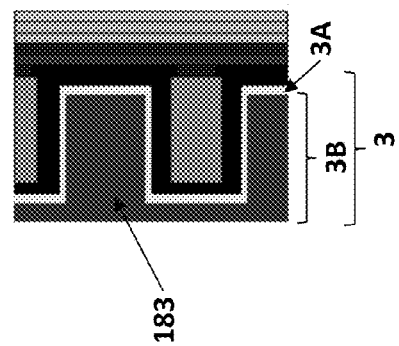
Figure 55F:
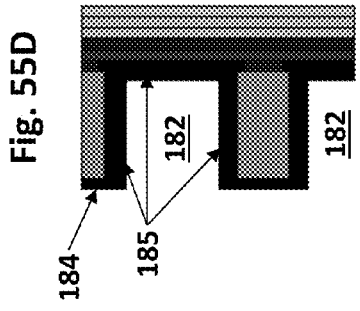

The control gate electrodes 3 are then formed over the additional metal oxide blocking dielectric 184 in the back side recesses 182 through the back side openings 84, as shown in FIG. 55E. The step of forming the control gates comprises forming a titanium nitride liner layer 3A in the back side recesses 182, forming a tungsten layer 3B over the titanium nitride liner layer 3A to fill the back side recesses and at least a portion of the back side trench 84, followed by recessing (e.g., removing) the portion 183 of the tungsten layer 3B from the back side trench 84, as shown in FIG. 55F (similar to the step shown in FIG. 54). Each clam shaped region 185 surrounds a respective one of the plurality of control gate electrodes 3, as shown in FIG. 55F.

Figure 56:
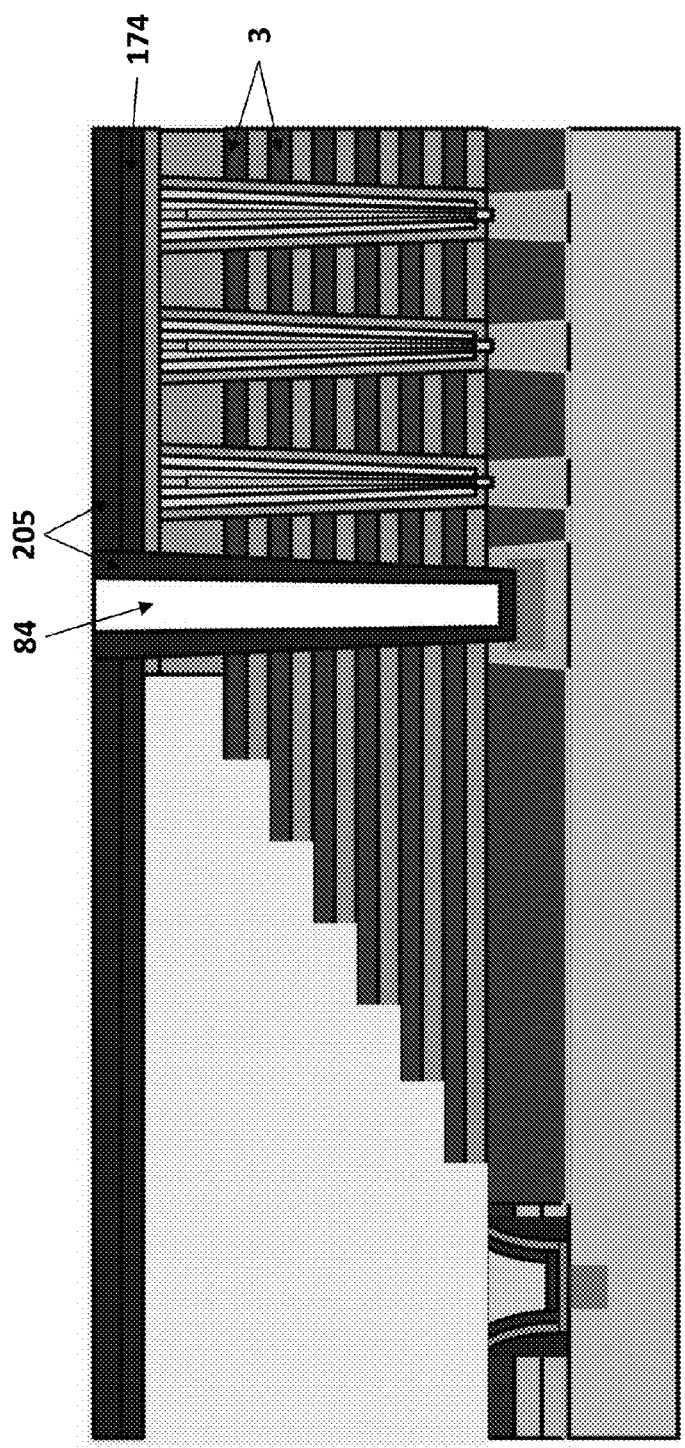
Figure 57:
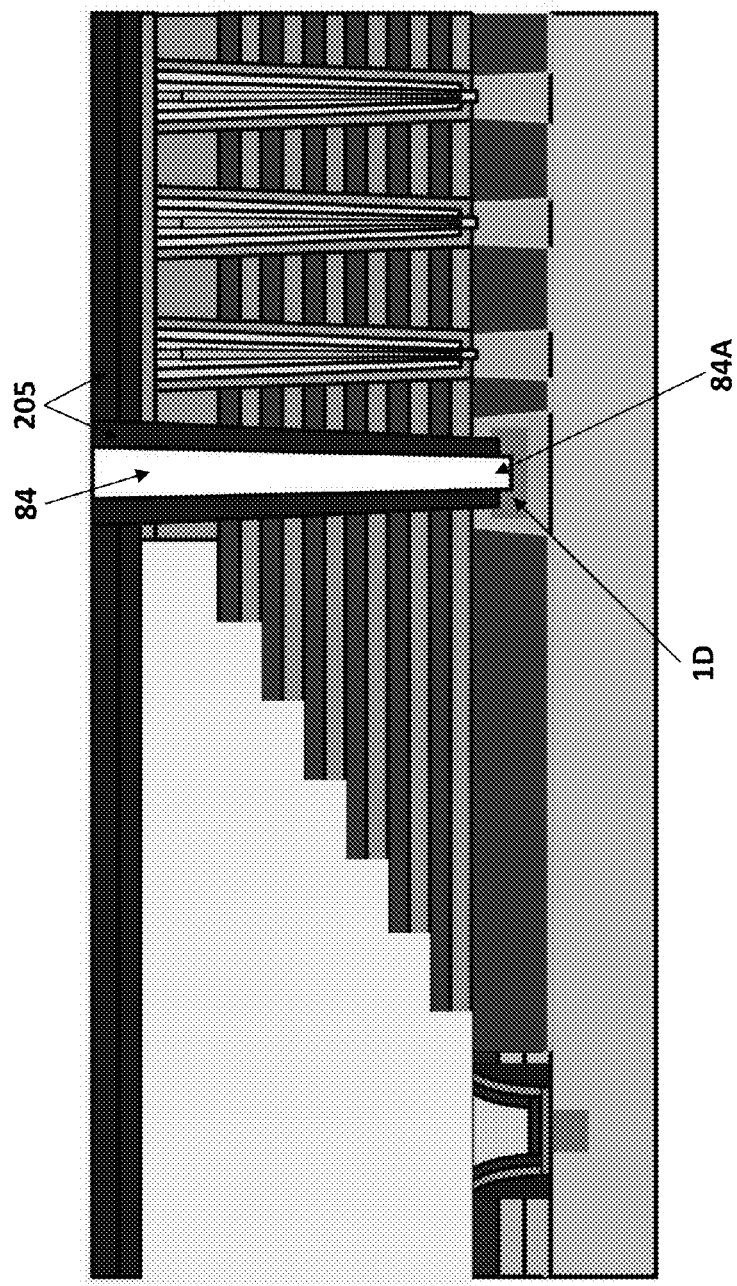

After the step of recessing the tungsten layer 3B shown in either FIG. 54 or FIG. 55F, the insulating layer 205, such as a silicon oxide layer, is formed on sidewalls and bottom of the back side trenches 84, as shown in FIG. 56. Layer 205 is also formed over layer 174. The insulating layer 205 is then removed from the bottom 84*a* of the back side trench 84 by anisotropic etching (e.g., by RIE spacer etch) without removing the insulating layer from the sidewalls of the trench 84, as shown in FIG. 57. This etching step exposes the doped region 1D located in the first semiconductor protrusion 1B through the bottom 84*a* of the trench 84.

Figure 58:
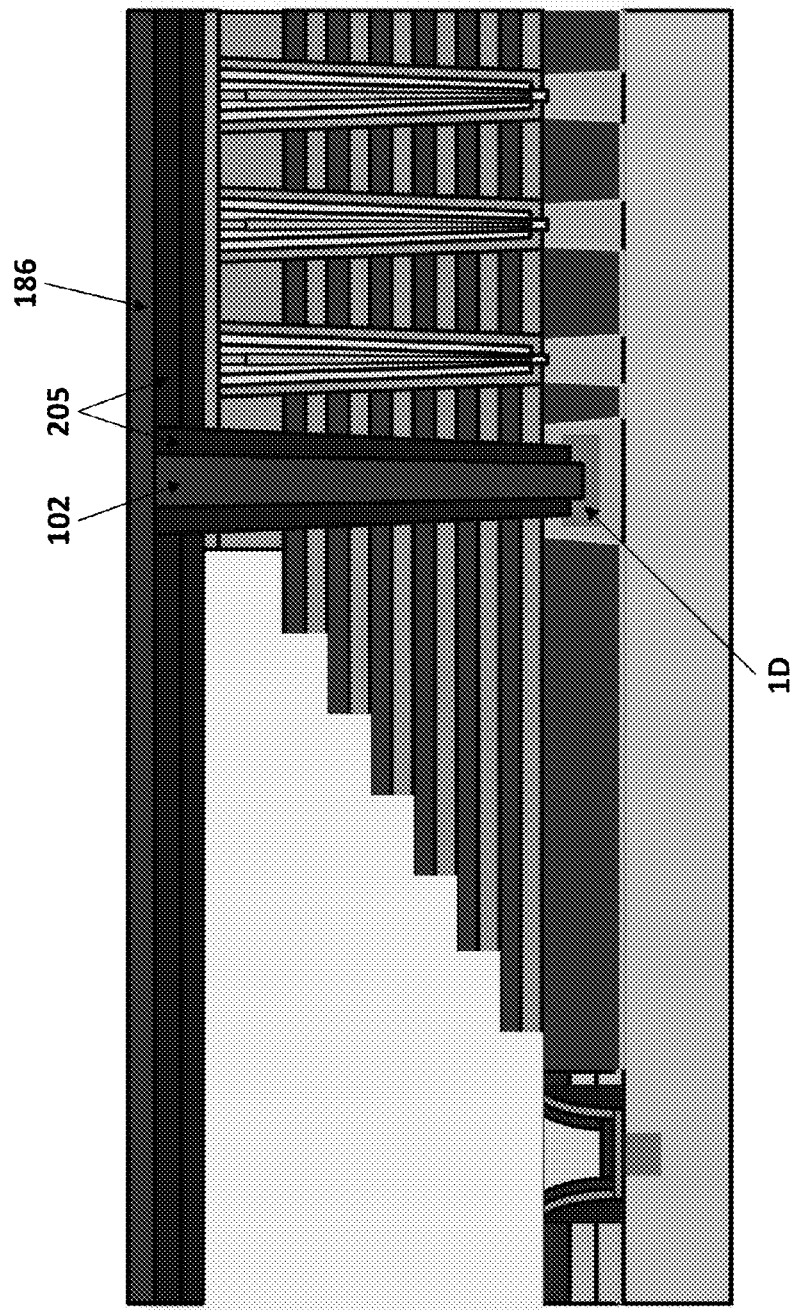
Figure 59:
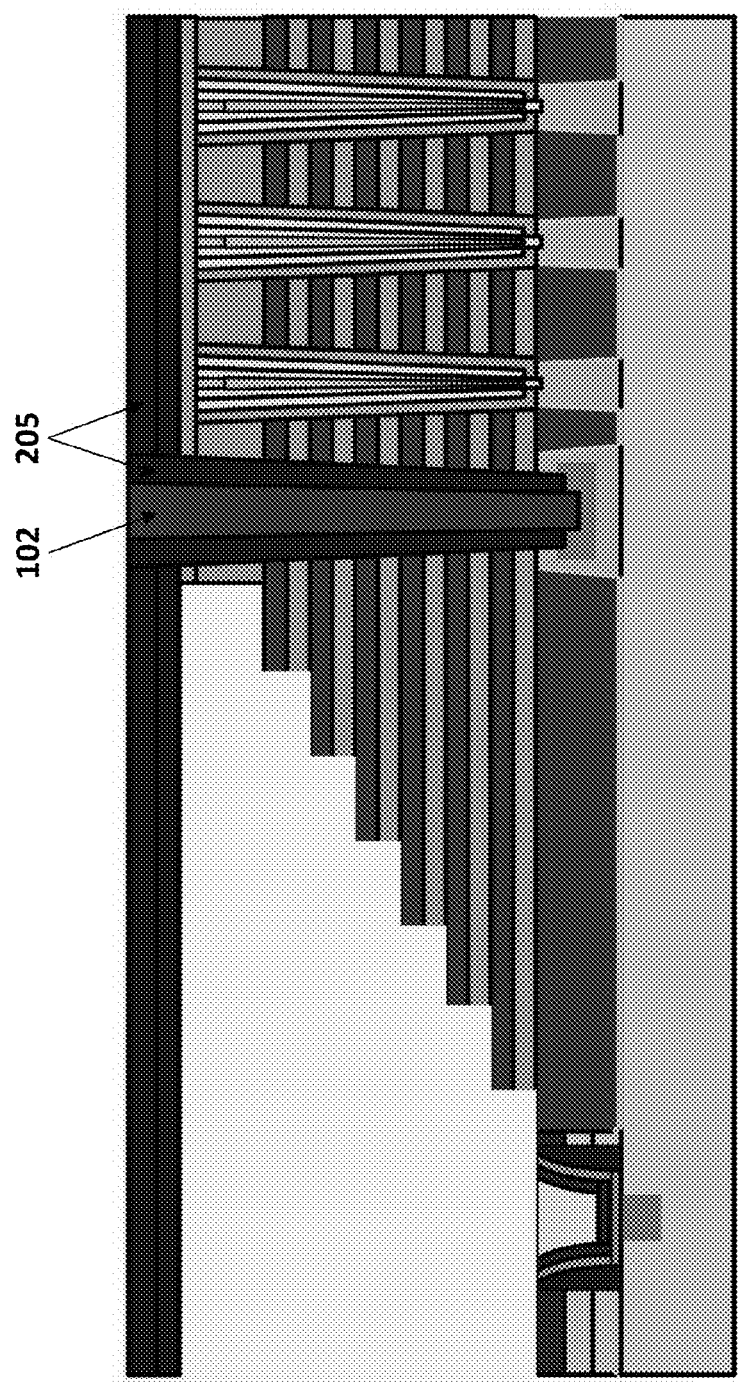

The source line 102 is then formed in the back side trench 84 in contact with the doped semiconductor region 1D in the first semiconductor protrusion 1B, as shown in FIG. 58. The source line 102 may be formed by depositing any suitable metal or metal alloy layers, such as TiN and tungsten over layer 205 in the trenches 84. A portion 186 of the source line material located over the device is removed by CMP or etching to leave the source line 102 in the dielectrically insulated trenches 84, as shown in FIG. 59.

Finally, as shown in FIG. 60, the device is completed by forming the drain side select transistor in the upper device level 60 located over the stack 120 in memory device level 70 and various electrodes. The electrodes include the drain electrodes (e.g., drain contact line) 103 connecting the drain lines 203 to the upper portions 1E of the semiconductor channels 1, the word line contacts 303 located in contact with the word lines/end portions of the control gate electrodes 3 in region 300, source side select gate 204 contact 304 and peripheral device contacts 513A, 513B in contact with the regions 503, 506 (e.g., gate and source/drain regions) of peripheral devices 501 in region 500.

While formation of a portion of one memory block 400 is shown in FIGS. 6 to 60, it should be understood that the same method may be used to form one or more than one memory blocks 400 shown in FIGS. 4, 5A and 5B. The method to form the rest of the memory block 400 includes forming a plurality of additional second protrusions 1C, forming an additional first protrusion 1B, forming a second back side 84 trench over the additional first protrusion, forming a second source line 102 in the second back side trench in contact with the additional first protrusion, and forming at least one row of front side memory openings 81, such as an least a 4×4 array of front side memory openings, between the first back side trench and the second back side trench. The method also includes forming a blocking dielectric 7 in each of the memory openings 81, forming a charge storage region 9 over the blocking dielectric in each of the memory openings, and forming a blocking dielectric 11 over the charge storage region in each of the memory openings. The method also includes removing the blocking dielectric, the charge storage region and the tunnel dielectric from the bottom of each of the memory openings 81, forming a semiconductor layer 1E in each of the memory openings in contact with a respective one of the plurality of additional second semiconductor protrusions, and forming a plurality of drain lines 103 over the memory openings in contact with the semiconductor layer 1E.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A select gate transistor for a NAND device, comprising:
   a select gate electrode having a first side, a second side, a top and a bottom;
   a semiconductor channel located adjacent to the first side, the second side and the bottom of the select gate electrode; and
   a gate insulating layer located between the channel and the first side, the second side and the bottom of the select gate electrode;
   wherein:
   a first portion of the semiconductor channel comprises a single crystal silicon portion of a single crystal silicon substrate or layer extending parallel to a major surface of the substrate under the select gate electrode;
   a second portion of the semiconductor channel comprises a second semiconductor protrusion which extends perpendicular to the major surface of a substrate;
   the substrate comprises a single crystal silicon substrate; and
   the second semiconductor protrusion comprises an epitaxial single crystal silicon pillar.

2. The transistor of claim 1, wherein the first side of the select gate electrode is located opposite to the second side of the select gate electrode.

3. The transistor of claim 2, wherein the select gate electrode comprises a metal or metal alloy select gate electrode.

4. The transistor of claim 3, wherein the select gate electrode comprises a titanium nitride liner peripheral portion contacting the gate insulating layer, and a tungsten central portion contacting the titanium nitride liner peripheral portion.

5. The transistor of claim 2, wherein:
a first portion of the gate insulating layer contacts the first side of the select gate electrode, a second portion of the gate insulating layer contacts the second side of the select gate electrode, and a third portion of the gate insulating layer contacts the bottom of the select gate electrode; and
a third portion of the semiconductor channel contacts the first portion of the gate insulating layer, the second portion of the semiconductor channel contacts the second portion of the gate insulating layer, and the first portion of the semiconductor channel contacts the third portion of the gate insulating layer.

6. The transistor of claim 5, wherein:
the third portion of the semiconductor channel comprises a first semiconductor protrusion which extends perpendicular to a major surface of a substrate.

7. The transistor of claim 6, wherein:
the first semiconductor protrusion comprises an epitaxial silicon rail having straight or tapered sidewalls; and
the first portion of the semiconductor channel comprises an upper portion of the substrate which connects the first semiconductor protrusion to the second semiconductor protrusion.

8. The transistor of claim 7, wherein:
the select gate transistor comprises a source side select gate transistor; and
the first semiconductor protrusion comprises a doped region which contacts a source line.

9. A monolithic three dimensional NAND string, comprising:
the source side select gate transistor of claim 8;
a NAND memory cell region comprising:
the semiconductor channel, wherein the semiconductor channel extends perpendicular to the major surface of the substrate, and wherein a bottom portion of the semiconductor channel contacts the second semiconductor protrusion;
at least one memory film located adjacent to the semiconductor channel; and
a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level;
a drain side select transistor located over the NAND memory cell region; and
a drain line which electrically contacts an upper portion of the semiconductor channel.

10. The monolithic three dimensional NAND string of claim 9, wherein the at least one memory film comprises a blocking dielectric, a charge trapping layer or floating gate, and a tunnel dielectric, and the memory film is located between the semiconductor channel and the plurality of control gate electrodes.

11. The monolithic three dimensional NAND string of claim 10, wherein:
the tunnel dielectric comprises a silicon oxide layer which extends perpendicular to the major surface of the substrate;
the charge trapping layer comprises a silicon nitride layer which perpendicular to the major surface of the substrate and which contacts the tunnel dielectric; and
the blocking dielectric comprises a first silicon oxide layer which extends perpendicular to the major surface of the substrate and which contacts the charge trapping layer, and a second metal oxide layer which has a plurality of clam shape regions, each of which surrounds a respective one of the plurality of control gate electrodes.

12. A memory block, comprising:
an array comprising at least one row of monolithic three dimensional NAND strings of claim 9;
a first dielectric filled trench located on a first side of the array; and
a second dielectric filled trench located on a second side of the array opposite to the first side of the array.

13. The memory block of claim 12, wherein:
the at least one row of monolithic three dimensional NAND strings comprises at least a 4×4 array of monolithic three dimensional NAND strings of claim 9;
the source line is located in the first dielectric filled trench;
a second source line is located in the second dielectric filled trench;
a plurality of drain lines are located over the array;
the first control gate electrode is continuous in the array;
the second control gate electrode is continuous in the array;
the select gate electrode is continuous in the array; and
all of the monolithic three dimensional NAND strings in the array are configured to be erased together in the same erase step.

14. A semiconductor structure, comprising:
a semiconductor substrate comprising a first semiconductor material and having a major surface;
a semiconductor channel including a first semiconductor protrusion comprising a second semiconductor material and directly contacting, and protruding above, the major surface of the semiconductor substrate, a plurality of second semiconductor protrusions and comprising the second semiconductor material and directly contacting, and protruding above, the major surface of the semiconductor substrate and laterally offset from the first semiconductor protrusion, and a horizontal channel portion that includes an upper portion of the semiconductor substrate located directly underneath the major surface and connects the first semiconductor protrusion to each of the plurality of second semiconductor protrusions;
a gate insulating layer including vertically extending portions located directly on sidewalls of the first semiconductor protrusion and sidewalls of the plurality of second semiconductor protrusions, and a horizontal portion located directly on the major surface of the semiconductor substrate, wherein the gate insulating layer comprises a single continuous silicon oxide layer which extends over the sidewalls of the first semiconductor protrusion, over sidewalls of the plurality of second semiconductor protrusions, and over the horizontal channel portion;
a select gate electrode overlaying, and contacting, the gate insulating layer;
an alternating stack of electrically insulating layers and control gate electrodes overlying a combination of the select gate electrode, the gate insulating layer, and the semiconductor channel; and
memory openings extending through the alternating stack, wherein each of the memory openings is filled with at least one memory film and a vertically extending semiconductor channel that contacts the respective memory film.

15. The semiconductor structure of claim 14, wherein a top surface of the select gate electrode is within a same plane as topmost surfaces of the gate insulating layer and the semiconductor channel.

16. The semiconductor structure of claim 14, wherein:
the first semiconductor material is single crystalline; and
each portion of the second semiconductor material in each of the first semiconductor protrusion and the plurality of second semiconductor protrusions is single crystalline and is in epitaxial alignment with the first semiconductor material.

17. The semiconductor structure of claim 14, wherein:
a bottom surface of the at least one memory film contacts a top surface of a respective one of the plurality of second semiconductor protrusions; and
the vertically extending semiconductor channel contacts a respective one of the plurality of second semiconductor protrusions.

18. The semiconductor structure of claim 17, wherein the vertically extending semiconductor channel contacts a sidewall and a recessed surface of the respective one of the plurality of second semiconductor protrusions below the horizontal plane including the top surface of the select gate electrode.

19. The semiconductor structure of claim 14, wherein the select gate electrode laterally surrounds, and encircles, each one of the plurality of second semiconductor protrusions.

20. The semiconductor structure of claim 14, wherein a sum of a thickness of the gate insulating layer and a thickness of the select gate electrode is the same as a height of the first semiconductor protrusion.

21. The semiconductor structure of claim 20, wherein each of the plurality of second semiconductor protrusions has a same height as the height of the first semiconductor protrusion.

22. The semiconductor structure of claim 14, wherein a top surface of the select gate electrode directly contacts a bottom surface of a bottommost layer among the electrically insulating layers within the alternating stack.

* * * * *